(12) United States Patent
Reohr

(10) Patent No.: US 12,080,343 B2
(45) Date of Patent: Sep. 3, 2024

(54) READ AND WRITE ENHANCEMENTS FOR ARRAYS OF SUPERCONDUCTING MAGNETIC MEMORY CELLS

(71) Applicant: William Robert Reohr, Severna Park, MD (US)

(72) Inventor: William Robert Reohr, Severna Park, MD (US)

( * ) Notice: Subject to any disclaimer, the term of this patent is extended or adjusted under 35 U.S.C. 154(b) by 77 days.

(21) Appl. No.: 17/976,179

(22) Filed: Oct. 28, 2022

(65) Prior Publication Data

US 2023/0136455 A1 May 4, 2023

Related U.S. Application Data

(60) Provisional application No. 63/272,848, filed on Oct. 28, 2021.

(51) Int. Cl.
*G11C 11/44* (2006.01)

(52) U.S. Cl.
CPC .................................... *G11C 11/44* (2013.01)

(58) Field of Classification Search
CPC ........... G11C 11/44; G11C 17/02; G11C 8/16; G11C 11/161
See application file for complete search history.

(56) References Cited

U.S. PATENT DOCUMENTS 5,039,656 A * 8/1991 Hidaka ................. H10N 69/00
505/700

5,629,889 A * 5/1997 Chandra ................. G11C 11/44
505/832

(Continued)

FOREIGN PATENT DOCUMENTS

EP          3266024 A1 * 1/2018 ............. B82Y 10/00
WO    WO-2011136889 A1 * 11/2011 ............. G11C 11/44

OTHER PUBLICATIONS

Igor Vernik et al., Magnetic Josephson Junctions with Superconducting Interlayer for Cryogenic Memory, Jun. 2013, IEEE Transactions on Applied Superconductivity, vol. 23, Issue 3. (Year: 2013).*

(Continued)

*Primary Examiner* — Jay W. Radke
(74) *Attorney, Agent, or Firm* — Myers Bigel, P.A.

(57) ABSTRACT

A superconducting memory circuit for applying and propagating superconducting signals through a plurality of superconducting wires in the memory circuit is provided. The memory circuit includes multiple passive cells arranged in a plurality of sets. Each set of passive cells has associated therewith at least one common superconducting wire interconnecting a subset of the passive cells in the set of passive cells. The memory circuit further including at least one power-signal propagation circuit, an input of the power-signal propagation circuit being coupled with a preceding set of passive cells via a first superconducting wire, and an output of the power-signal propagation circuit being coupled with a subsequent set of passive cells via a second superconducting wire. Upon application of a first superconducting signal to the first superconducting wire, the power-signal propagation circuit applies a second superconducting signal to the second superconducting wire.

23 Claims, 14 Drawing Sheets

(56) References Cited

U.S. PATENT DOCUMENTS

| | | | | |
|---|---|---|---|---|
| 5,640,343 | A * | 6/1997 | Gallagher | G11C 11/1675 257/E27.005 |
| 6,335,890 | B1 * | 1/2002 | Reohr | G11C 11/1657 365/225.5 |
| 6,545,906 | B1 * | 4/2003 | Savchenko | G11C 11/161 365/158 |
| 7,804,710 | B2 * | 9/2010 | Reohr | G11C 11/1675 365/158 |
| 8,971,977 | B2 * | 3/2015 | Mukhanov | G11C 11/44 365/162 |
| 9,520,181 | B1 * | 12/2016 | Miller | G11C 11/44 |
| 10,122,351 | B1 * | 11/2018 | Naaman | G06N 10/00 |
| 10,355,677 | B1 * | 7/2019 | Miller | H03K 3/38 |
| 10,520,974 | B2 * | 12/2019 | Strong | G06F 1/10 |
| 10,546,621 | B2 * | 1/2020 | Murduck | G11C 11/1673 |
| 2006/0255987 | A1 * | 11/2006 | Nagasawa | G11C 11/44 341/87 |
| 2009/0244958 | A1 * | 10/2009 | Bulzacchelli | H10N 50/10 365/158 |
| 2012/0108434 | A1 * | 5/2012 | Bulzacchelli | G11C 11/44 365/158 |
| 2016/0013791 | A1 * | 1/2016 | Herr | H03K 19/1952 326/5 |
| 2020/0176662 | A1 * | 6/2020 | Dayton | H10N 50/85 |

OTHER PUBLICATIONS

Ian Dayton et al., Experimental Demonstration of a Josephson Magnetic Memory Cell With a Programmable pi-Junction, IEEE Magnetics Letters, vol. 9 (Year: 2018).*

* cited by examiner

READ AND WRITE ENHANCEMENTS FOR ARRAYS OF SUPERCONDUCTING MAGNETIC MEMORY CELLS

CROSS-REFERENCE TO RELATED APPLICATIONS

This application claims the benefit of and priority to U.S. Provisional Patent Application No. 63/272,848, filed Oct. 28, 2021, entitled "Read and Write Enhancements for Arrays of Superconducting Magnetic Memory Cells," the disclosure of which is incorporated by reference herein in its entirety for all purposes.

BACKGROUND

The present invention relates generally to quantum and classical digital superconducting circuits and systems, and more particularly to arrays of superconducting phase-controlled hysteretic magnetic Josephson junction memory cells.

Superconducting digital technology has provided computing and/or communications resources that benefit from unprecedented high speed, low power dissipation, and low operating temperature. For decades, superconducting digital technology has lacked random-access memory (RAM) with adequate capacity and speed relative to logic circuits. This has been a major obstacle to industrialization for current applications of superconducting technology in telecommunications and signal intelligence, and can be especially forbidding for high-end and quantum computing. All these superconducting memory alternatives have been based on quantization of magnetic flux quanta in a superconducting inductive loop. Such memories can be readily adapted to high-speed register files given a foundry process with adequate yield, but can never achieve high levels of integration density, as they are fundamentally limited by the size of the inductive loop.

Given that no other viable contender for dense memory has been proposed, Josephson magnetic random access memory (JMRAM) appears to be vital to make cost-sensitive superconducting systems commercially viable and is thus being actively developed. No functional demonstration of JMRAM, in its entirety, has been reported to date. Instead, one-off demonstrations of core circuits are being gradually revealed. The highest level of technology integration of JMRAM currently reported may be found in a paper entitled, "Experimental Demonstration of a Josephson Magnetic Memory Cell With a Programmable π-Junction," by Ian Dayton et al. (*IEEE Magnetics Letters*, Vol. 9, Feb. 8, 2018), the disclosure of which is incorporated herein by reference in its entirety.

Unfortunately, several reliability and performance challenges remain that prevent JMRAM from being commercially viable.

SUMMARY

Without significantly disrupting core circuits of standard JMRAM, such as memory cells, write circuits (e.g., flux pumps), and read circuits (e.g., sense amplifiers), devised over the past several years since its first technology demonstrations in a paper entitled "Magnetic Josephson Junctions with Superconducting Interlayer for Cryogenic Memory," by Igor Vernik et al., *IEEE Transactions on Applied Superconductivity*, Vol. 23, Issue 3, Dec. 10, 2012, which is incorporated by reference herein in its entirety, the present invention, as manifested in one or more embodiments, beneficially describes fundamental alternatives to increase/maximize the overall bit density of the memory and, moreover, provides solutions to address fundamental circuit and device problems associated with conventional JMRAM technology, all while achieving greater levels of circuit operability and reliability (e.g., write selectivity).

In accordance with one embodiment of the invention, a superconducting memory circuit for applying and propagating superconducting signals through a plurality of superconducting wires in the memory circuit is provided. The memory circuit includes multiple passive cells arranged in a plurality of sets. Each set of passive cells has associated therewith at least one common superconducting wire interconnecting a subset of the passive cells in the set of passive cells. The memory circuit further including at least one power-signal propagation circuit, an input of the power-signal propagation circuit being coupled with a preceding set of passive cells via a first superconducting wire, and an output of the power-signal propagation circuit being coupled with a subsequent set of passive cells via a second superconducting wire. Upon application of a first superconducting signal to the first superconducting wire, the power-signal propagation circuit applies a second superconducting signal to the second superconducting wire.

In accordance with another embodiment of the invention, a simultaneous write and multiple-read memory circuit includes a plurality of dual-ported superconducting memory cells arranged into columns, each of the dual-ported superconducting memory cells having one read port operably connected to a read word line and a read bit line, and having one write port operably connected to a write word line and a write bit line. The memory circuit includes a plurality of read bit lines, each of the dual-ported superconducting memory cells in a given column operably connected to a corresponding one of the read bits lines, and a plurality of read word lines, each of the read word lines connecting to one of the dual-ported superconducting memory cells in a column. The memory circuit further includes a plurality of write word lines, each of the write word lines connecting to a unique plurality of dual-ported superconducting memory cells of a given column, and a plurality of write bit lines, wherein a subset of the plurality of write bit lines are associated with each column. Each write bit line of an associated column is operably connected to one dual-ported superconducting memory cell of each of a subset of dual-ported superconducting memory cells operably connected to a common write word line.

The write bit lines in the simultaneous write and multiple-read memory circuit are greater in number than the read bit lines, and their associated columns, by at least a factor of two. The memory circuit is configured to be written in one native write cycle and read in multiple native read cycles, the native read and write cycles being adapted to correspond to prescribed parameters associated with a given type of the plurality of dual-ported superconducting memory cells.

In accordance with yet another embodiment of the invention, a superconducting memory circuit includes a plurality of write word lines arranged in a first dimension in the memory circuit, a plurality of write bit lines arranged in a second dimension in the memory circuit, the first and second dimensions being different relative to one another, and a plurality of superconducting memory cells arranged into a plurality of rows and columns. A subset of the superconducting memory cells arranged in a same row are coupled with a common one of the write word lines, and at least two of the superconducting memory cells having different write word lines are coupled to a common one of the write bit lines. A subset of the write bit lines that are proximate to one another are connected by an operable wrap-around connection. The superconducting memory circuit is configured such that a bit signal of a first one of the write bit lines operably writes a state in a selected one of the superconducting memory cells connected to all proximate write bit lines connected with at least one wrap-around connection, wherein a write signal, representing a state, moves through at least a first proximate write bit line in one direction, and then when wrapped around, connected, to a second write bit line, reverses its direction of propagation relative to the first proximate write bit line.

As the term may be used herein, "facilitating" an action includes performing the action, making the action easier, helping to carry the action out, or causing the action to be performed. Thus, by way of example only and without limitation, in the context of a semiconductor fabrication methodology, steps performed by one entity might facilitate an action carried out by another entity to cause or aid the desired action(s) or steps to be performed. For the avoidance of doubt, where an actor facilitates an action by other than directly performing the action, it is assumed that the action is nevertheless performed by some entity or combination of entities.

Techniques of the present invention can provide substantial beneficial technical effects. By way of example only and without limitation, techniques for enhanced reading and writing of magnetic memory cells in an array of superconducting magnetic memory cells and for reducing the area of a plurality of such cells and their support circuits according to one or more embodiments of the invention may provide one or more of the following advantages:

provides a write architecture for use in a magnetic random access memory (MRAM) system that allows selection of individual JMRAM memory cells (more specifically the magnetic Josephson junctions (MJJs)) in an array without adversely disturbing neighboring cells in the array, thereby increasing an integrity of the data stored in the memory array;

provides a write architecture for use in an MRAM system that can generate flux faster (e.g., using parallel write select circuits), and provides more flux, to be used as a hard-axis field selection component, one of two orthogonal magnetic fields which assists in writing an MJJ;

provides an improved write selection architecture and methodology for MRAM that is compatible with conventional MRAM systems;

improves the selection of MRAM memory cells written with a combination of a magnetic field selection (i.e., of hard-axis field selection) and phase-based torque, by doubling the hard-axis field, using an over and under arrangement of write select lines (write word lines) to carry write current;

provides a write selection architecture for MRAM that utilizes a substantially reduced bit line current, thereby resulting in lower overall system power consumption;

provides a write selection architecture for MRAM that has a substantially increased acceptable write disturb margin, thereby reducing a sensitivity of the MRAM to MTJ device mismatches, process variations, and/or other environmental factors within an MRAM array;

provides a more compact array of memory cells (or memory cell write groups) by connecting memory cells having different write bit lines (and read word lines) to a common read bit line, thus removing the necessity to propagate at least two independent read bit lines;

provides a read bit line that extends from a bottom to a top of the MRAM array and returns from the top to the bottom to almost proximate locations, such that a conventional write bit circuit (i.e., superconducting bidirectional driver) can be used to assist in writing the memory cells;

provides a "functional" read word line that includes read repeaters embedded in an array of MRAM cells, which can be used to restore flux where it has been lost by electrons flowing through resistive conduction bands in the array;

provides a sub-atomic (sub-"functional" write word line) write capability enabled with a read-modify-write capability;

provides a sub-atomic (sub-"functional" write word line) write capability enabled by signals propagating on orthogonal write control lines selecting at least one memory cell write group but not all memory cell write groups in the array;

revolutionizes the field of magnetic memory devices by providing an improved write selection architecture and methodology for use with MRAM that not only allows selection of individual JMRAM memory cells (more specifically, the MJJs in the memory cells) in an array without adversely disturbing neighboring cells in the array, but also reduces the power consumed in the write operation and the overall sensitivity of the circuit to device mismatches, process variations and other environmental factors;

significant reduction in semiconductor (i.e., chip) area per bit, thereby increasing memory density.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein.

Figure 1:
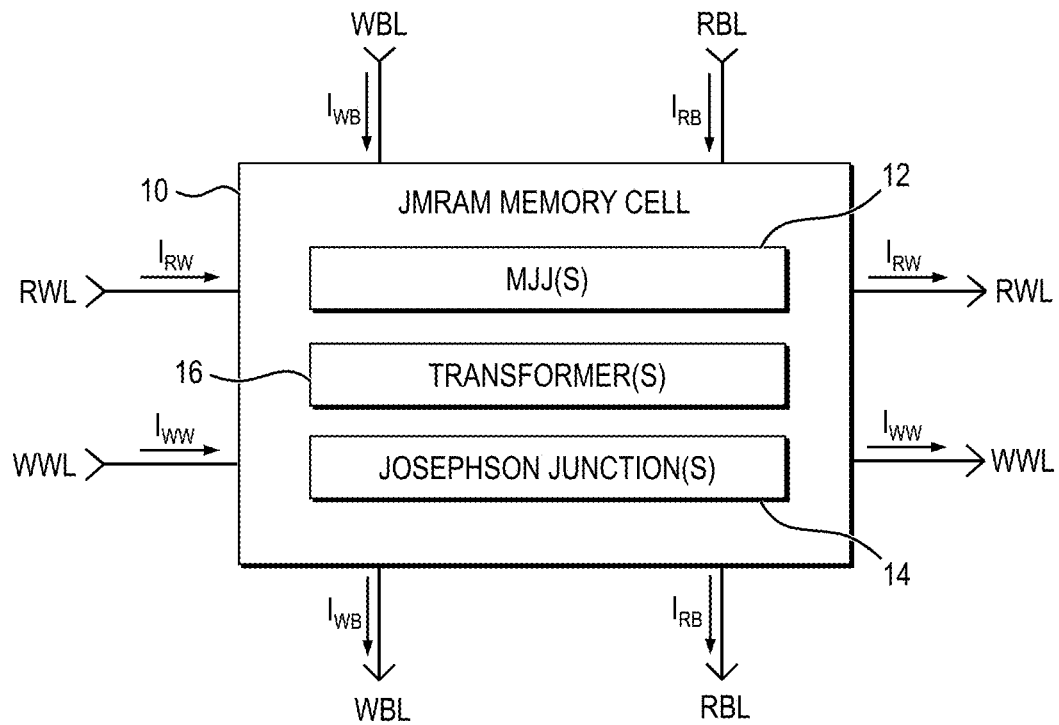
FIG. 1 is a block diagram conceptually depicting at least a portion of an illustrative JMRAM memory cell that abstracts elements and connections of a plurality of JMRAM memory cells.

It is to be appreciated that elements in the figures are illustrated for simplicity and clarity. Common but well-understood elements that may be useful or necessary in a commercially feasible embodiment are not necessarily shown in order to facilitate a less hindered view of the illustrated embodiments.

DETAILED DESCRIPTION

Principles of the present invention, as manifested in one or more embodiments, will be described herein in the context of quantum and classical digital superconducting circuits, and specifically (i) various embodiments of Josephson magnetic random access memory (JMRAM) memory cells (improvements including layout and structural coupling), (ii) arrangements of such memory cells into arrays having unique and beneficial read and write conductor features, and (iii) arrangements of memory cells and write select circuits and read word line repeaters that are incorporated into arrays of "passive" memory cells. It is to be appreciated, however, that the invention is not limited to the specific device(s), circuit(s) and/or method(s) illustratively shown and described herein. Rather, it will become apparent to those skilled in the art given the teachings herein that numerous modifications can be made to the embodiments shown that are within the scope of the claimed invention. That is, no limitations with respect to the embodiments shown and described herein are intended or should be inferred.

In general, microwave signals, such as, for example, single flux quantum (SFQ) pulses, may be used to control the state of a memory cell in a memory array. During read/write operations, word-lines and bit-lines may be selectively activated by SFQ pulses, or reciprocal quantum logic (RQL) pulses arriving via an address bus and via independent read and write control signals. These pulses may, in turn, control word-line and bit-line driver circuits adapted to selectively provide respective word-line and bit-line currents to the relevant memory cells in the memory array.

A JMRAM system can implement an array of JMRAM memory cells that each includes a phase hysteretic magnetic Josephson junction (MJJ) that can be configured as comprising ferromagnetic materials separated by an associated barrier. As an example, the MJJ can be configured as a junction switchable between a zero state and a π-state that is configured to generate a superconducting phase based on the digital state stored therein. The JMRAM memory cells can also each include at least one Josephson junction (e.g., a pair of Josephson junctions in parallel with the MJJ). The basic element in SFQ, RQL, and JMRAM circuits is the Josephson junction, which emits a voltage-time spike with an integrated amplitude equal to the flux quantum ($\varphi_0$=2.07× $10^{-15}$ V·s) when the current through the Josephson junction exceeds a critical current, wherein the developed voltage opposes the current flow.

Illustrative embodiments of the present invention are beneficially suitable for use with conventional MJJs (e.g., of conventional memory cells) switched/written (i) exclusively with magnetic fields, and (ii) with a combination of a magnetic field selection and phase-based torque.

The MJJ can be configured to store a digital state corresponding to one of a first binary state (e.g., logic-1) or a second binary state (e.g., logic-0) in response to a write-word current and a write-bit current associated with the MJJ. For example, the first binary state can correspond to a positive π-state, in which a superconducting phase is exhibited. As an example, the write-word and write-bit currents can each be provided on an associated (e.g., coupled to the MJJ) write-word line (WWL) and an associated write-bit line (WBL) and together can set the logic state of a selected MJJ. As the term is used herein, a "selected" MJJ is defined as an MJJ selected for writing among a plurality of MJJs by activating current flow in its associated write-bit line WBL. Its digital state is written by a positive or negative current flow within its associated write-bit line (for all known/ postulated MJJs except a "toggle" MJJ). Moreover, to prevent the MJJ being set to an undesired negative π-state, the MJJ may include a directional write element that is configured to generate a directional bias current through the MJJ during a data-write operation. Thus, the MJJ can be forced into the positive π-state to provide the superconducting phase in a predetermined direction.

In addition, the MJJ in each of the JMRAM memory cells in the array can provide an indication of the stored digital state in response to a read-word current and a read-bit current. The superconducting phase can thus lower a critical current associated with at least one Josephson junction of each of the JMRAM memory cells of a row in the array. Therefore, the read-bit current and a derivative of the read-word current (induced by the read-word current flowing through a transformer) can be provided, in combination, (i) to trigger the Josephson junction(s) to change a voltage on an associated read-bit line if the MJJ stores a digital state corresponding to the first binary state, and (ii) not to trigger if the MJJ stores a digital state corresponding to the second binary state. Thus, the read-bit line can have a voltage present having a magnitude that varies based on whether the digital state of the MJJ corresponds to the binary logic-1 state or the binary logic-0 state (e.g., between a non-zero and a zero amplitude). As used herein, the term "trigger" with respect to Josephson junctions is intended to describe the phenomenon of the Josephson junction generating a discrete voltage pulse in response to current flow through the Josephson junction exceeding a prescribed critical current level.

FIG. 1 is a block diagram conceptually depicting at least a portion of an illustrative JMRAM memory cell 10 that abstracts elements and connections of a plurality of JMRAM memory cells. Each of these JMRAM memory cells 10 may have different internal topologies but share common internal elements, including a phase hysteretic magnetic Josephson junction (MJJ) 12, a Josephson junction 14, and a transformer 16, as well as common input/output (I/O) signals (e.g., write-word line (WWL)), which will be described in further detail herein below. The MJJ 12 may, in some embodiments, comprise the structure S/F1/N/F2/S, where S is a superconducting material, F1 and F2 can be different ferromagnetic materials, and N may be a normal metal (i.e., not superconducting)—potentially with other layers interspersed within the material stack. It should be noted that each of the MJJ(s) 12 in the memory array stores a digital state, and the corresponding Josephson junction(s) 14 at least assist with reading/detecting the stored digital state within the MJJ(s).

Transformer(s) 16 serve one or more roles in the JMRAM memory cell 10. For example, in one or more embodiments, each of the transformer(s) 16 in the JMRAM memory cell 10 can form, or serve as a "read" element that can lower the critical current of a Josephson junction 14 with a derivate of a read-word current (induced by the read-word current flowing through the transformer), a "datum-state-write" element that provides phase-based torque to write a JMRAM memory cell (as disclosed in in U.S. Pat. No. 10,122,351, O. Naaman, et al., which will heretofore be referred to as a "phase-based-torque memory cell"), or a directional write element. The directional write element assures that the phase(s) of the MJJ(s) 12 will be set to a positive π-state during a particular data write operation, rather than a negative π-state, if the write operation directs the MJJ(s) 12 of the JMRAM memory cell 10 to store a first binary state corresponding to the π-state. Incidentally, a second binary state corresponds to a 0-state phase of the MJJ(s) 12. These details will be further described in conjunction with FIG. 3.

With regard to an array of memory cells, the JMRAM memory cell 10 can correspond to one of a plurality of JMRAM memory cells that are arranged in the array as rows and columns (or quasi rows and quasi columns, or an alternative configuration), as described in greater detail herein with respect to embodiments of the invention. The JMRAM memory cell 10 includes a write-word line (WWL) and a read-word line (RWL) that each passes through the JMRAM memory cell 10, preferably along a substantially horizontal (row) dimension. The write-word line WWL conveys a write-word current, $I_{WW}$, during a data write operation, and the read-word line RWL conveys a read-word current, $I_{RW}$, during a data read operation.

As an example, the write-word current $I_{WW}$ can correspond to a write-word current associated with a row of JMRAM memory cells in an array, and the read-word current $I_{RW}$ can correspond to a read-word current associated with the row of JMRAM memory cells in the array. For example, in a simple case, the write-word and read-word lines WWL and RWL can likewise be coupled to adjacent JMRAM memory cells in a given row on either side of the JMRAM memory cell 10. Thus, the read-word and write-word currents $I_{WW}$ and $I_{RW}$, respectively, flow through all of the JMRAM memory cells in the row, including the JMRAM memory cell 10, during the respective data-write and data-read operations associated with a selected row.

It is important to recognize that, in traditional memory designs, the read-word line RWL and write-word line WWL serve to select all the memory cells residing in a physical row within a typical two-dimensional array of memory cells (a stacking array can have three dimensions—along x, y, and z axes) for a read or a write operation, respectively. The word lines select memory cells for read or write operations; they do not define the binary states retrieved from the memory cells or written into the memory cells, respectively. Some of the embodiments of the present invention may not strictly adhere to the full physical-based definition of a row, being a horizontally disposed linear set of cells with no stacking in the column dimension, but all embodiments will adhere to the definition associated with standard memories relating to word lines selecting the memory cells for read or write operations as long as the term "word" is integrated into the name (e.g., read word line, write word line, write-word current, read-word current).

With continued reference to FIG. 1, The JMRAM memory cell 10 further includes a write-bit line (WBL) and a read-bit line (RBL) that each pass through the JMRAM memory cell, preferably along a substantially vertical (column) dimension. The write-bit line WBL conveys a write-bit current, $I_{WB}$, during a data write operation, and the read-bit line RBL conveys a read-bit current, $I_{RB}$. The read-bit current $I_{RB}$ can be provided on the read-bit line substantially constantly, not just during data read operations, but also in standby mode. In one or more embodiments, the write-bit current $I_{WB}$ corresponds to a write-bit current associated with a column of JMRAM memory cells in the array, and the read-bit current $I_{RB}$ corresponds to a read-bit current associated with the column of JMRAM memory cells in the array. In a similar manner, the write-bit line and read-bit line can be coupled to adjacent JMRAM memory cells in a given column above and below the JMRAM memory cell 10. Thus, the write-bit and read-bit currents $I_{WB}$ and $I_{RB}$, respectively, will flow through all of the JMRAM memory cells in the column, including the JMRAM memory cell 10, during the respective data-write and data-read operations in a selected column.

As previously stated, the JMRAM memory cell 10 includes at least one MJJ 12. In one or more embodiments, the MJJ 12 is configured to store a digital state corresponding to a first binary state (e.g., logic-1) or a second binary state (e.g., logic-0). As an example, the MJJ(s) 12 can include ferromagnetic materials in associated barriers to be configured as a switchable π-junction.

As previously described, the JMRAM memory cell 10, in one or more embodiments, includes at least one Josephson junction (JJ) 14 that can be triggered, or not, during the data-read operation in response to the respective read-word and read-bit currents $I_{RW}$ and $I_{RB}$ depending on whether the MJJ 12 in the JMRAM memory cell is in the first or second binary state, respectively, as described in further detail herein.

In response to the magnetic fields generated locally by orthogonal electrical currents, the MJJ 12 can be set to a π-state in a superconducting loop in which the MJJ 12 generates a superconducting π-phase shift. As described herein, the "superconducting phase" generates a spontaneous supercurrent in any superconducting loop through the MJJ 12, with the supercurrent having a magnitude that is approximately equal to one-half of a superconductor flux quantum divided by an inductance term. The MJJ supercurrent can combine with the read-word current $I_{RW}$ (and in particular, its derived current developed in the transformer 12) and a portion of the read-bit current $I_{RB}$ flowing through Josephson junctions 14 to indicate the digital state of the MJJ 12. The at least one Josephson junction 14 can transition to a voltage state given that the MJJ is in a positive π-state phase, which corresponds to a first binary state (e.g., logic-1). Note that the at least one Josephson junction 14 can remain in the superconducting state for the MJJ 12 having 0-state phase, a second binary state (e.g., logic-0).

In memory cells that implement an MJJ, when the state of the MJJ is set to a predetermined logic state (e.g., a logic-1 state), the direction of the superconducting phase—whether the MJJ is in a positive π-state or a negative π-state—can be unpredictable (e.g., based on a substantially constant application of a respective read-bit current as a bias current). Additionally, in the positive π-state, relatively greater margins can be achieved with respect to the amplitude of the respective read-word and read-bit currents during the data-read operation relative to the threshold currents of associated Josephson junction(s). However, in the negative π-state, the associated MJJ can exhibit relatively smaller margins with respect to the amplitude of the respective read-word and read-bit currents during the data-read operation relative to the threshold currents of the associated Josephson junction(s). Thus, in the negative π-state, the smaller margins can provide unreliability of a given memory cell that implements an MJJ during a data-read operation, and can thus result in unpredictability in reading the digital state.

To provide a predictable and reliable setting of the MJJ 12 in the positive π-state during a data-write operation, in which the MJJ 12 stores the first binary state, the JMRAM memory cell 10 includes a directional write element. The directional write element is configured to generate a directional bias current through the MJJ 12 during the data-write operation to set the MJJ 12 to the positive π-state corresponding to the first binary state. For example, the directional write element can be implemented using one of the transformer(s) 16 configured to generate the directional bias current through the MJJ 12 based on the read-word current $I_{RW}$ or the write-word current $I_{WW}$ during the data-write operation.

Accordingly, when the MJJ 12 is configured to store the first binary state during the data-write operation, the MJJ can be consistently set to the positive π-state, such that relatively greater margins can be achieved, compared to the amplitude of the read-word and read-bit currents $I_{RW}$ and $I_{RB}$, respectively, during a data-read operation that depends, in part, on some combination of the aforementioned currents with respect to the threshold currents of the Josephson junction(s) 14 to read the digital state from the JMRAM memory cell 10. Techniques for achieving positive or negative π-states will become apparent to those skilled in the art and will therefore not be discussed in further detail herein. Note that the transformer(s) 16 used to implement the directional write circuit, in one or more embodiments, may not be shown in subsequent depictions of alternative memory cells merely to facilitate enhanced clarity in the description.

Given the above context, one or more embodiments of the invention are directed to reducing memory array area (i.e., increasing memory density) while maintaining or improving circuit operability, reliability and/or performance. For example, one or more embodiments of the invention are directed to reducing flux quanta, which may more broadly be referred to herein as superconducting signals, required to generate a desired write-word current $I_{WW}$ in a write-word line. By breaking the write-word line into a plurality of smaller segments (referred to throughout the specification as "local write select lines" in the case of a segmented memory architecture) and connecting each of these segments to its own proximate (i.e., local) write-word line circuit (referred to throughout the specification as a "write select circuit"), write current in the write-word line is increased in proportion to a reduction in loop inductance associated with the shorter write-word line. This loop inductance generally includes the inductance of the segment of the write-word line and the inductance of the rest of the loop within the write-word circuit. Discounting the inductance within the write-word circuit, this structural change reduces the overall inductance by the number of segments in the write-word line.

As is known in the art, the flux quanta (i.e., superconducting signals) of a superconducting loop are the product of the current within the loop and the loop inductance divided by the flux of a single flux quantum (e.g., about 2.07 millivolts per second (mVpS)) or 2.07 milliamperes per hour (mApH)). In other words, while maintaining the same flux quanta in a given loop, if inductance is reduced by a factor of N, current is advantageously increased by that same factor of N, where N is a real number.

Figure 2A:
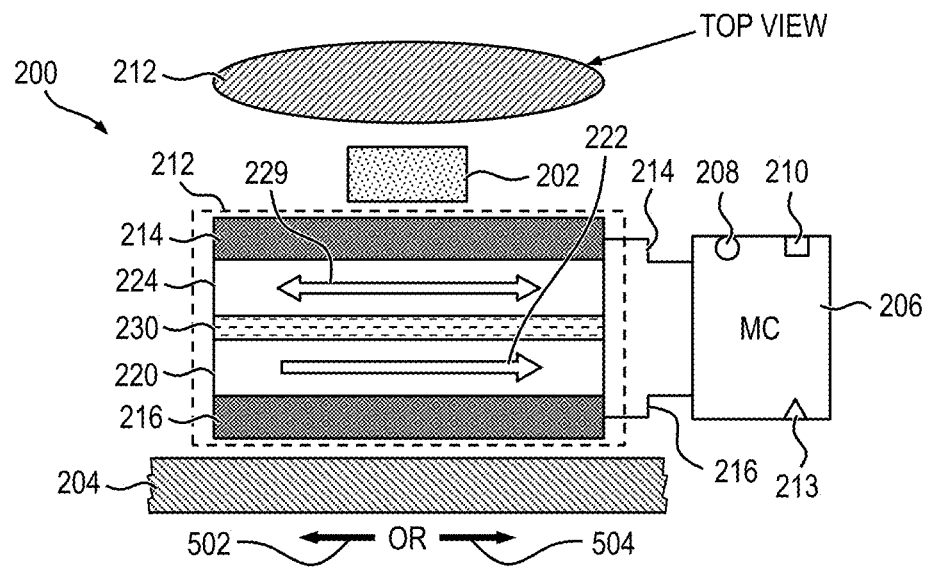
FIG. 2A is a cross-sectional view, block diagram and top-plan view illustrating at least a portion of an exemplary JMRAM memory cell, in which a vertical slice of its magnetic Josephson junction and its write conductors have been depicted along with a symbolic view of its read circuitry.

FIG. 2A is a cross-sectional view, block diagram and top-plan view illustrating at least a portion of an exemplary JMRAM memory cell 200, conceptually depicting the coupling of magnetic write fields into an MJJ 212. The JMRAM memory cell 200 depicts a vertical slice of its magnetic Josephson junction and its write conductors, along with a symbolic view of its read circuitry. Specifically, FIG. 2A highlights a cross section of an MJJ 212, a write-bit line 202 and a write-word line 204 included in the JMRAM memory cell 200. In addition, FIG. 2A helps define a memory cell read circuit 206 (which is abbreviated in the drawings as "MC" and which will be used in a plurality of embodiments of the invention). As shown, the MJJ 212 is sandwiched between a corresponding write-bit line 202 and write-word line 204, which are preferably oriented orthogonally relative to one another. Like in the illustrative embodiment shown in FIG. 1, the JMRAM memory cell 200 may be representative of an abstraction of elements and connections associated with a plurality of JMRAM memory cells in a memory array.

In one or more embodiments, the MJJ 212 includes outer layers of superconducting material, such as niobium (Nb), and one or more internal thin-film layers of ferromagnetic materials. The outer layers of superconducting material are shown in FIG. 2A both as a physical cross section of conductors and as thin, non-physical (symbolic), only topological, interconnect leads (i.e., read-circuit-conductor-lead top 214 and read-circuit-conductor-lead bottom 216).

Superconductor material classes suitable for use as the outer layers include, but are not limited to, chemical elements (e.g., niobium, titanium, etc.), alloys (e.g., niobium-titanium, germanium-niobium, niobium nitride, etc.), ceramics (e.g., yttrium barium copper oxide (YBCO), magnesium diboride, etc.), superconducting pnictides (e.g., fluorine-doped LaOFeAs), or organic superconductors (e.g., fullerenes and carbon nanotubes). The thin-film layers of ferromagnetic materials can include one or more "hard" ferromagnetic layers 220, having a substantially fixed (i.e., pinned) magnetic field orientation 222, and one or more "soft" ferromagnetic layers 224, having one of two possible dominant bit-magnetic-field orientations 229 that can be changed as a result of magnetic fields, which may be generated locally by orthogonal electrical currents $I_{WB}$ and $I_{WW}$ passing through the write-bit line 202 and write-word line 204, respectively. The write-bit line 202 (which is projected out of and into the page) and write-word line 204 are arranged orthogonal to one another in this embodiment, as previously stated, although the invention is not limited to the arrangement shown.

The bit-magnetic-field orientation 229, either pointing left or right, in the one or more "soft" ferromagnetic layers 224 determines whether the MJJ 212 resides in the 0 or positive π-state (or negative π-state). The 0 or π-state of the at least one MJJ 212 indicates the digital state of the memory cell wherein the at least one MJJ is incorporated, as will be explained in further detail herein below. Additionally, the MJJ 212 can include one or more additional layers, such as oxide layers 230 or normal metal layers (not explicitly shown, but implied) that are interleaved with the ferromagnetic layers 220 and 224 and potentially with superconducting layers. It is to be appreciated that embodiments of the invention are not limited to any specific arrangement and/or type of materials forming the MJJ 212.

Drawn as both topological wire connections and in cross section, the read-circuit-conductor-lead top 214 and the read-circuit-conductor-lead bottom 216, in one or more embodiments, form at least a portion of the actual outer layers of superconducting material (e.g., niobium). The top and bottom leads 214, 216 are shown connected to the memory cell read circuit (MC) 206.

In some embodiments of the invention, a local write-word current (also called a "local write select current") circulates through a local write-word superconducting loop during a write operation. The local write-word superconducting loop is formed by connecting both ends of a local write-word line (also called a "local write select line") to two terminals of a write-word circuit (write select circuit). One of the ends of the local write-word superconducting loop may be connected to a superconducting return or ground, in some embodiments. In one or more embodiments, the write-word line 204 is a local write-word line that extends under (or over, in an alternative configuration not explicitly shown in FIG. 2A, but implied) at least one of the MJJs 212 of the at least one memory cell 200, as depicted in FIG. 2A. It should be noted that memory cell 200 may not embody the broadest definition of a JMRAM memory cell given, for example, that the illustrative memory cell 10 shown in FIG. 1 may comprise two MJJs (e.g., as disclosed in U.S. Pat. No. 10,546,621 to Murdock et al.).

An additional and unique phrase that will be used to describe various embodiments of the present invention follows. Specifically, a group of proximate memory cells (either in a horizontal or vertical dimension) that share a same local write-select line (LWSL) will be referred to herein as a memory cell write group. As the term is used herein, a memory cell write group is preferably defined as comprising all adjacent memory cells (i.e., residing side-by-side) in a given section of a row in a memory array. However, in other embodiments the write current moves along local write-select lines that may be routed through a plurality of cells having different read-word lines (RWLs). Thus, a global read-word line passes through (via one or more transformers), or couples to, at least one of the JMRAM memory cells 10 (FIG. 1) within each memory cell write group of at least two memory cell write groups.

It will become apparent to those skilled in the art that the preceding discussion, which describes the writing of the MJJ 212 using orthogonal write currents, is merely one approach contemplated by one or more embodiments of the invention. Other approaches to writing the MJJ 212 according to embodiments of the invention will be discussed in further detail with respect to standard memory cells. Such alternative embodiments can specifically enhance the attributes of these memory cells as they are instantiated in a memory array.

One or more embodiments of the invention specifically target MJJs switched/written exclusively with magnetic fields as well as MJJs switched/written with a combination of a magnetic field selection and phase-based torque. The two different write approaches each have specific embodiments directed exclusively to one or the other, and also have embodiments that can be used with both approaches.

During a read operation, the read-word current, which is generally more transient in nature than the write-word current, passes through read-word lines which triggers corresponding memory cells to present their state on their associated read-bit lines.

In FIG. 2A, the write-bit line 202 and the write-word line 204 are oriented orthogonally relative to one another and cross over and under, respectively, a corresponding MJJ 212. It is to be appreciated, however, that embodiments of the invention are not limited to an orthogonal arrangement of the write-bit and write-word lines crossing over and under (or vice versa) an MJJ 212. For example, in FIG. 2B the write-bit line WBL of a phase-based-torque memory cell 250 is associated with a memory cell read circuit 207, which will be explained in subsequent paragraphs. Embodiments of the present invention depict an alternative structural arrangement of functional layers surrounding the MJJ 212, which is made possible by the topological change introduced into the memory cell read circuit 207 (of the phase-based-torque memory cell) with respect to the write-bit line. In this particular example, the memory cell read circuit 207, which may be similar to the memory cell read circuit 206 shown in FIG. 2A, is not limited to read functionality, since it preferably includes both read and write components (e.g., formed notably out of Josephson junctions, superconducting wires, and transformers, not MJJs). Consequently, this functional block may be referred to herein as a memory cell read-write circuit in subsequent descriptions thereof, so that it is understood that embodiments of the invention can be broadly applied, for example, to phase-based-torque memory cells and to spin-valve JMRAM memory cells, as well as to other types of memory cells both known and not yet contemplated.

Figure 2B:
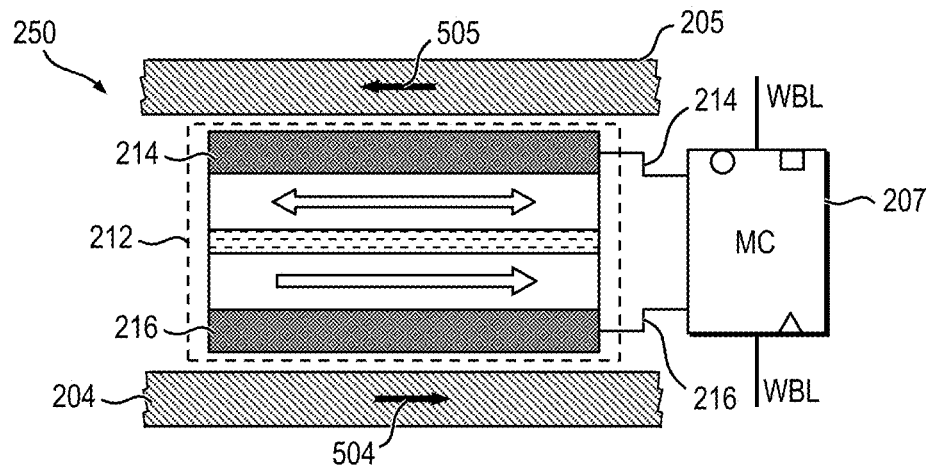
FIG. 2B illustrates at least a portion of an exemplary JMRAM memory cell, in which a vertical slice of its magnetic Josephson junction and its write conductors have been depicted along with a symbolic view of its read circuitry, formed in accordance with one or more embodiments of the present invention.

With continued reference to FIG. 2B, a cross section of the JMRAM memory cell 250 is shown, which benefits from double the hard-axis field of conventional memory cells, comprising a MJJ 212, a first portion of a superconducting write-word line 204, a second portion of a superconducting write-word line 205, and the memory cell read circuit (MC) 207, operatively coupled to the MJJ. The first portion of the superconducting write-word line 204 and the second portion of the superconducting write word-line 205 are disposed in a superconducting layer just above and below the MJJ 212 (as defined in the present invention as S/F1/N/F2/S). In addition, the second portion of the superconducting write-word line 205 in this illustrative embodiment is oriented in parallel with the first portion of the superconducting write-word line 204. Both portions of the superconducting write-word line 204, 205 are centered with respect to a narrow axis of the elliptically-shaped MJJ 212. (An ellipse is a preferred shape for magnetic stability exploiting shape anisotropy). Moreover, the first and second portions of the superconducting write-word lines 204, 205 can be part of a single superconducting wire or can be part of two separate superconducting write-word lines. In the latter case, two write-word circuits (or "write-select circuits") drive the two separate portions. In simple terms, the crux of the embodiment of 250 is that for each of the write-word lines 204, 205 there are two physical portions of a write-word line where, in conventional JMRAM memory cells, there was only one portion.

With a first local write-select current (or write-word current) flowing in the first portion of the write word-line 204, disposed below the MJJ 212, in a direction indicated by arrow 504, and a second local write-select current (or write-word current) flowing in the second portion of the write word-line 205, disposed above the MJJ 212, in a direction, notably opposite to the first, indicated by arrow 505, the hard-axis field will effectively be doubled for a given magnitude of applied current; as determined using the well-known right-hand rule, the magnetic fields emanating from the first and second portions of the write-word line 204, 205 (both out of the page) are additive with respect to the MJJ 212.

In the JMRAM memory cell 250, a negative or positive write bit current flowing through the write bit line passing through, and forming part of, a transformer within the memory cell read circuit (MC) 207 induces a current, which drives a phase-based torque in the MJJ 212 that sets the MJJ to the 0-state phase or π-state phase.

An alternative write-word line arrangement is made possible by the removal of the write-bit line WBL (e.g., 202 of FIG. 2A) for field-coupling contention with what would be the second portion of the write-word line layer of metal above the MJJ 212. Instead, as has been previously discussed, the write-bit line WBL relating to the JMRAM memory cell 250 of FIG. 2B passes through a dedicated write transformer included within the memory cell read circuit 207. As state above, the designation "memory cell read circuit" does not imply that this block 207 is only limited to read functionality.

Figure 3:
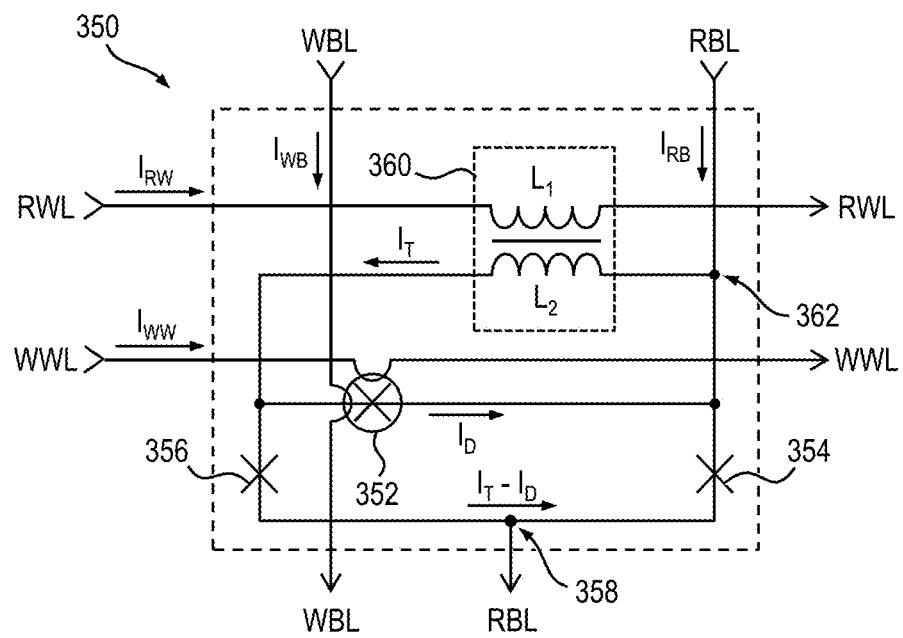
FIG. 3 is a schematic diagram depicting at least a portion of an exemplary JMRAM memory cell circuit.

FIG. 3 is a schematic diagram depicting at least a portion of an exemplary JMRAM memory cell circuit 350. Similar to the JMRAM memory cell 10 depicted in FIG. 1, the JMRAM memory cell circuit 350 preferably represents an abstraction of elements and connections associated with a plurality of JMRAM memory cell circuits arranged, for example, in rows and columns in a memory array. The JMRAM memory cell circuit 350 may correspond to the illustrative JMRAM memory cell 10 shown in FIG. 1.

In one or more embodiments, the JMRAM memory cell circuit 350 includes a write-word line (WWL) and a read-word line (RWL), each of which passes through the JMRAM memory cell circuit. The write-word line WWL conveys a write-word current, $I_{WW}$, during a data-write operation, and the read-word line RWL conveys a read-word current, $I_{RW}$, during a data-read operation. As an example, the write-word current $I_{WW}$ can correspond to a write-word current associated with a given row of JMRAM memory cells 350 in a memory array, and the read-word current $I_{RW}$ can correspond to a read-word current associated with the row of JMRAM memory cells in the array. In some embodiments, the write-word line WWL and read-word line RWL can be coupled to adjacent JMRAM memory cells in a given row on either side of the JMRAM memory cell circuit 350. Thus, the read-word current $I_{RW}$ and write-word current $I_{WW}$ flow through all connected JMRAM memory cell circuits in the row, including the JMRAM memory cell circuit 350, during the respective data-read and data-write operations.

The JMRAM memory cell circuit 350 further includes a write-bit line (WBL) and a read-bit line (RBL) that each passes through the JMRAM memory cell circuit 350. The write-bit line WBL conveys a write-bit current, $I_{WB}$, during the data-write operation, and the read-bit line RBL conveys a read-bit current, $I_{RB}$, during the data-read operation. In some embodiments, the write-bit current $I_{WB}$ may correspond to a write-bit current associated with a column of JMRAM memory cells 350 in the memory array, and the read-bit current $I_{RB}$ may correspond to a read-bit current associated with the column of JMRAM memory cells in the array. In a similar manner, the write-bit lines WBL and read-bit lines RBL may be coupled to adjacent JMRAM memory cells in a given column above and below the JMRAM memory cell circuit 350. Thus, the read-bit and write-bit currents $I_{RB}$ and $I_{WB}$, respectively, will flow through all of the JMRAM memory cells in the column, including the JMRAM memory cell circuit 350, during the respective data-read and data-write operations.

In one or more embodiments, the JMRAM memory cell circuit 350 includes an MJJ 352 that is configured to store a digital state corresponding to the first binary state (e.g., logic-1) or the second binary state (e.g., logic-0), and can be arranged substantially similar to the MJJ 12 previously described in conjunction with FIG. 1 and the exemplary MJJ 212 shown in FIG. 2A. With continued reference to FIG. 3, the write-word line WWL and write-bit line WBL are shown as being magnetically coupled to the MJJ 352, such that the magnetic field orientation of the one or more ferromagnetic layers of the MJJ 352 can be changed (i.e., switched) as a result of magnetic fields that are generated locally by the corresponding write-word current $I_{WW}$ and write-bit current $I_{WB}$. Therefore, based on the configuration of the MJJ 352, the write-word current $I_{WW}$ and the write-bit current $I_{WB}$ can generate corresponding magnetic fields for setting the digital state of the MJJ 352 to the first binary state or the second binary state by applying the combined fields generated by the currents to set the magnetic orientation within the "soft" ferromagnetic layer of the MJJ 352 (e.g., layer 224 shown in FIG. 2A), such as based on the respective directions of current flow—typically of the write-bit current $I_{WB}$—during a data-write operation.

Actually, a variety of ways are contemplated, according to embodiments of the invention, for writing the digital state of the MJJ 352 based on the directions of current flow, durations, and/or amplitudes of the write-word current $I_{WW}$ and the write-bit current $I_{WB}$. As described in greater detail herein, in response to the data-write operation, the MJJ 352 may have a superconducting phase that can be associated with a stable π-state (e.g., a positive π-state resulting in a positive superconducting phase) corresponding to the first binary state, or can be associated with a stable zero state (e.g., zero superconducting phase) corresponding to the second binary state.

In one or more embodiments, the JMRAM memory cell circuit 350 includes a first Josephson junction 354 and a second Josephson junction 356. The Josephson junctions 354 and 356 are arranged in a superconducting loop that includes the MJJ 352, and are coupled to the read-bit line RBL at node 358. As described in greater detail herein, the Josephson junctions 354 and 356 can be activated in a data-read operation to indicate the stored digital state of the MJJ 352. For example, the Josephson junctions 354 and 356 can be triggered during the data-read operation in response to the respective read-word and read-bit currents $I_{RW}$ and $I_{RB}$, as well as a predetermined direction of a superconducting phase associated with the MJJ 352, to indicate that the MJJ 352 is in the first binary state, or not triggered to indicate that the MJJ 352 is in the second binary state, as described in further detail herein.

In the illustrative embodiment shown in FIG. 3, the JMRAM memory cell circuit 350 comprises a transformer 360 that includes a primary winding. $L_1$, in series with the read word line RWL through which the read-word current $I_{RW}$ flows. The transformer 360 also includes a secondary winding. $L_2$, that is inductively coupled to the primary winding $L_1$ and is arranged in parallel with the MJJ 352. The transformer 360 may correspond to a directional write element, as discussed with respect to the transformer(s) 16 shown in FIG. 1. For example, during a data-write operation in which the first logic state (e.g., a logic-1) is to be written to the MJJ 352, the read-word current $I_{RW}$ can be provided on the read-word line RWL, passing through the primary winding $L_1$, to induce a current, $I_T$, in the secondary winding $L_2$.

In one or more embodiments, the current $I_T$ is divided, such that a first portion of the current $I_T$ flows through the MJJ 352 as a directional bias current $I_D$ and a second portion flows through the Josephson junctions 354 and 356 as a current $I_T$-$I_D$. The current $I_T$ can have a prescribed amplitude that is selected to avoid triggering the Josephson junctions 354 and 356 via the current $I_T$-$I_D$ during the data-write operation. The directional bias current $I_D$ can thus flow in a predetermined direction (e.g., as indicated in the JMRAM memory cell 350) through the MJJ 352. Therefore, the magnetic coupling of the write-word current $I_{WW}$ and the write-bit current $I_{WB}$ can set the magnetic state of the MJJ 352, while the directional bias current $I_D$ concurrently biases the MJJ 352 to force the directionality of the phase of the MJJ 352 in the predetermined direction. As a result, the MJJ 352 can be forced into being set in the positive π-state in response to the directional bias current $I_D$.

In addition to the read-word current $I_{RW}$ being provided in the data-write operation to generate the directional bias current $I_D$, the read-word current $I_{RW}$ can also be provided on the read-word line RWL during the data-read operation to bias the Josephson junctions 354 and 356 to read the digital state of the MJJ 352. As described herein, the read-word current $I_{RW}$ being provided to the Josephson junctions 354 and 356 can refer to the read-word current $I_{RW}$ being provided to the Josephson junctions 354 and 356 directly or inductively coupled.

As depicted in FIG. 3, the read-bit line RBL is coupled to node 362, between the secondary winding L2 and the Josephson junction 354, such that the read-bit current $I_{RB}$ enters the JMRAM memory cell circuit 350 at node 362. The read-bit line RBL is also coupled to node 358, via the Josephson junction 354. Node 358, which forms an output of the JMRAM memory cell circuit 350, is connected between the Josephson junctions 354 and 356, such that the read-bit current $I_{RB}$ exits the JMRAM memory cell circuit 350 from node 358. While nodes 358 and 362 are distinct nodes that are separated by the Josephson junction 354, in standby operation (i.e., no read or write operation), these nodes remain at the same voltage level (e.g., 0 V) and transfer the same read-bit current $I_{RB}$ through the Josephson junction 354 or to the next memory cell because the Josephson junction 354 is configured in a superconducting state, which essentially functions electrically as a closed (i.e., shorted) switch. It is useful to think of sections of the read-bit line RBL, or the entire read-bit line, as continuous conductors most of the time, and especially during standby operation.

The digital state of the MJJ 352 can be read from the JMRAM memory cell circuit 350 in response to the read-word current $I_{RW}$ and the read-bit current $I_{RB}$. Specifically, the word-read current $I_{RW}$ can be provided on the read-word line RWL to select an intended row of JMRAM memory cells in the associated memory array. By way of example only, in one or more embodiments the read-word current $I_{RW}$ flows through the primary winding L1 of the transformer 360 as a current pulse. The current pulse of the read-word current $I_{RW}$ is thus inductively supplied to the MJJ 352 and the Josephson junctions 354 and 356, and the read-bit current $I_{RB}$ is provided at node 362. Therefore, the current induced by the read-word current $I_{RW}$ via the secondary winding $L_2$ is added to the read-bit current $I_{RB}$ based on the direction of current flow of the read-word current $I_{RW}$.

The stored binary digital state of the MJJ 352 can be determinative of the critical current necessary to trigger the Josephson junctions 354 and 356 based on the superconducting phase that can be provided by the MJJ 352. For example, if the MJJ 352 is in the zero state, and thus stores the second binary state (e.g., logic-0), the MJJ 352 is in a substantially minimum Josephson energy ground state that does not provide a superconducting phase. Therefore, the combined magnitude of the read-bit current $I_{RB}$ and the read-word current $I_{RW}$, as provided to the Josephson junctions 354 and 356, is not sufficient to trigger the Josephson junctions. Accordingly, a voltage on the read-bit line RBL can remain at a substantially decreased magnitude (e.g., zero volts) to indicate the second binary state.

Alternatively, if the MJJ 352 is in the positive π-state, and thus stores the first binary state (e.g., logic-1), the MJJ 352, having relaxed to a substantially minimum Josephson energy level from its zero-phase substantially maximal Josephson energy level, provides a superconducting phase in the predetermined direction dictated by the positive π-state that adds supercurrent (referred to herein as a current In) to the magnitude of the read-bit current $I_{RB}$ and the read-word current $I_{RW}$. Therefore, the contribution to the overall current due to the superconducting phase of MJJ 352, the read-bit current $I_{RB}$, and the read-word current $I_{RW}$, as provided to the Josephson junctions 354 and 356, is sufficient to trigger the Josephson junctions. Accordingly, the Josephson junctions 354 and 356 can trigger in an oscillatory manner to thereby increase the voltage on the read-bit line RBL, stopping the current flow temporarily through RBL at the selected JMRAM memory cell 350, thus indicating the first binary state.

Figure 6B:
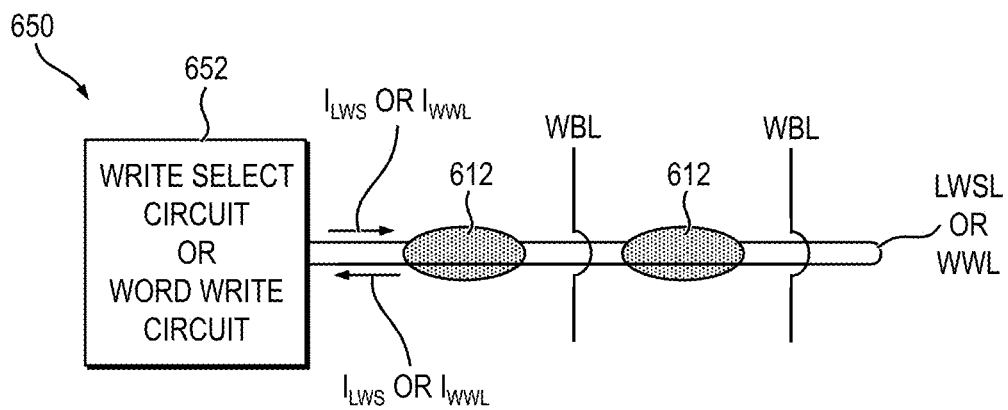
FIG. 6B is an exemplary schematic diagram that depicts a single memory cell write group or a write row (which is formed with a plurality of memory cells in combination with a word write circuit), wherein the hard-axis field for either circuit topology is advantageously doubled by hard-axis current flowing under and over the magnetic Josephson junctions, according to one or more embodiments of the present invention.

In some embodiments, the MJJ 212 and memory cell read circuit (MC) 206 shown in FIG. 2A can be used to disentangle write and read sections of the memory cells, so that the integration (i.e., magnetic coupling, similar to write port connections) of the MJJs of the JMRAM memory cell can be clearly and uniquely denoted in an array of such cells and so that integration of the memory cell read circuits can be clearly and uniquely denoted in an array of such cells. It should be understood that all conventional varieties of MJJs used in conventional JMRAM memory cells are exclusively switched by magnetic fields, except for the MJJs of phase-based-torque memory cells. The port connections for the write-bit line WBL of the phase-based-torque memory cell correspond to (remain consistent with) WBL magnetic coupling connections (write port connections) from JMRAM memory cell to JMRAM memory cell. However, the write-bit line WBL for the phase-based-torque memory cell does not pass over its MJJ. Instead, as already explained, it is integrated into the memory cell read circuits (MCs) (e.g., 207 of FIG. 2B) forming one of the windings of a phase-based-torque transformer. The connections of the phase-based-torque memory cell within the embodiments associated with FIGS. 6A, 7, 8A, 9, 11, and 12 are not shown in those figures, but will become apparent to those skilled in the art given the teachings herein, particularly because FIGS. 2B, 6B and 8B depict such modified connections for the phase-based-torque memory cell.

For the illustrative JMRAM memory cell 350 depicted in FIG. 3, the memory cell read circuit (MC) 206 of FIG. 2A includes the Josephson junctions 354, 356 and transformer 360. For the more abstract JMRAM memory cell 10 depicted in FIG. 1, the memory cell read circuit would include the components 12 and 14. JMRAM memory cells are actually distinguished by both their circuit topology, as represented by JMRAM memory cell 350, and their MJJs, for example "toggle" versus "spin-valve." A "toggle" MJJ (derived from MTJs) uses a sequence of unipolar fields to write a memory cell to its opposite digital state. A "spin-valve" MJJ (also derived from MTJs) uses a unipolar hard-axis field and a bipolar easy-axis field to write a memory cell to a particular digital state defined by the sign of the easy-axis field.

With reference again to FIG. 2A, other than making internal connections to the MJJ 212 via the read-circuit-conductor-lead top 214 and read-circuit-conductor-lead bottom 216 (these connections will be implied in subsequent figures, and thus not shown), the memory cell read circuit 206, in one or more embodiments, includes three ports that are perhaps best described in conjunction with the illustrative JMRAM memory cell circuit 350 depicted in FIG. 3. Specifically, a circle 208 in the memory cell read circuit 206 represents the read-word line RWL connection into the JMRAM memory cell circuit 350, which actually involves two ports ("in" and "out" of the transformer 360), a square 210 represents the read-bit line RBL connection to input node 362 at the top of the JMRAM memory cell circuit 350, and a triangle 213 represents the read-bit line RBL connection to the output node 358 at the bottom of the JMRAM memory cell circuit 350.

While the prior discussion has detailed several aspects of an exemplary JMRAM memory cell (e.g., JMRAM memory cell 350 of FIG. 3), little has been said about how such a memory cell might be written with magnetic fields, other than with respect to one embodiment of the present invention depicted in FIG. 2B. A discussion concerning the relative (and absolute) magnetic field strengths, and application times, methods/approaches, follows. There are different known magnetic-field-only approaches, which are based on room temperature magnetic tunnel junctions (MTJs), as described, for example, in U.S. Pat. No. 6,545, 906, by L. Savtchenko, and in U.S. Pat. No. 6,335,890, by W. Reohr et al., the disclosures of which are incorporated by reference herein in their entirety for all purposes. While one or more embodiments of the invention relate to the write methods and magnetic structures that are described in both of these patents, modified where necessary for operation with an MJJ, a primary focus of the discussion herein will be on the latter '890 patent by Reohr et al., primarily because the magnetic structure of the MJJ is simpler to fabricate in the latter patent (the magnetic stack is actually depicted as consistent with the MJJ 212 of FIG. 2A) compared to the former patent since it has fewer layers. Not only is it easier to demonstrate, but it is also a better choice given its case of manufacturing.

Despite the simpler fabrication requirements of the MJJ, however, such a memory cell requires a write circuit that sources a bidirectional current in the bit lines, which can be disadvantageous. Possibly, a write circuit that drives a unidirectional current can be more reliable and is thus a preferred implementation. Therefore, while a conventional "spin-valve" MJJ is discussed in detailed description, embodiments of the invention contemplate the use of other conventional MJJs; that is, all presently known MJJs incorporated within a memory cell will operate in combination with at least some of the embodiments of the present invention. Such conventional MJJs (or from conventional room temperature MTJs) and memory cell read circuit topologies may include, but are not limited to, the following examples of MJJ switching of various memory cells.

A first conventional approach involves concepts disclosed/discussed in U.S. Pat. No. 6,335,890 (which describes an approach to writing memory cells having MTJs that will be described fully in the detailed description), by W. Reohr et al., U.S. Pat. No. 5,640,343 (for memory cells having MTJs), by W. Gallagher et al, and U.S. Pat. No. 9,520,181 (for memory cells having MJJs that has been heretofore described in the detailed description), by D. Miller et al. The first conventional MJJ switching of "spin valve" memory cells requires a write circuit that drives a unidirectional current through a superconducting loop that includes the write-word line WWL and a write circuit that drives a bidirectional current through a superconducting loop that includes the write-bit line WBL.

A second conventional approach involves concepts disclosed/discussed in U.S. Pat. No. 5,640,343 (for memory cells having MTJs), by W. Gallagher et al, U.S. Pat. No. 6,545,906 (method for writing MTJs and new MTJ stack), by L. Savtchenko, et al. and U.S. Pat. No. 9,520,181, by D. Miller et al. The second conventional MJJ switching of "toggle" memory cells requires write circuits that drive unidirectional currents only through superconducting loops that include the write-word line WWL and the write-bit line WBL (called a digit line in the Savtchenko patent), A third conventional approach involves concepts disclosed in U.S. Pat. No. 7,804,710 (wherein a write-word line WWL selects spin-torque MTJ for writing), by W. Reohr, and U.S. Pat. No. 10,122,351 (MJJ device and memory cell), O. Naaman, et al. The third conventional MJJ switching of the "phase-based-torque" memory cells requires a write circuit that drives a unidirectional current through a superconducting loop that includes the write-word line WWL and a write circuit that drives a bidirectional current through a superconducting loop that includes the write-bit line WBL.

In conventional room-temperature magnetic memory architectures, writing individual memory cells without also writing adjacent or other non-intended cells has been a persistent problem. Typically, writing a memory cell involves passing electrical currents simultaneously through a bit line and word line, at the intersection of which an intended MTJ-based memory cell resides (which corresponds, for example, to a JMRAM memory cell, such as the exemplary JMRAM memory cell 10 shown in FIG. 1). While discussing the write-selectivity of JMRAM memory cells 10, in part, the various write-directed embodiments of the invention will be differentiated from known memory cell arrangements (e.g., U.S. Pat. No. 6,335,890, by W. Reohr et al.), either in their topological or physical structures or in their methods. Already, a write-directed embodiment for a new physical word-line structure has been proposed in FIG. 2B.

As will be described in further detail herein below, almost all write operations are analogous between room-temperature MTJ memory cells (e.g., one-transistor, one-magnetic tunnel junction (1T1MTJ) cells) and superconducting JMRAM memory cells. Thus, an MTJ-based memory cell will no longer be discussed; rather, the JMRAM memory cell or MJJ according to aspects of the invention will be discussed. In one unreliable approach to writing memory cells, a selected JMRAM memory cell, or more specifically its corresponding MJJ, will experience a magnetic field that is a vector sum of orthogonal magnetic fields, having similar magnitudes, generated by corresponding write-word and write-bit currents, $I_{WW}$ and $I_{WB}$, respectively. All other JMRAM memory cells (and more specifically their corresponding MJJs) that share the same write-bit line or write-word line as the selected JMRAM memory cell will be half-selected and will thus be subjected to either bit line or word line magnetic fields, respectively. Since the magnitude of the vector sum of the word line and bit line fields is about forty-one percent (41%) larger than the individual word line or bit line fields, the selectivity of the selected MJJ included in a corresponding JMRAM memory cell over half-selected MJJs is poor, especially when non-uniform switching characteristics of the MJJs are considered.

Variations in the shape or size of an MJJ can give rise to variations in magnetic thresholds of the JMRAM memory cells (more specifically their MJJs) which are so large that it is virtually impossible to write a selected memory cell using the unreliable approach noted above without also switching some of the half-selected cells that share the same bit line or word line, thus placing the reliability and validity of the stored data in those half-selected cells in question. Other factors, such as temperature and processing variations, can adversely affect the write-select margin. Additionally, creep, which generally refers to the spontaneous switching of an MJJ when it is subjected to repeated magnetic field excursions much smaller than its nominal switching field, narrows the acceptable write select margin even further thereby making the need for greater selectivity of individual JMRAM memory cells (more specifically their MJJs) even more imperative.

Figure 4:
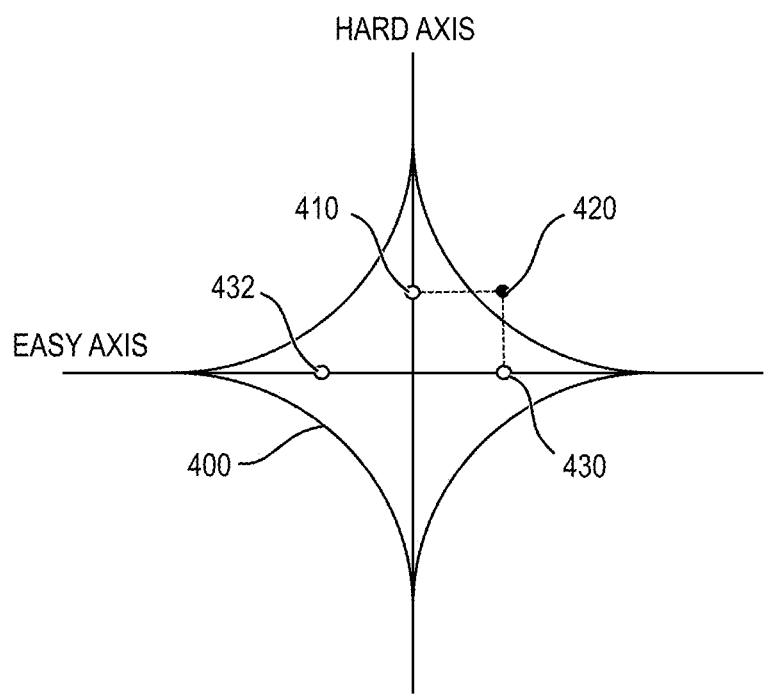
FIG. 4 is a graphical representation conceptually depicting magnetic field points superimposed on a switching astroid illustrating a write operation for a prescribed magnetic memory architecture.

For two orthogonal magnetic fields of similar magnitudes, FIG. 4 conceptually depicts an approach for assuring magnetic selectivity that only works for an ideal thin-film magnetic memory element as described by Stoner-Wohlfarth (but not a real thin-film magnetic memory element). Referring to FIG. 4, assuming that the respective write-word and write-bit currents, $I_{WW}$ and $I_{WB}$, generate magnetic fields along a hard magnetic axis (hard axis) and an easy magnetic axis (easy axis), represented by points 410 and 430, respectively, of the magnetic element, a magnetic field ($H_x$, $H_y$) required to switch the state of the memory element must equal or exceed the solid curve or boundary of a switching astroid 400 (e.g., field point 420 exceeds astroid 400). This switching astroid 400 satisfies the relation $H_h^{2/3} + H_e^{2/3} = H_k^{2/3}$, where $H_h$ is a hard-axis field, $H_e$ is an easy-axis field, and $H_k$ is an anisotropy field. In a working memory, the vector sum of the magnetic fields of each intentionally selected cell—true for all memory cells in the memory array during operation of the memory—should always lie outside the boundary of the switching astroid 400 (e.g., corresponding to point 420). In other words, the combined hard- and easy-axis magnetic fields are large enough to write the MJJ to a digital state that aligns with the easy-axis field direction when the easy-axis and hard-axis fields are removed.

The "soft" ferromagnetic layer of the MJJ (e.g., layer 224 in FIG. 2A) has one of two possible dominant magnetic domain orientations (229 in FIG. 2A) in standby operation (i.e., no applied write field) that can align with either one of the positive (e.g., field point 430 of FIG. 4) or negative (e.g., field point 432 of FIG. 4) easy-axis field directions. JMRAM memory cells 10 of FIG. 1 having common write-bit lines and write-word lines, WBL and WWL, are said to be "half-selected" because either the easy-axis or hard-axis field impinges on these cells. The state of a "half-selected" cell for a functional memory doesn't change since the magnetic fields acting on it (e.g., corresponding to points 410 and 430) remain, by design, within the boundary 400 of the switching astroid.

To reverse an existing magnetic orientation (229 of FIG. 2A), an easy-axis field is applied opposite in polarity to that which had been used to write the MJJ 212 in the previous write operation, and a hard-axis field is applied to select the MJJ 212 to be written. In an array of JMRAM memory cells, the write-word line WWL can conduct the write-word current $I_{WW}$ (which generates a hard-axis field), and the write-bit line WBL can conduct the positive write-bit current $I_{WB}$ (which generates a positive easy-axis field). After these magnetic fields are removed, no matter what had been written previously, the magnetic orientation (229 of FIG. 2A) in a standby state points in a positive direction along the easy-axis of the soft ferromagnetic layer aligning with the major axis of ellipse of the MJJ 212 (top-plan view of FIG. 2A). The reversal of the magnetic orientation (229 of FIG. 2A) follows: In an array of JMRAM memory cells, the write-word line WWL conducts the write-word current $I_{WW}$ (which generates a hard-axis field), and the write-bit line WBL conducts the negative write-bit current $-I_{WB}$ (which generates a negative easy-axis field). After these magnetic fields are removed, no matter what had been written previously, the magnetic orientation (229 of FIG. 2A) in a standby state points in a negative direction along the easy-axis of the "soft" ferromagnetic layer aligning with the major axis of ellipse of the MJJ 212 (top-plan view of FIG. 2A). A read operation does not impact the state of the MJJ.

It is important to consider that, although depicted as a thin fixed boundary line conforming to the shape of an astroid, the switching astroid 400, in reality, may significantly change shape or exhibit an offset (relative to the origin of the axes) due, for example, to environmental conditions (e.g., temperature) and/or processing variations, among other factors. Variation between individual JMRAM memory cells (more specifically, their corresponding MJJs) in a memory array substantially reduces the write-select margin within the overall memory array. Non-ideal physical artifacts blur the distinction between half-selected and selected cells; the former could be written in a write operation intended only for the latter.

As will be apparent to those skilled in the art, the magnetic field strength of a wire conductor decays as the inverse of the radial distance outward from the conductor. Magnetic isolation is therefore achieved by adequately spacing one group of memory cells from the conductor(s) used to write another group of memory cells. Of course, this spacing will primarily depend upon the characteristics of the magnetic memory device itself, defined, at least in part, by the switching astroid for the particular device, as previously discussed. This spacing unfortunately impacts the density of the memory array; that is, the greater the spacing between groups of memory cells, the less dense will be the memory array.

To combat one or more non-idealities of a real switching astroid, and thus to assure the reliable writing of MJJs, an approach consistent with that described in U.S. Pat. No. 6,335,890, by Reohr et al, can be taken. This approach involves the use of very high hard-axis fields to be applied to a selected set of MJJs and a requirement that the selected set of MJJs must also be written with independent easy-axis magnetic fields, which depend upon the digital state of the data. Possibly lying just inside or outside of a real switching astroid (not shown in FIGS. 5A and 5B; astroid 500 is ideal), strong hard-axis magnetic fields correspond to magnetic field points 510 or 512 to be discussed with respect to FIGS. 5A and 5B, respectively. In terms of embodiments of the present invention, all JMRAM memory cells within the memory cell write group, or along a write-word line WWL, can be preferably written, specifically for high hard-axis writing approaches, otherwise the state of half-selected memory cells would undesirably relax into an unknown state, because any irregularity in the switching astroid of the MJJ and/or stray magnetic fields would dictate the ultimate orientation of the bit-magnetic-field (e.g., 229 in FIG. 2A) and thus the resultant state of the JMRAM memory cell (e.g., memory cell 200 in FIG. 2A).

Another significant aspect of isolation concerns the direction of the applied magnetic fields; namely, whether the applied magnetic fields are primarily in-plane or out-of-plane. Bit lines and local write-select lines (LWSLs) will emanate radial magnetic fields, which are primarily directed within the plane of the memory elements. It will become apparent, when alternative JMRAM memory cell physical arrangements are discussed, that segments of a selected local write-select line LWSL may also generate out-of-plane radial magnetic fields, both for selected memory cell write groups and for unselected memory cell write groups. In-plane fields switch magnetic elements according to the manner previously described with respect to the illustrative switching astroid 400 shown in FIG. 4.

For superconducting MJJs, the total anisotropic switching field, $H_k$, can be well below 100 Orstead required to assure magnetic domain stability for room temperature MTJs. The MJJs have significantly lower thermal instability at 4 degrees Kelvin; they can have a lower magnetic mass. Accordingly, MJJs will have less coercivity in the "soft" ferromagnetic layer (e.g., layer 224 of FIG. 2A), and therefore require a lower magnetic field to switch the bit-magnetic-field orientation (e.g., 229 in FIG. 2A). By contrast, a field strength in excess of about 1 Tesla is required to orient the magnetic domains of the memory elements out-of-plane, due primarily to a significantly larger and more local demagnetization field. In devising physical designs, magnetic field isolation may then be assessed by considering the relative proximity of write-line conductors to memory elements and the orientation (i.e., in-plane vs. out-of-plane) of the magnetic field.

In the following discussion, a reliable approach to the generation and application of hard- and easy-axis magnetic fields will be described, with reference to FIGS. 2A (and 2B), 5A, and 5B. One important objective here will be to assure that all half-selected memory cells only receive easy-axis fields; those memory cells having a common write-bit line with the cells being written. Because all memory cells along a selected local write-word line (LWWL) will be written, none of the memory cells will be half-selected.

Figure 5A:
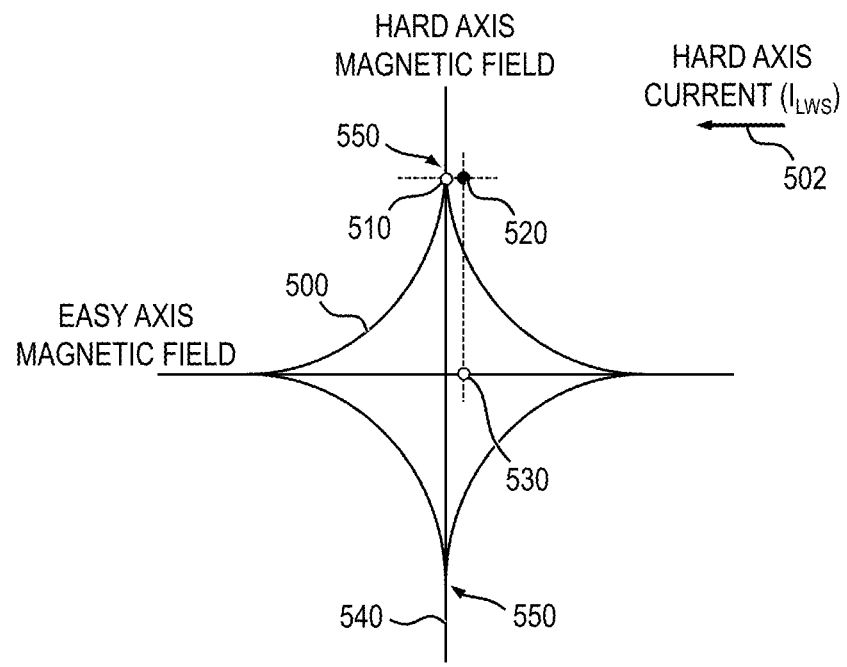
FIGS. 5A and 5B are graphical representations conceptually depicting magnetic field points superimposed on a switching astroid illustrating a write operation for a prescribed magnetic memory architecture that applies high hard-axis fields with a positive direction and a negative direction, respectively, to magnetic Josephson junctions.
Figure 5B:
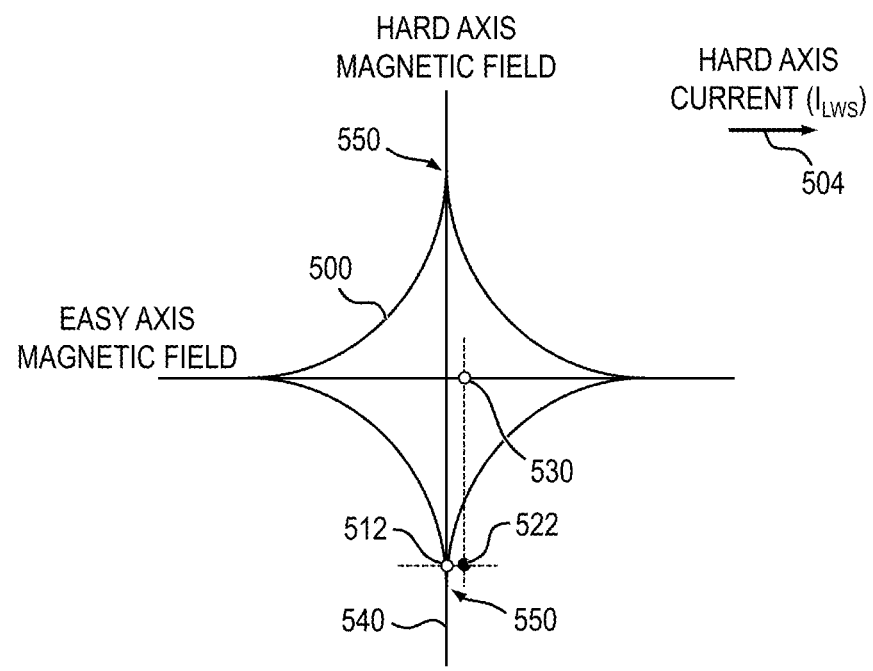

FIGS. 5A and 5B conceptually depict an illustrative switching astroid 500 for an MJJ, along with applied hard-axis and easy-axis magnetic fields that exemplify the hard-axis field approach to writing, which can be exploited by one or more embodiments of the invention. Using the well-known right-hand rule, a local write-select current, $I_{LWS}$, oriented in the direction 502 of FIGS. 2A and 5A or in the direction 504 of FIGS. 2A and 5B, and write-bit current, $I_{WB}$ (not shown on FIG. 2A because it would be directed in a perpendicular orientation into and out from the write-bit line WBL (202 of FIG. 2A)) generate fields along the hard magnetic axis, represented by point 510 in FIG. 5A, or point 512 in FIG. 5B, and along the easy magnetic axis, represented by point 530 in FIGS. 5A and 5B, respectively, of the magnetic element. The local write-select current, as the term is used herein, is preferably defined as the hard-axis current (or what had previously been referred to as the write-word current in the original definitions concerning the memory cells) that is derived from a local write select line LWSL.

The magnetic field ($H_x$, $H_y$) required to switch the state of the magnetic element (MJJ) must equal or exceed the boundary of the switching astroid 500, as discussed previously with respect to FIG. 4. In a working memory, the vector sum of the magnetic fields of each intentionally selected memory cell should always lie outside the boundary of the switching astroid 500 (e.g., corresponding to point 520). In other words, together both fields are large enough to write the MJJ to a digital state that aligns with the easy-axis field direction. It is important to understand that a collection of real/non-ideal switching astroids would not have such clean boundaries as those shown with respect to the ideal switching astroid 500.

The "soft" ferromagnetic layer (e.g., 224 of FIG. 2A) has one of two possible dominant magnetic domain orientations 229 in standby (i.e., with no applied write fields) that can align with either one of the positive (e.g., field point 530) or negative (i.e., field point not shown) easy-axis field directions. During a write operation, any JMRAM memory cells (e.g., JMRAM memory cell 10 shown in FIG. 1) having a write-bit line WBL or local write-select line LWSL in common with a selected memory cell are said to be "half-selected" because either the easy-axis or hard-axis fields, generated by the respective write-bit line or local write-select line currents in these lines, impinges on these memory cells. The state of a half-selected memory cell along a WBL for a functional (also ideal) memory array doesn't change since the magnetic fields acting on it (e.g., corresponding to point 530 in FIGS. 5A and 5B) remain, by design, well within the boundary of the switching astroid 500.

Unlike FIG. 4, FIGS. 5A and 5B depict an approach to magnetic selectivity that applies to a non-ideal thin-film magnetic memory element wherein the hard-axis field is substantially greater than the easy-axis field (e.g., three times). More particularly, the hard-axis field points 510 and 512 are designed to be large in magnitude and proximate to the hard-axis tips/corners 550 in the ideal switching astroid 500 as described by Stoner-Wohlfarth. If hard-axis fields are exclusively applied to an MJJ JMRAM memory cell, a memory cell that is half-selected along the hard-axis, such fields would disturb the state of non-ideal memory cells that don't have the tips/corners of their non-ideal switching astroid (not explicitly shown) on the hard-axis line 540. Because the applied hard-axis field (without an applied easy-axis field) could fall to the left or the right of the hard-axis tips/corners of the non-ideal switching astroid, erratic or otherwise undesirable switching (i.e., to an unintended state) of the magnetic field orientations (229 in FIG. 2A) could occur. The final state of the memory cell in a standby state would depend on whether the non-ideal switching astroid was shifted to the right or left.

The switching characteristics of ideal memory cells, as illustratively shown in FIGS. 5A and 5B, depict hard-axis tips/corners 550 of the ideal switching astroid 500 on the hard-axis line 540. However, if all JMRAM memory cells receiving this large hard-axis field also receive an easy-axis field, by definition, the combination of easy-axis and hard-axis fields would be large enough to overcome the non-ideal characteristics of a non-ideal switching astroid and drive all memory cells (except those which could be fixed with redundancy) within a memory array to the desired (i.e., intended) digital state. Because any switching astroid narrows near its tips/corners 550, only a small easy-axis field generated by a corresponding write-bit current is necessary to assure highly reliable switching. The easy-axis bit-line fields for memory cells that are half-selected along the write-bit line can remain low enough to be contained within the boundary of the non-ideal switching astroid, assuring that the half-selected memory cells in the bit dimension are not written.

Now that an illustrative approach to reliably writing MJJs of JMRAM memory cells according to one or more embodiments of the invention has been described, from the perspective of the applied magnetic fields (e.g., half-selected memory cells) and a non-ideal switching astroid, it is important to consider how to configure arrays of JMRAM memory cells along with their read and write circuitry to achieve certain desired characteristics, including increased memory bit density, reduced power consumption, increased hard-axis magnetic fields for write selection, and rapid generation of flux quanta for write selection, among other capabilities. All approaches should also maintain the operability and reliability of the memory array. For example, reducing required flux generation for flux pumps (a potential candidate for a write circuit) may be necessary to achieve memory viability.

Figure 6A:
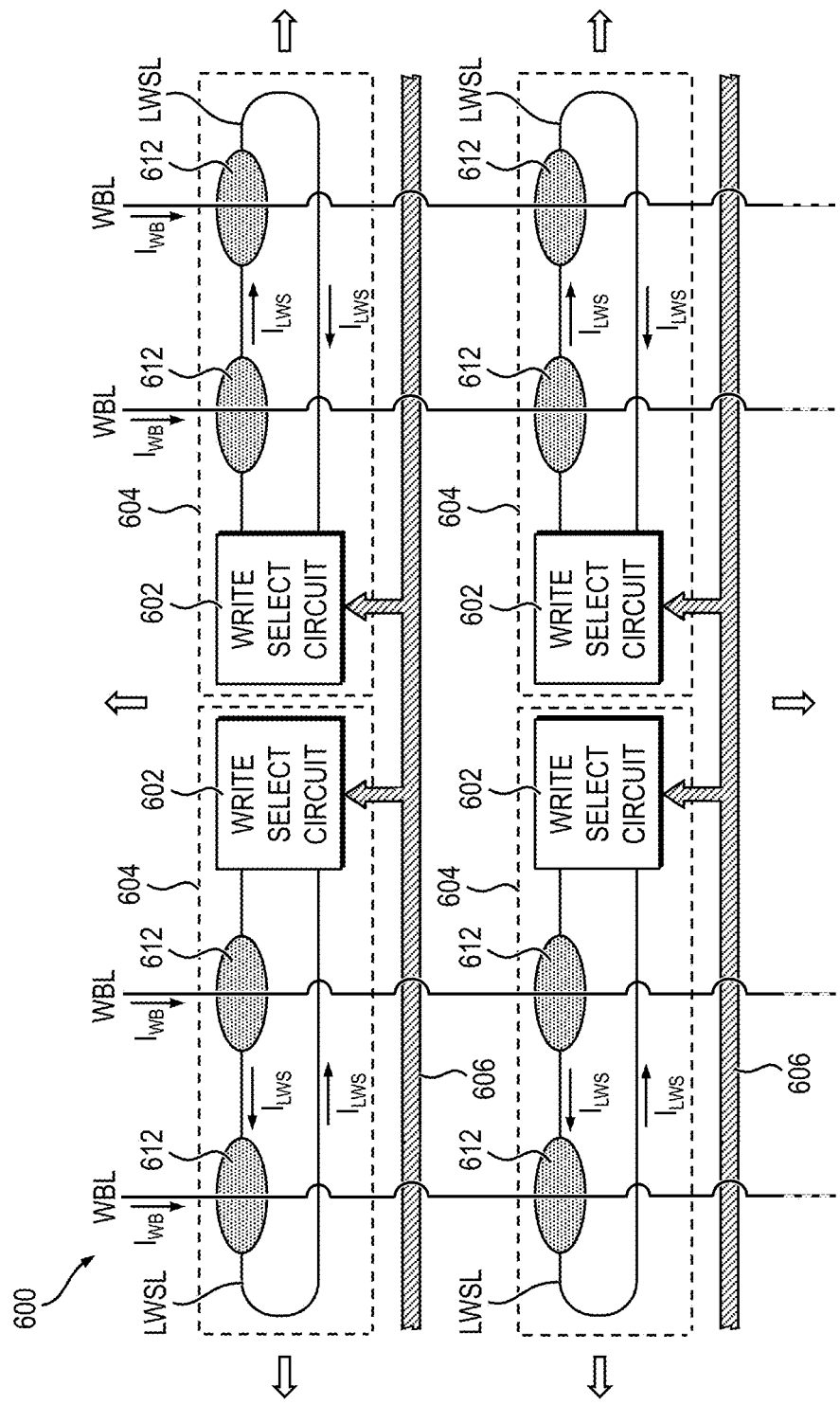
FIG. 6A is an exemplary schematic diagram that depicts at least a portion of exemplary memory array architectures comprising a plurality of memory cell write groups, which emphasizes a write operation, according to one or more embodiments of the present invention.
Figure 7:
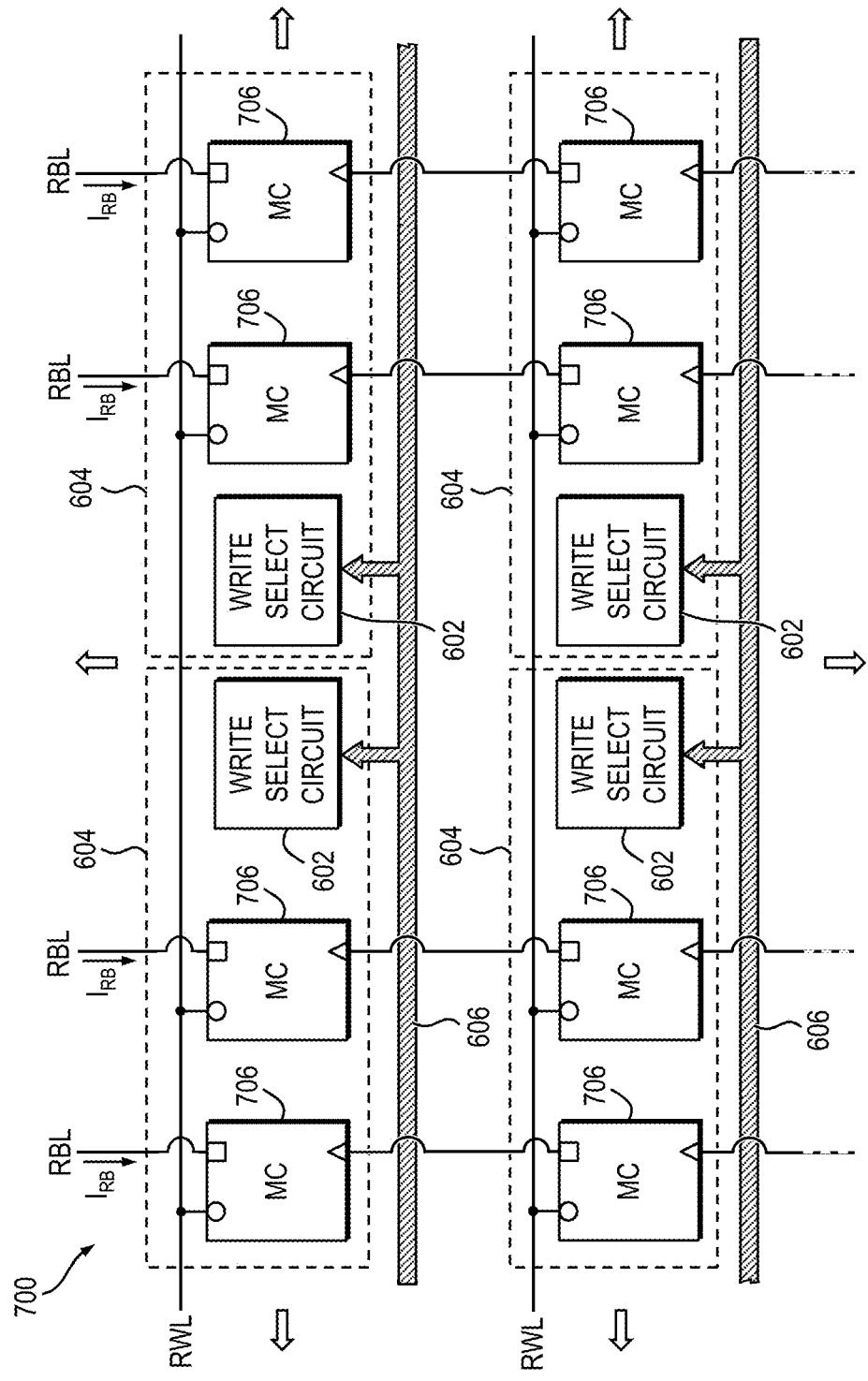
FIG. 7 is an exemplary schematic diagram that depicts at least a portion of an exemplary memory array architecture, including a plurality of memory cell write groups, which emphasizes a read operation, according to one or more embodiments of the present invention.

FIGS. 6A, 6B and 7 are schematic diagrams depicting at least a portion of exemplary memory array architectures comprising a plurality of memory cell write groups, according to one or more embodiments of the invention. More particularly, FIG. 6A depicts a write region 600 of an exemplary memory array that conceptually defines circuit topology and possible physical locations (proximate horizontal or vertical) of a write circuit in relation to the MJJs that it assists in writing, according to one or more embodiments of the invention. With reference to FIG. 6A, at least a portion of the write region 600 is shown comprising a plurality of memory cells 612, each of which preferably includes at least one MJJ in one or more embodiments, and write select circuits 602 each coupled to a unique subset of the memory cells 612, via corresponding local write select lines LWSLs, and arranged into corresponding memory cell write groups 604.

Each memory cell write group 604 is preferably defined to include a write select circuit 602 (which may be implemented, for example, in a manner similar to the write select circuit disclosed in U.S. Pat. No. 10,355,677 to Miller et al.) and a plurality of memory cells 612 connected to a corresponding common local write select line LWSL. The memory cell write group 604, in one or more embodiments, further includes write control lines/conductors and optional integrated support repeaters (e.g., Josephson transmission lines (JTLs) and/or passive transmission lines (PTLs), drivers and receivers), which together are defined as a write select control flow 606. The write select control flow 606 typically selects a row (or a plurality of stacked rows for writing, for example as shown in FIG. 8). Thus, the write region 600 of the memory array comprises a plurality of memory cell write groups 604, each of at least a subset of the memory cell write groups including a write select circuit 602, interconnect fabric (e.g., a LWSL and one or more write bit-lines WBLs), the write select control flow 606, and one or more memory cells (e.g., MJJs) 612.

In this illustrative embodiment, the write-bit lines WBLs are configured to pass over corresponding memory cells 612, and the local write-select lines LWSLs are configured to pass under corresponding memory cells, so that each memory cell is disposed between, and at an intersection of, a unique pair of a corresponding write-bit line and local write-select line. It is to be appreciated, however, that embodiments of the invention contemplate other arrangements of memory cells, write-bit lines and local write-select lines. For example, FIG. 6B depicts a single memory cell write group 650 wherein the write-bit lines WBLs are integrated into memory cell read circuits (706 of FIG. 7, as discussed with respect to memory cell read circuit 207 of FIG. 2B), and the local write select line LWSL (or write-word line WWL) passes under and returns over (or vice versa) each of the corresponding memory cells 612 in the memory cell write group.

With reference now to FIG. 7, an exemplary read-partial-write region 700 of a memory array is depicted for the purpose of defining circuit topology and physical locations (proximate horizontal or vertical) of a read circuit functionality, according to one or more embodiments of the invention. At least a portion (read portion) of the read-partial-write region 700 comprises a plurality of memory cell read circuits (MC) 706 that represent the locations of JMRAM memory cells and their respective connections into a read interconnect fabric that includes read word lines RWLs and read bit lines RBLs arranged into the corresponding memory cell write groups 604. The JMRAM memory cells, which are preferably consistent with the illustrative JMRAM memory cell 200 depicted in FIG. 2A (including memory cell 10 (FIG. 1), a general memory cell, or memory cell 350 (FIG. 3), a specific memory cell), which are intentionally divided across the common write regions 600 and the read-partial-write regions 700, of FIGS. 6A and 7, are preferably formed from combinations of MJJs 612 and memory cell read circuits 706.

Figure 13:
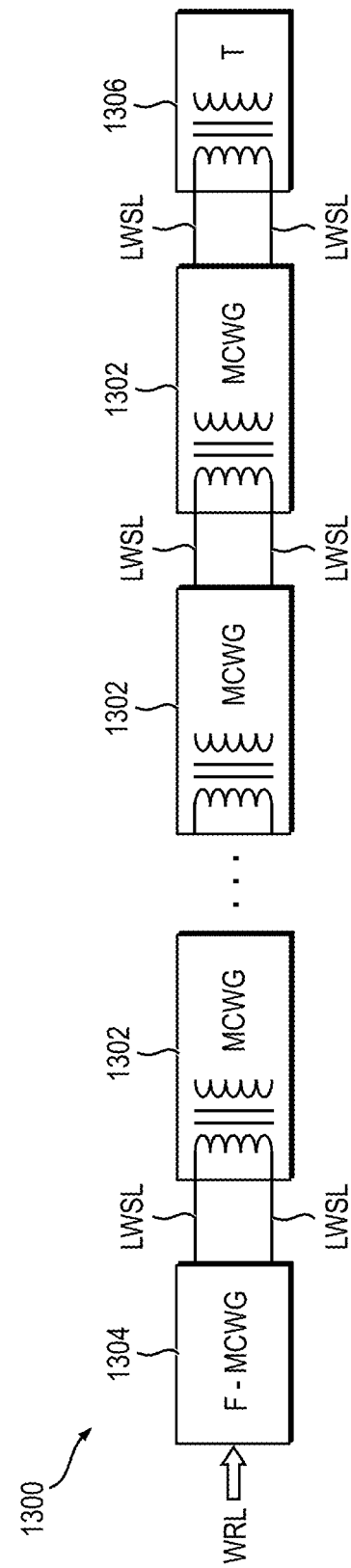
FIG. 13 is a schematic diagram that depicts at least a portion of an exemplary memory array architecture including a plurality of memory cell write groups aligned in a row that propagate write select control from one memory cell write group to the next in the row, which emphasizes a write operation, according to one or more embodiments of the present invention.

As shown in FIGS. 6A and 7, the memory cell write groups 604 preferably include at least one JMRAM memory cell, a local write select line LWSL, (including memory cells 612 and memory cell read circuits 706) and a write select circuit 602, wherein the at least two memory cell write groups 604 are connected into the overall mesh of the memory array via at least one read word line RWL, read bit lines RBLs, write-bit lines WBLs, and a write select control flow 606 (an "intrinsic" write select control flow can be integrated into the write select circuits and local write select lines as depicted with respect to FIGS. 8B and 13). Furthermore, in order to satisfy the definition of a memory cell write group 604, there are at least two such memory cell write groups 604, of which the aforementioned is one, connected by at least one common read bit line RBL. In addition, it should be understood that one or more control signals within a write select control flow 606 could be shared with proximate memory cell write groups 604, as will be discussed further in conjunction with FIG. 8A.

With continued reference to FIGS. 6A and 7, it should be noted that each read word line RWL connects to at least one JMRAM memory cell 706 in at least two memory cell write groups 604 disposed along a row (horizontal axis) and that there are at least two rows in a memory region 600, 700. In addition to the explicit connections shown in FIGS. 6A and 7, other connections, such as, for example, clock lines through which AC power is delivered (possibly emanating from a resonant clock network), DC bias current adjustment lines, and the like, are implied connections that pass through the write select circuits 602 and circuitry associated with the write select control flow 606. These wires induce currents within the circuits 602, 606 primarily for the generation of the local write select current $I_{LWS}$ and for the propagation of write select control signals, respectively. Write select control signals distributed by the write select control flow 606 could, for example, trigger the write select circuit 602 to add or subtract one flux quantum (or some other flux amount) each cycle (e.g., a reciprocal quantum logic RQL cycle, which operates over 4 phases) to the superconducting loop, which includes the local write select line LWSL, the write select circuit 602, and potentially a superconducting ground plane.

Note that the local write select lines LWSLs shown in FIGS. 6A and 6B return the local write select current $I_{LWS}$ to the write select circuit 602. It is to be appreciated that the configuration of the memory array shown in FIG. 6A is merely illustrative, and that embodiments of the invention are in no way restricted to any particular arrangement of the memory cell write group 604. It is contemplated, for example, as will become apparent to those skilled in the art given the teachings herein, that the local write select current $I_{LWS}$ may egress the memory cell write group 604 on the side opposite to the write select circuit 602, connecting to a ground plane there and eventually returning $I_{LWS}$ through the ground plane to the write select circuit 602.

Consistent with the segmented write line approach described in U.S. Pat. No. 6,335,890 by W. Reohr, et al., the disclosure of which is incorporated by reference herein in its entirety, during each write cycle, the local write select current $I_{LWS}$ circulates through a selected local write select line LWSL shown in FIG. 6A, passing under or over each MJJ 612 in a corresponding memory cell write group 604. In this manner, a magnetic field is established along the hard-axis of each MJJ 612 within a given memory cell write group 604 that is large enough to destabilize the MJJ 612 for a required write operation, and thus prepare it to store the digital state (Boolean state) indicated by the positive or negative write bit current $I_{WB}$ or $-I_{WB}$, respectively, flowing within each dedicated write-bit line WBL.

In one or more embodiments, it is similarly contemplated that the hard-axis magnetic field, generated by the local write select current $I_{LWS}$, is preferably substantially localized to those JMRAM memory cells in each memory cell write group 604 along a row of memory cell write groups that are selected. Not all memory cell write groups 604 along the row actually have to be selected. In fact, a subset of memory cell write groups in a row could be optionally selected in another embodiment by propagating write select control flow signals through the columns of stacked write select circuits 602 and ANDing row and column controls (column controls not explicitly shown, but implied). Such a logical and physical structure would enable write data fields to be smaller and would conserve power for what will be referred to as sub-atomic writes, as discussed in further detail herein below.

In FIGS. 5A and 5B, points 510 and 512 indicate the relative magnitudes and signs of the applied hard-axis magnetic fields superimposed on the switching astroid 500 of the MJJs 612. The magnetic field generated by the write select line current $I_{LWS}$ preferably destabilizes the magnetic moment of each memory element, corresponding to an MJJ 612 plus its memory cell read circuit 706, in the associated memory cell write group 604. Each destabilized memory element is subsequently written to a "1" or "0" logic state by driving a positive or negative current, respectively, through the corresponding write-bit lines WBLs coupled to the memory cells. The write-bit current $I_{WB}$ conveyed by a corresponding write-bit line WBL creates a small positive or negative electromagnetic field along the easy-axis of each memory cell and thus drives each cell to its final "1" or "0" logic state. As shown in FIGS. 5A and 5B, such a selected memory cell has a field point 520 or 522, lying outside the switching astroid boundary 500, while a half-selected memory cell, having a common write-bit line WBL with the selected memory cell, has a field point 530 well within the boundary of the switching astroid 500 (due primarily to the reduced magnitude of the bit line field of this scheme).

In comparison to conventional write architectures, the approach according to embodiments of the invention increases the flux generation per memory cell because the inductance of the superconducting loop is diminished; given that fewer memory cells (collectively having a shorter local write select line) are associated with a single write select circuit (or write word line driver). Identical flux generation combined with less inductance means higher currents are possible. These higher levels of current are required to the greater hard-axis magnetic field requirement for writing approaches discussed with respect to FIGS. 5A and 5B. The write margin (i.e., the difference between selected and unselected cells) of this approach (the application of magnetic fields described in U.S. Pat. No. 6,335,890 by W. Reohr, et al.), as applied to embodiments of the invention, can be dramatically improved by restricting the application of the hard-axis field to selected memory cells only. Half-selected memory cells do not exist in the word-associated dimension (i.e., hard-axis) of FIGS. 5A and 5B. The write architecture illustrated in FIG. 4, however, has half-selected field points 430 and 410, generated by the write-bit current $I_{WB}$ and local write select current $I_{LWS}$ traversing the bit lines and word lines, respectively, that substantially reduces the write margin of the memory cell.

With reference again to FIG. 6A, as discussed above, the local write select line LWSL according to one or more embodiments of the invention passing through each associated JMRAM memory cell is preferably proximate to, but is electrically isolated from, the magnetic memory element, MJJ 612, forming the memory cell. Write-bit lines WBLs are preferably substantially orthogonal (i.e., perpendicular) to the local write select lines LWSLs proximate to the MJJs 612.

With continued reference to FIGS. 6A and 7, other than storing state, retrieving state, and receiving control signals for write and read operations (write-bit currents $I_{WB}$ for storing data and local write select currents $I_{LWS}$ for selecting memory cells to be written, read-bit currents $I_{RB}$ for retrieving data and read-word currents $I_{RW}$ for selecting memory cells from which to read), write select circuits and memory cells require power (i.e., AC and DC—not explicitly shown, but implied) for enabling the generation of flux in the local write select line to assist in reading and writing (by the write select circuit), the memory cell write group 604. The memory cell write group 604 functions primarily (i) to store data into all the MJJs 612 of its JMRAM memory cells, when selected (write-selected), (ii) to retrieve data from the memory cells imposing their state on the read bit lines RBLs, and (iii) to deliver the data present on the read bit lines RBLs to the sense amplifiers.

The write select circuit 602, in one or more embodiments, can be configured to generate a particular level of DC current in the superconducting loop, which includes at least a portion of the write select circuit 602 and the local write select line LWSL, using AC energy coupled into the write select circuit 602 through its transformer. The local write select current $I_{LWS}$ flows through the write select circuit 602 and the local write select line LWSL of a corresponding selected memory cell write group 604. The current is generated and directed all within the memory cell write group 604.

It should be understood that approaches to routing current through a wire between room temperature and supercool temperature (e.g., 4.2 degrees Kelvin (4.2 K)) electronics are dissimilar, primarily because of the fundamentally different properties of a three-terminal FET switch (e.g., FETs) and a two-terminal Josephson junction. At the moment, the Josephson junction is perceived to be a superior element for 4.2 K electronics due mainly to power issues that are associated with FET/CMOS circuits operated at supercool temperatures (e.g., 4.2 K). In contrast to the realization of a generalized circuit, the MJJ and MTJ devices necessary to form the storage elements within magnetic random access memories, at 4.2 K and room temperatures, have many common attributes and requirements.

The descriptions thus far have focused on writing MJJs with very high hard-axis fields, as depicted in FIGS. 5A and 5B. However, it is to be appreciated that embodiments of the invention are not limited to writing MJJs with very high hard-axis fields. Rather, embodiments of the present invention not only permit the application of very high hard-axis fields, which appears to be a preferred approach, at least from an MJJ device simplicity perspective, but also enable other approaches which have either already been discussed or will be explained in conjunction with alternative embodiments herein below, to the extent necessary for those skilled in the art to integrate aspects according to embodiments of the invention into future innovations.

Concerning the write operation, one or more embodiments of the invention can provide a greater ratio of flux quanta to superconducting loop inductance, which beneficially translates into higher write currents (e.g., local write select current $I_{LWS}$), due at least in part to area efficiencies of the write select circuit (which will be discussed in further detail herein below). One obstacle to realizing a functional JMRAM having a reasonable area efficiency to make it commercially competitive with respect to other memories based on Josephson junctions is being able to source adequate write currents using conventional write circuits through the write-bit lines and write-word lines of standard arrays of JMRAM memory cells. Aspects in accordance with one or more embodiments of the invention help substantially to overcome this obstacle. Moreover, in the case of phase-based-torque memory cells, embodiments of the invention also enable a doubling of the hard-axis magnetic field applied to the MJJ, as will be discussed in further detail in connection with FIG. 6B.

More particularly, FIG. 6B is an exemplary schematic diagram depicting a single memory cell write group or a write row 650, which is formed with a plurality of memory cells in combination with a write select or word write circuit, wherein the hard-axis field for either circuit topology is advantageously doubled by a hard-axis current, $I_{LWS}$ or $I_{WWL}$, flowing under and over MJJs, according to one or more embodiments of the invention. FIG. 6B thus visualizes the "field doubling" embodiment directed to improving hard-axis selectivity for the phase-based-torque memory cell, which has been previously described with respect to FIG. 2B. The memory cell write group 650 includes a plurality of MJJs 612, a write select circuit 652, a plurality of write-bit lines WBLs, and a corresponding local write select line LWSL.

The write current $I_{LWS}$ (actually, cooper pairs of $I_{LWS}$) flowing within the local write select line LWSL emerges from the write select circuit 652, traverses under (or over) the plurality of MJJs 612 on a first metal layer, then at the right-most point of the LWSL passes through vias (which may be formed, in part, by other metal levels), and returns to the write select circuit 652 passing over (or under) the plurality of MJJs 612 on a second metal level, the second metal level being different from the first metal level. Write-bit lines WBLs are preferentially disposed at a distance from the MJJs 612 (e.g., between adjacent MJJs 612) where they are incorporated in the read memory cell circuit (e.g., 207 of FIG. 2B) for phase-based-torque memory cells, as previously explained with respect to FIG. 2B.

It should be noted that the memory cell write group 650 may also be a symbolic representation of a word write circuit that drives a write-word line WWL having write-word current $I_{WW}$ flowing within it, and generates the hard-axis field. To have a memory cell write group, as defined herein, there are at least two memory cell write groups per row.

An alternative to the physical structure disclosed, according to another illustrative embodiment of the invention, is that two write select circuits disposed at the left and right sides of the MJJs can concurrently source currents through metal layers over and under the MJJs 612 (generating hard-axis fields) that would return to the write select circuit 652 through a superconducting ground plane.

With reference again to the exemplary write region 600 shown in FIG. 6A, in one or more embodiments all memory cells along a given row or M-row stack (where M is an integer) within a selected memory cell write group 604 are written. However, with additional input from at least one column write control flow (not explicitly shown, but implied), the write select control flow 606 could be used in combination with column write select control flow to write only a subset of the JMRAM memory cells 612 contained exclusively within the plurality of selected memory cell write groups 604 along the same row of such memory cell write groups 604 (by ANDing the control flows as previously discussed). Considering this option in light of room-temperature MRAMs, where it is necessary to limit power consumption (practically speaking), it is not required, in a preferred embodiment, to limit the total applied write bit current to $N \times I_{WB}$ across an entire row (wherein N is the total number of memory cells in the row of memory cell write groups 604).

Figure 8A:
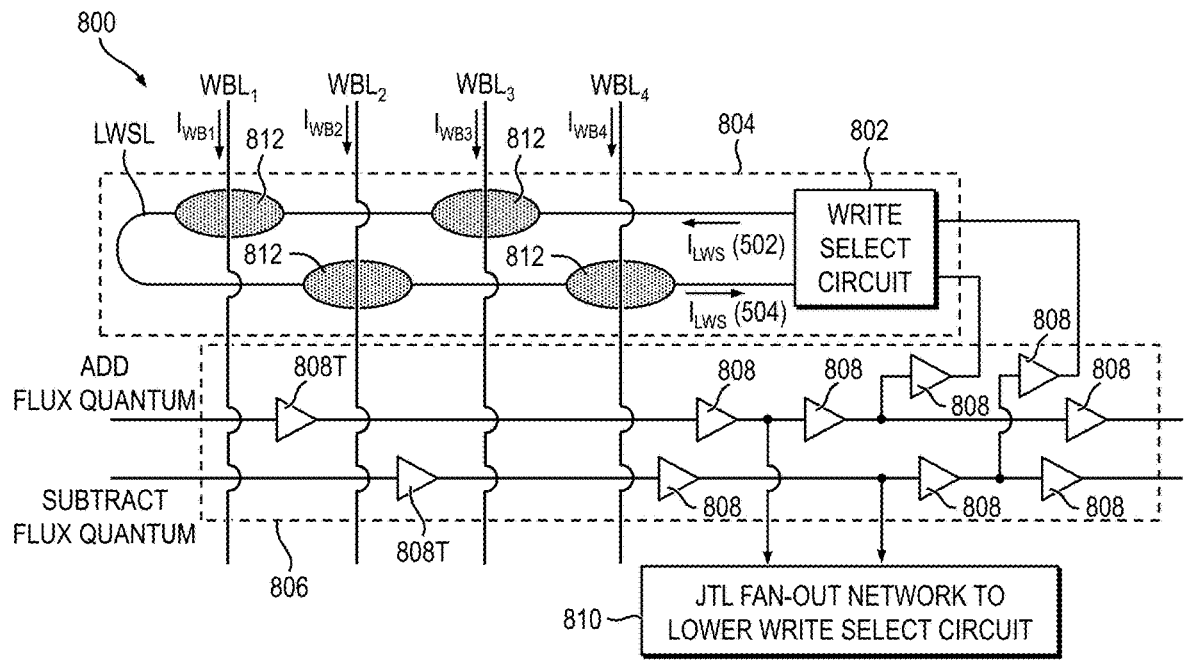
FIG. 8A is a schematic diagram depicting at least a portion of an exemplary memory array architecture comprising a memory cell write group and a write select control flow, which emphasizes (i) a write operation and (ii) a local write select line that can run back and forth across rows of stacked memory cells within the memory cell write group, according to one or more embodiments of the present invention.
Figure 8B:
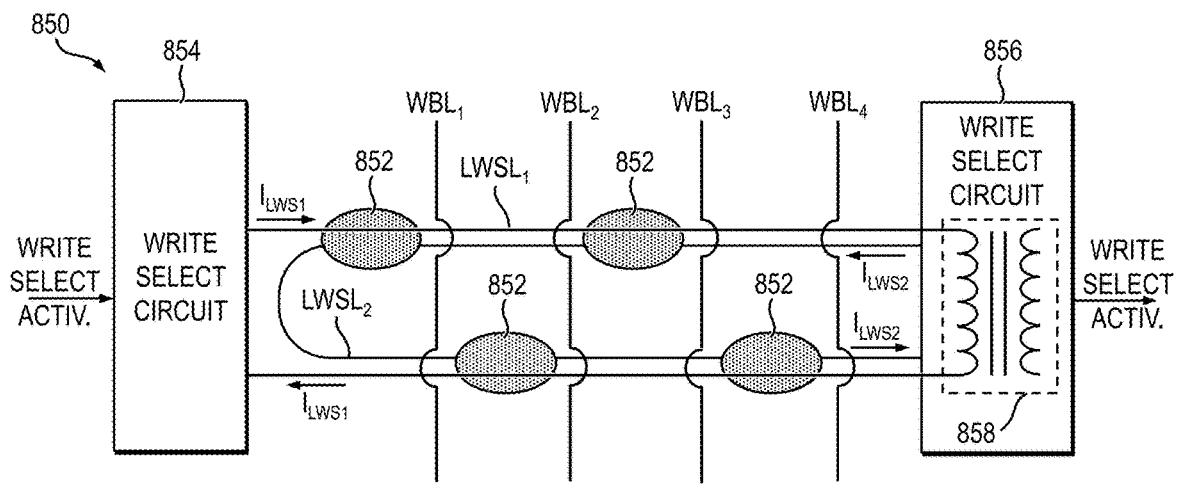
FIG. 8B is a schematic diagram that depicts exemplary details associated with a single memory cell write group, wherein a hard-axis magnetic field is advantageously doubled by hard-axis current flowing over and under the magnetic Josephson junctions, according to one or more embodiments of the present invention.
Figure 9:
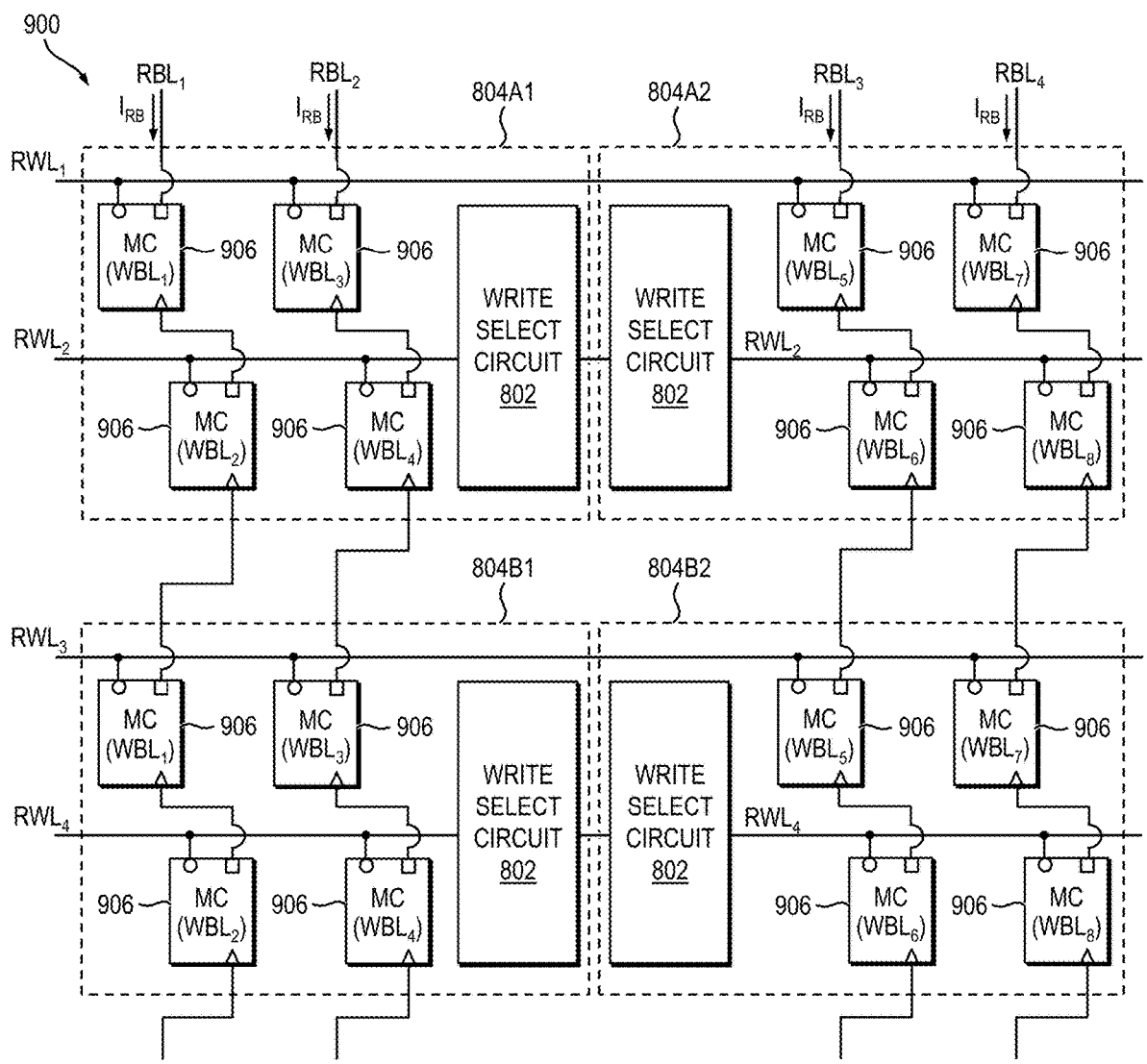
FIG. 9 is a schematic diagram that depicts at least a portion of an exemplary memory array architecture, including a plurality of memory cell write groups, which emphasizes (i) a read operation, and (ii) an inclusion of stacked memory cells in different rows having different write bit lines (as depicted in FIG. 8A) within the same read bit lines, according to one or more embodiments of the present invention.

FIG. 8A is a schematic diagram, which is indicative of physical placements of MJJs, depicting at least a portion of a write region (actually, also primarily a memory cell write group) 800 of a memory array, detailing a memory cell write group 804, according to one or more embodiments of the invention. Similarly, FIG. 9 is a schematic diagram depicting at least a portion of the memory array, detailing a connection and operation of the memory cell write groups 804 during a read operation, according to one or more embodiments of the invention. The memory cell write group 804 is preferably formed consistent with the memory cell write group 604 illustrated in FIGS. 6A and 7. Specifically, with reference to FIG. 8A, the memory cell write group 804 includes a write select circuit 802, a local write select line LWSL, write bit lines (e.g., WBL$_1$, WBL$_2$, WBL$_3$, and WBL$_4$) and a plurality of JMRAM memory cells, having MJJs 812. During a write operation, the local write select line LWSL channels/couples hard-axis magnetic fields, generated by the local write select current $I_{LWS}$ as it flows through the local write select line LWSL to the MJJs 812.

As defined herein, and as a result of the unique architecture of this illustrative embodiment, all MJJs 812 of the respective JMRAM memory cells in a selected memory cell write group 804 receive hard-axis fields generated by local write select current $I_{LWS}$ flowing within the local write select line LWSL. These MJJs 812 will also receive independent easy-axis fields generated by independent write bit currents IWB1, IWB2, IWB3, and IWB4 flowing within corresponding write bit lines WBL1, WBL2, WBL3, and WBL4, respectively.

A potential advantage of this embodiment is that MJJs 812 can be elongated and widened (increased in size) so that, for the same magnetic layer thicknesses of the "soft" ferromagnetic layer (e.g., layer 224 in FIG. 2A), the MJJs are more thermally stable. Or preferentially, the ferromagnetic layer thickness can be reduced to reduce the coercivity of the MJJs 812. A reduction in the coercivity of the MJJs 812 means lower currents—local write select current $I_{LWS}$ (or write word current $I_{WW}$) and write bit currents $I_{WB}$—are required.

Briefly, the magnetic coupling (i.e., flux) of the hard-axis and easy-axis flux into an MJJ 812 can be increased while MJJ magnetic mass is reduced (i.e., coercivity) because the local write select line LWSL (or write word line WWL) runs along the x-axis of a longer ellipse. Such expansions in size can be made because the ends of neighboring MJJs 812 are spread apart further and on a diagonal than in other physical designs. The neighbor-to-neighbor magnetic interaction is thus reduced.

The above observations concerning the MJJ switching properties may be true but must be considered in light of the known switching characteristics of miniature magnets and their single- or multi-magnetic domain properties. Physically larger, multi-domain MJJs do not have reliable switching characteristics that are required by JMRAM. The size at or below which an MJJ transitions from multi-domain to single-domain magnet is crucial in determining how large MJJs can be made. However, even if the size of the MJJs can't be increased, their field interaction, due to their domain orientations along their easy-axis, is advantageously decreased.

With reference to the illustrative embodiment shown in FIGS. 8A and 9, at least two independent memory cells 812, 906, each with its own dedicated write bit line (e.g., WBL$_1$ and WBL$_3$), share a common read bit line RBL (e.g., RBL in FIG. 9), which beneficially minimizes JMRAM memory cell area and reduces overhead wiring congestion, among other advantages.

FIGS. 8A and 9, viewed in conjunction with one another, depict a region of the memory within an array of said regions that includes memory cells, preferably MJJs 812 (MJJ 212 top-plan view in FIG. 2A), read circuitry of a JMRAM memory cell, which is represented by memory cell read circuits (MC) 906, and write select circuits 802, according to one or more embodiments of the present invention. As previously stated in conjunction with FIGS. 2A and 3, each of the memory cell read circuits 906 includes at least two ports, and may therefore be referred to as a "dual-ported superconducting memory cell." FIG. 8A also depicts transmission circuits (comprising JTLs in this illustrative embodiment) that support an exemplary write select control flow 806. FIG. 9 omits the write select control flow for clarity purposes, and because it can be made integral with the memory cell write groups themselves, as will be discussed with respect to FIGS. 8B and 13. As will become apparent to those skilled in the art, FIGS. 8A and 9 depict how read ports of individual memory cells in a subset of the memory cells in a write-selected set can be operably connected in series to achieve a more compact layout, in accordance with one or more embodiments of the invention.

Wherever required, depending on the type of memory cells employed, etc., the region of memory also includes write control lines/conductors and integrated support repeaters (e.g., comprising JTLs and/or PTL drivers and receivers), together defined as a write select control flow 806. FIG. 8A depicts the illustrative write region (actually, also primarily a memory cell write group) 800 of the memory array for the purpose of defining the circuit topology and physical locations (proximate horizontal or vertical) of the write circuit functionality. Thus, in one or more embodiments, the write region 800 comprises the write select circuit 802, interconnect fabric (e.g., LWSL, WBLs, etc.), the write select control flow 806, and at least a subset of MJJs 812 in the memory array.

FIG. 8B is a schematic diagram depicting details associated with at least a portion of a single exemplary memory cell write group 850, wherein a hard-axis magnetic field is advantageously doubled by hard-axis current flowing over and under the memory cells, according to one or more embodiments of the invention. The memory cell write group 850, which is suitable for use with phase-based-torque MJJ memory cells 852, is configured to double the hard-axis magnetic fields applied to all the memory cells in the group. More particularly, with reference to FIG. 8B, the memory cell write group 850 includes a plurality of MJJs 852, at least two write select circuits 854 and 856, a first local write select line $LWSL_1$ connected to a first write select circuit 854, a second local write select line $LWSL_2$ connected to a second write select circuit 856, wherein the local write select lines are each preferably disposed on independent superconducting layers proximate to the MJJs (e.g., on layers immediately over or under the MJJs and with each trace running along a major axis of the MJJ ellipse). In addition to the doubling of the magnetic field that was first described with respect to the phase-base-torque memory cell 250 of FIG. 2B, the memory cell write group 850, in one or more embodiments, is configured to propagate a write select activation signal (WRITE SELECT ACTIV.) from the first write select circuit 854 to the second write select circuit 856, which can be subsequently used to trigger a downstream memory cell write group in a given row of memory cell write groups, as will be explained in further detail and generalized with respect to FIG. 13.

The communication of the write select signal from the first write select circuit 854 to the second write select circuit 856 is enabled by a transformer 858 embedded in the second write select circuit 856, in one or more embodiments. The primary winding of the transformer 858 is connected to the first local write select line $LWSL_1$. Changes in voltage (i.e., AC voltage) are driven across the winding of the transformer 858 by addition of flux quanta (i.e., superconducting signal (s)) into its corresponding superconducting loop for the purpose of writing the MJJs 852. Changes in voltage and current in the first winding induces a corresponding current in the second winding of the transformer 858, which then can be detected and propagated as a write select activation signal.

In FIG. 8B, when triggered itself (e.g., by a supplied write select activation signal), write select circuit 854 triggers the activation of write select circuit 856. Having received and generated write select activation signals (the first being an input external to the memory cell write group 850, the second being internal within the memory cell write group), both write select circuits 854 and 856 are configured to drive local write select currents $I_{LWS1}$ and $I_{LWS2}$ through their corresponding local write select lines $LWSL_1$ and $LWSL_2$, respectively. The currents generate the doubled hard-axis fields imposed on the MJJs 852.

Just as is the case for the write region 800 (actually, also primarily a memory cell write group) of FIG. 8A, the memory cell write group 850 of FIG. 8B can be exploited in conjunction with the read-partial-write region 900 of FIG. 9. FIGS. 8B and 9, viewed in conjunction with one another, depict a region of the memory within an array of said regions that includes memory cells, preferably MJJs 852 (MJJ 212 top-plan view in FIG. 2A), read circuitry of a JMRAM memory cell, which is represented by memory cell read circuits (MC) 906, and write select circuits 856 (noting that, within FIG. 9, the second write circuit is missing for the memory cell write groups, e.g. 804A1 of FIG. 9), according to one or more embodiments of the present invention. Memory cell write group 850 transmits a write select activation signal (WRITE SELECT ACTIV.) both internally between/among write select circuits 856, within the memory cell write group 850 itself, and to subsequent memory cell write groups 850 in a row (or stacked row). FIG. 9 omits the write select control flow for this reason. Internally propagating write select activation signals will be generalized in FIG. 13.

FIG. 9 depicts a read-partial-write region 900 of a memory array for the purpose of defining the circuit topology and preferable physical locations (preferred horizontal or vertical locations defined both in both FIG. 9 and FIG. 8A) that enables the memory cells of the read-partial-write region 900 to be compact (i.e., area efficient) in comparison to memory cells of conventional memory arrays. The read circuit of the read-partial-write region 900 comprises a plurality of memory cell read circuits (MC) 906 that are intended to conceptualize an arrangement of the JMRAM memory cells and their connection to read interconnect fabric in the memory array, the read fabric comprising read word lines RWLs and read bit lines RBLs. As best shown in FIG. 2A, JMRAM memory cells 200 (i.e., memory cell 10, a general memory cell, or memory cell 350, a specific memory cell), which are intentionally divided across the common write regions 800 (actually, also primarily a memory cell write group) and the read-partial-write regions 900, as shown in FIGS. 8A and 9, respectively, are formed from combinations of MJJs 812 and memory cell read circuits 906 (which are included to represent the memory cell schematics). Each of the memory cell read circuits 906 is preferably consistent with the illustrative memory cell read circuit 206 shown in FIG. 2A.

At least one important characteristic of the read-partial-write region 900, according to one or more embodiments, is that the read-data output ports of at least two memory cells (i.e., the read bit lines RBLs of the individual memory cells) having different write-data input ports (i.e., the write bit lines WBLs) are connected in series to reduce the RBLs of the stacked memory cells, each spanning a column, by at least a factor of two. Such a topological change beneficially enables write bit lines WBLs with minimal inductance per memory cell, which is important to achieving high write bit currents $I_{WB}$. Memory cell layouts with vastly different aspect ratios and MJJ field isolations (from one another) can be derived using this topological circuit structure and are contemplated by embodiments of the invention, as will become apparent to those skilled in the art given the teachings herein.

In the memory cell write groups 804 of FIG. 8A, and similarly memory cell write groups 804A1, 804A2, 804B1 and 804B2 of FIG. 9, each preferably includes at least two JMRAM memory cells (MJJs 812 plus memory cell read circuits 906), a local write select line LWSL, and a write select circuit 802, wherein the memory cell write groups connect into the overall mesh of the memory array via at least two read word lines RWLs (e.g., $RWL_1$ and $RWL_2$ depicted in FIG. 9), at least one read bit line RBL (e.g., $RBL_1$ and $RBL_2$ in FIG. 9), at least two write bit lines WBLs (e.g., of $WBL_1$, $WBL_2$, $WBL_3$, and $WBL_4$ shown in FIG. 8A). Furthermore, in order to satisfy the definition of a memory cell write group 804 as intended herein, it is assumed that there are at least two such memory cell write groups 804, of which the aforementioned is one, both connected by at least one common read word line RWL. For example, $RWL_1$ connects directly to memory cell write groups 804A1 and 804A2. More specifically, $RWL_1$ connects to the memory cells 906 of memory cell write groups 804A1 and 804A2 that have odd write bit lines (i.e., $WBL_1$, $WBL_3$, $WBL_5$, and $WBL_7$).

The write select control flow 806 (FIG. 8A) can be used to enable the write select circuits to source the local write select current $I_{LWS}$ to the to the local write select line LWSL at the start of a write cycle, and can be used to halt the current flow at the end of a write cycle. In addition, it should be noted that one or more control signals within the write select control flow 806 could be shared among proximate memory cell write groups 804, as will be discussed in more detail herein below.

With continued reference to FIGS. 8A and 9, it should be noted that, in one or more embodiments, each read word line RWL preferably connects to at least one JMRAM memory cell in at least two different memory cell write groups (e.g., 804A1 and 804A2 or 804B1 and 804B2) disposed along a row (horizontal axis), and that there are at least two rows of memory cells in each of the memory cell write groups in a memory cell region 800, 900. In addition to the explicit connections, AC power wires/conductors (e.g., emanating from a resonant clock network, etc.) and DC bias current adjustment wires are implied connections that pass through the write select circuits 802 and the circuits associated with the write select control flow 806. These wires induce currents within the circuits 802, 806 primarily for the generation of a local write select current $I_{LWS}$ and for the propagation of write select control signals, respectively.

As the labels "ADD FLUX QUANTUM" and "SUBTRACT FLUX QUANTUM" indicate in FIG. 8A, write select control signals supplied to the memory cell region 800 and conveyed by the write select control flow 806 may, for example, trigger the write select circuit 802 to add or to subtract, respectively, one flux quantum (or more) each cycle (e.g., an RQL cycle having 4 phases) to the superconducting loop, which includes the local write select line LWSL and a portion of the write select circuit 802 (and potentially a superconducting ground plane within the write select circuit 802). The write select control signals conveyed by the write select control flow 806 may, in another example, trigger the write select circuit 802 to release its entire stored flux quanta into the superconducting loop, which is again formed with the local write select line LWSL and a portion of the write select circuit 802. In yet another example, the write select control signals may trigger a reset latch in the portion of the write select circuit 802 to cease the current flow through the superconducting loop that includes the local write select line LWSL.

As will become apparent to those skilled in the art given the teachings herein, the foregoing description of the write operation with respect to FIG. 6 is essentially identical, in one or more embodiments, to the write operation used for the exemplary memory write region 800 shown in FIG. 8A, and therefore the write operation of the write region 800 will not be described in further detail herein. Thus, only the write select control flow 806 and an exemplary write select circuit 802, not previously described in conjunction with FIG. 6, will be discussed in further detail.

The write select control flow 806 illustrated in FIG. 8A comprises either JTLs, shown symbolically as 808 and 808T in FIG. 8A, or Josephson transmission lines JTLs and PTLs (not explicitly shown, but implied); a JTL dedicated to signal transport are indicated by reference numeral 808T. These "transport" JTLs 808T are preferably stretched to be as long and thin as possible in order to reduce their area overhead and to advance signals conveyed by the JTLs as far as possible along a particular direction within a memory cell region ((i) for row write select control flows of FIG. 8A along the x-axis, and (ii) for column write select control flows, not explicitly depicted, along the y-axis). The other JTLs 808 drive a fan-out load of two JTLs (e.g., 808/808, or $808_T/808_T$, or $808_T/808$), in one or more embodiments, or are presumed to drive the inputs of a circuit (e.g., write select circuit 802, in this example) that are similar to a reciprocal quantum logic (RQL) gate, which require JTLs 808 in front of their inputs. A JTL fan-out network 810 is optionally included in the memory write region 800 and is configured to support a downstream (e.g., lower) write select circuit (not explicitly shown, but implied).

It is important to emphasize that all JTLs can propagate control signals and/or select signals, in one or more embodiments. In FIG. 8A, two signals, "Add Flux Quantum" and "Subtract Flux Quantum," are propagated along the row. It is further contemplated, in one or more embodiments, that at least a subset of the control signals may flow in the column direction proximate to the write select circuits 802 for the decoding of sub-atomic write operations directed to a subset of memory cells in a row that are associated with (write cycle specific) selected memory cell write groups. In this instance, an AND function (not explicitly shown, but implied) to activate a subset of memory cell write groups in a row would be performed at an intersection of write select control flows 806 and column select control flows (which could advantageously be integrated proximate to the write select circuits, all of which require an AC-energy source such as a resonant clock), as will be understood by those skilled in the art given the teachings herein. The term "sub-atomic" write is more clearly defined with respect to FIG. 10.

With reference again to FIG. 9, there are unique connections of the JMRAM memory cells to read bit lines (e.g., $RBL_1$, $RBL_2$, $RBL_3$, and $RBL_4$) in conjunction with the coupling of the memory cells to the write bit lines (e.g., $WBL_1$ and $WBL_2$ in FIG. 8A) that are best conveyed by looking primarily at two of the memory cell read circuits 906 of the JMRAM memory cells, which are both in memory write select group 804A1. In this exemplary embodiment, a first JMRAM memory cell it assumed to have the following connections and couplings (associations): $RWL_1$, $RBL_1$, $WBL_1$, and LWSL of memory cell write group 804A1. Likewise, a second JMRAM memory cell is assumed to have the following connections and couplings (associations): $RWL_2$, $RBL_1$, $WBL_2$, and LWSL of memory cell write group 804A1.

During a write operation directed to memory cell write group 804A1, the first and second JMRAM memory cells must both be written concurrently because the local write select line LWSL is common to both of them. Their digital states can be independent of one another, however, since each memory cell has its own unique write bit line WBL that carries an independent write current $I_{WB}$ responsible for imparting the digital state into the respective JMRAM memory cells. However, to retrieve (i.e., read) the digital states from the just-written first and second JMRAM memory cells, the following two successive reads are made: (i) activating read word line $RWL_1$, thereby triggering a first read operation that retrieves the digital state from the first memory cell via the read bit current $I_{RB}$ traversing read bit line $RBL_1$; and (ii) activating read word line $RWL_2$, thereby triggering a second read operation that retrieves the digital state from the second memory cell again via the read bit current $I_{RB}$ traversing read bit line $RBL_1$.

Like most current sensing schemes, a presence or absence (i.e., less) of read bit current $I_{RB}$ indicates the digital state of the selected JMRAM memory cell. Incidentally, a prescribed delay time needs to be allotted between the first and second read operations to allow the read bit current $I_{RB}$ to recover to its steady state value (DC supercurrent value). During recovery (i.e., restoration), flux quanta (i.e., superconducting signals) are pumped into any read bit line where they were removed during a prior read operation of JMRAM memory cells containing MJJs in a positive π-state.

Based on the digital state of the memory cell being in a positive π-state, described previously as the first binary state (e.g., logic 1), the Josephson junctions (354, 356 of FIG. 3) would be triggered and driven into a voltage state. The Josephson junctions would thus block the $I_{RB}$ current flow, reducing the flux quanta within the superconducting loop that includes the read bit line RBL.

Figure 10:
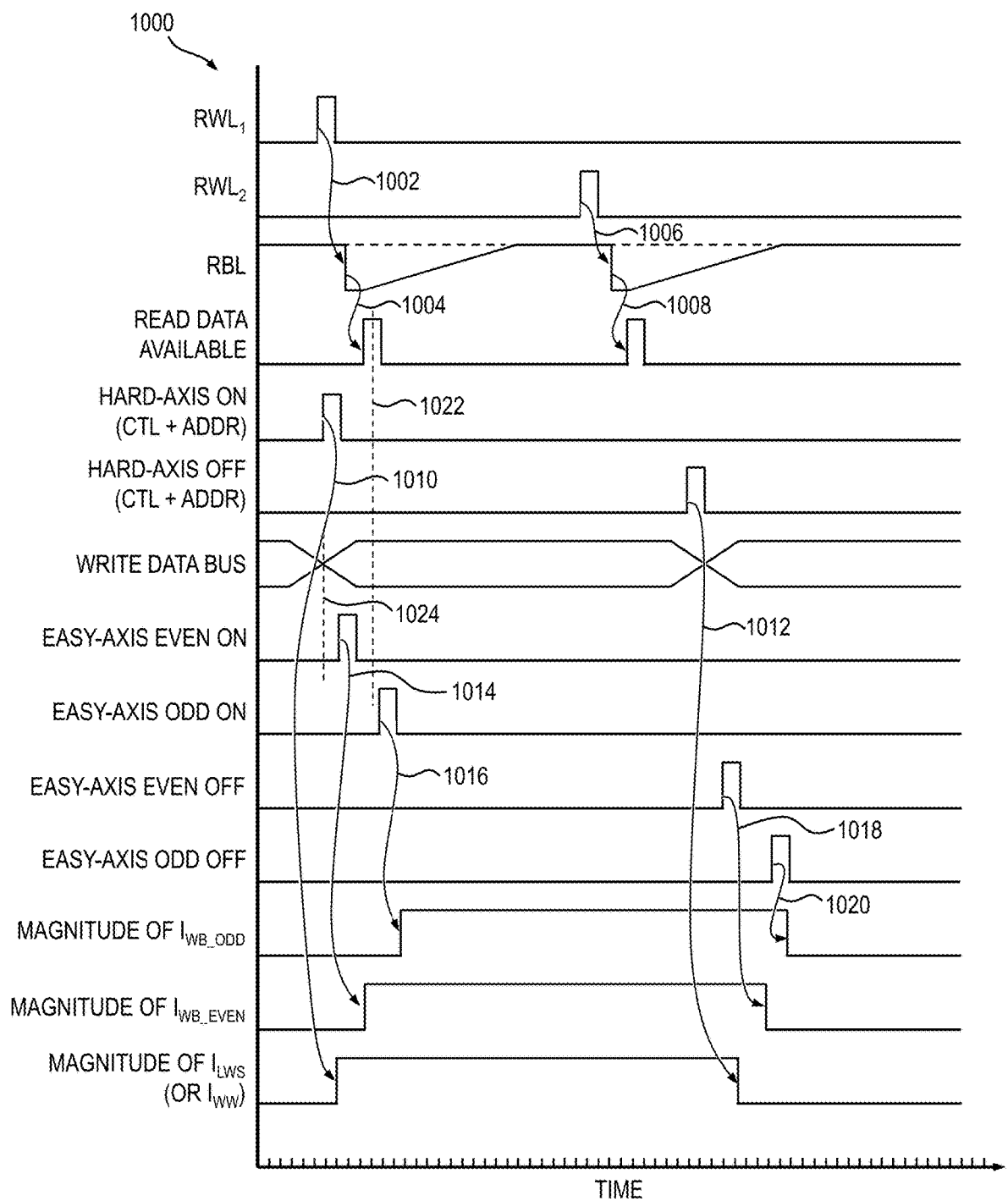
FIG. 10 is an exemplary timing diagram that illustrates various signals associated with read and write operations for memory array architectures exploiting the schematic topologies shown in FIGS. 8A, 8B and 9, according to one or more embodiments of the present invention.

FIG. 10 is an illustrative timing diagram 1000 conceptually depicting waveforms associated with at least a subset of signals used in various read and write operations of the exemplary memory cell region 800, 900 depicted in FIGS. 8 and 9, according to one or more embodiments of the invention. FIG. 10 may also be helpful in explaining certain read and write operations of a memory cell region (not shown but contemplated) that only has a word write circuit at one edge of its perimeter, but may otherwise require in general pipelined read, write, and read-modify-write operations wherein, in a column of memory cells, at least two memory cells that are (can be) write-selected concurrently have a common read bit line, but different read word lines and different write bit lines.

The depictions shown in FIG. 10 are intended to explain certain timing interactions occurring in the memory cell region, but are not meant to be limiting in any way; it is to be appreciated that the exemplary waveforms illustrated in the timing diagram 1000 are merely conceptual depictions, and may not necessarily represent accurate JMRAM signals. For example, magnitudes of signals $I_{WB\_Odd}$, $I_{WB\_Even}$, $I_{LWS}$, and $I_{WW}$, instead of exhibiting an abrupt vertical rise (i.e., having infinite slope), can ascend as staircase functions or descend as staircase functions, which indicate one or more flux quanta being added or removed from the superconducting loops supporting the currents each clock cycle (e.g., a resonant clock). The signals may also not necessarily persist for as long as they should appear to relative to other signals, given the long durations of magnetic field application required to reliably switch the domains of the soft magnetic layer. Likewise, control signals (e.g., Hard-Axis On (control plus word line address)) can be short single-cycle events (or can be applied over many cycles) that trigger each write operation depending on the exact configurations of the circuits local to arrays (e.g., latches). Such control signals are, to a degree, conceptual in nature and can be asserted through many alternative logic circuit means.

As shown in FIG. 10, time increments appearing on the time axis (i.e., x-axis) of the timing diagram 1000 delineate a full phase of a resonant clock (or half-phase of a resonant clock in a pipelined mode) in, for example, a deployment of embodiments of the present invention that utilize, at least in part, RQL circuits.

By way of example only and without limitation, as was explained in conjunction with the first and second JMRAM memory cells of the read-partial-write region 900 shown in FIG. 9, a sequence of (i) a first read operation, (ii) a read recovery operation, and (iii) a second read operation (in that order), is depicted in the timing diagram 1000. With reference to FIG. 10, a description of the sequence (i)-(iii) according to one or more embodiments follows. In the first read operation (i), an activation signal (pulse), which is sent through a first read word line (e.g., RWL₁ in FIG. 9), triggers the first read operation of all memory cells connected to the first read line (RWL₁). Upon being triggered, the selected JMRAM memory cells impart their respective states onto the corresponding read bit lines (e.g., RBL₁, RBL₂, RBL₃, RBL₄ of FIG. 9), as indicated by arrow 1002. The read bit lines then deliver the digital state imparted upon them, appearing as either a fallen solid line or as a dashed line that remains at the same level (e.g., high current level) in the RBL waveform, as a variation in current (flux), to a sense amplifier (not explicitly shown, but implied). The sense amplifier is configured to transform the states imparted onto the read bit lines into respective signals suitable for driving subsequent JTLs, PTLs and/or other logic gates that will carry the read data to wherever they will be consumed. Pointing to the rising edge of a Read Data Available signal, arrow 1004 indicates that such a transformation has occurred and thus that read data is available at a particular point in a pipeline and at a particular locality on a chip.

In a read recovery operation (ii), flux is restored to superconducting loops, if it was expended during the prior read operation, increasing the read bit current $I_{RB}$, as indicated by the linearly rising voltage (which should more accurately be represented as a staircase function) on the RBL waveform. Depending on the digital state of the data, these superconducting loops with less flux could include, at any specific time, none, some, or all of the read bit lines (e.g., RBL₁, RBL₂, RBL₃, RBL₄ shown in FIG. 9).

During the second read operation (iii), an activation signal (pulse), which is sent through read word line RWL₂, initiates the second read operation of all memory cells 906 connected to RWL₂ (see FIG. 9). Upon being triggered by this activation signal, the selected JMRAM memory cells impart their state onto the read bit lines RBL(s) (e.g., RBL₁, RBL₂, RBL₃, RBL₄ shown in FIG. 9) consistent with the operation during the first read cycle, as indicated by arrow 1006. The read bit lines then deliver the digital state imparted upon them, appearing as either a fallen solid line or as a dashed line that remains at the same signal level, as a variation in current (flux), to the sense amplifier. The sense amplifier is configured to transform the states imparted onto the read bit lines into respective signals suitable for driving subsequent JTLs, PTLs and/or other logic gates. Pointing to the Read Data Available pulse, arrow 1008 indicates that such a transformation has occurred and that data is available to be used elsewhere in the system.

For the purpose of this discussion, the back-to-back read operations (i) and (iii) described above are shown to occur as fast as is feasible, based on the noted read recovery requirements on the timing diagram 1000. The back-to-back read operations retrieve data written, over at least two memory read operations, from the JMRAM memory cells that are written during one prior write operation. In each "read column of memory cells," a write operation updated (wrote) digital states of at least two memory cells—i.e., at least two bits—concurrently that are each connected to the same read bit line RBL. The at least two bits written into the "read column of memory cells" are retrieved over at least two read operations.

In FIG. 9, the prior write operation writes at least twice as many bits as are retrieved during the first or second read operations. Given the requirement that all destabilized (i.e., selected) cells must receive write input, preferably in the form of a magnetic field or current, from a unique write bit line WBL and the structure/topology of the unique memory cell region 800, 900 of FIGS. 8A and 9, respectively, the write operation applies at least twice as much data as can be retrieved by a single read operation.

In accordance with embodiments of the invention, an "atomic" operation involves the same number of bits either written to or read from a memory array, restricted by what is needed to be written into the write-selected JMRAM memory cells of the array during a given write operation. The write operation thus defines the size of the atomic read operation. The exemplary timing diagram 1000 of FIG. 10 depicts an atomic read operation that has been previously described as back-to-back read operations. The back-to-back read is a pipelined read that involves two waves of data, in one or more embodiments.

By way of example only, retrieving the first wave of read data preferably adheres to the following timing sequence of actions delineated by waveforms and arrows in FIG. 10: rising edge of read word line $RWL_1$ to the "possible" falling edge of the read bit line RBL (arrow 1002), and finally to a rising edge of the Read Data Available signal (arrow 1004) corresponding to an availability of read data from the first wave. Retrieving the second, subsequent wave of read data conforms to the following timing sequence: first, the bit flux in the bit lines must be recovered from the first wave of data that possibly impacted the stored flux in the read bit lines RBL, shown as the slowly ascending recovery of the read bit line RBL to its original signal level. Next, once the recovery has completed (the flux quanta are restored), the rising edge of read word line $RWL_2$ triggers the second "possible" falling edge of read bit line RBL (arrow 1006). Finally, after the "possible" falling edge of the read bit line RBL, the rising edge of the Read Data Available signal (arrow 1008) corresponds to an availability of read data from the second wave. Collectively, the first wave of read data, read bit line RBL recovery, and second wave of read data correspond to an atomic read. As shown in FIG. 10, the RBL waveform can be in one of two different stable states (indicative of a logic-1 or a logic-0 state), represented as the solid line or the dashed line on the RBL waveform in FIG. 10, during the read operation, indicating the presence of both digital states in bits of the atomic data.

It is to be understood that in order to optimize the performance of a memory system, it is not necessary that the second wave read operation, corresponding to the rising edge of read word line $RWL_2$, begin immediately after the read bit line RBL has been restored. Such a situation might arise, for example, when the address bus controlling the activation of $RWL_2$ is temporarily occupied by a higher priority address directed to another memory array that involves a higher priority request than the address associated with $RWL_2$.

With continued reference to FIG. 10, an illustrative write operation will now be conceptually described, in accordance with one or more embodiments of the invention. A write operation preferably involves the following signals which shape the applied easy-axis and hard-axis magnetic fields, and are generated by a write bit even current, $I_{WB\_EVEN}$, and a hard-axis current, $I_{HARD\text{-}AXIS}$ (i.e., write-word current $I_{WW}$ or local write select current $I_{LWS}$): Hard-Axis On signal (the selected write word line, or local write select line, defined by ANDing write control with a decoded address), Easy-Axis Even On signal (Easy-Axis Odd On signal to be explained with respect to the read-modify-write operation), data present on the Write Data Bus, Hard-Axis Off signal, Easy-Axis Even Off signal (Easy-Axis Even Off signal to be explained with respect to the read-modify-write operation), and data present on the Write Data Bus.

The hard-axis magnetic field, which correlates to a magnitude of the local write select current $I_{LWS}$ or write-word current $I_{WW}$ (which generates the hard-axis magnetic field) shown in FIG. 10, is turned on by a rising edge of the Hard Axis On signal, as indicated by arrow 1010. Rather than being an abrupt transition from "off" to "on" as shown in the timing diagram 1000, the hard-axis magnetic field (as represented by the magnitude of $I_{LWS}$) can be an ascending stair-case function that increases with each resonant clock cycle, until it reaches a plateau, as a flux quantum is added. Flux quantum/quanta is/are preferably added to a complete superconducting loop that includes a write select circuit, or word write circuit, a local write select line LWSL, or write-word line WWL, respectively, and possibly superconducting ground.

Likewise, the rising edge of the Hard-Axis Off signal causes the flow of local write select current $I_{LWS}$ or write-word current $I_{WW}$, which generates the hard-axis magnetic field (as represented by the magnitude of $I_{LWS}$), to descend to zero, as indicated by arrow 1012. As in the case of the hard-axis field transitioning from "off" to "on," the magnitude of $I_{LWS}$ can transition from "on" to "off" by descending as a stair case function over each resonant clock cycle. Along with all the overlapping easy-axis fields (to be discussed later), the time in resonant clock cycles between Hard-Axis On and Hard-Axis Off pulses sets a duration of the write operation as magnetic fields applied to the MJJs of the JMRAM memory cells. A read operation cycle time can be made to be far shorter in duration than a write operation, which likely will likely occupy well more than about 5 nanoseconds (ns), accounting for an application of magnetic fields that are required to switch the magnetic domains in the soft ferromagnetic layer (i.e., free layer) and additionally for the recovery of flux in write circuits.

Concerning now the delivery of the digital state, the Easy-Axis Even On signal (or Easy-Axis Odd On signal) triggers the write bit circuits to induce write bit currents even $I_{WB\_EVEN}$ (or write bit currents odd $I_{WB\_ODD}$, respectively) to flow in the write bit lines, as indicated by arrow 1014 (or arrow 1016). As indicated by arrow 1018 (or arrow 1020), the Easy-Axis Even Off signal (or Easy-Axis Odd Off signal) causes the write bit circuits to halt the write bit currents even $I_{WB\_EVEN}$ (or write bit currents odd $I_{WB\_ODD}$), which were flowing in the write bit lines. Whether it be an even or odd data bit, each write bit current $I_{WB}$ has a positive or negative polarity driven by each bit of data present on the write data bus. Generated by $I_{WB}$, positive easy-axis fields can ascend from zero to their peak, plateau, and then descend from their peak to zero, during a write cycle, or vice versa for negative fields, to write data into a selected set of JMRAM memory cells.

As has already been discussed, in a reliable/viable memory, the vector sum of the magnetic fields on all selected cells should always lie outside the boundary of the switching astroid 500 shown in FIG. 5A (e.g., corresponding to point 520). That is, easy-axis and hard-axis magnetic fields are required to be large enough to write the MJJs. The easy-axis fields couple digital states that align with their easy-axis field directions after the fields have been removed. As has been discussed, the soft ferromagnetic layer (e.g., layer 224 in FIG. 2) can exhibit one of two possible dominant magnetic field orientations (arrow 229 in FIG. 2) in a standby state, when there are no applied write fields, that can align with either one of the positive or negative easy-axis magnetic field directions.

As has been previously explained with respect to pipelined (i.e., back-to-back) read operations, the timing diagram 1000 of FIG. 10 sheds light on functional details of a memory cell region (800 and 900 in FIGS. 8 and 9, respectively). So, too, can it shed light on a read-modify-write operation that is made necessary if less than atomic write operations are desired, which change the digital states of JMRAM memory cells associated with one read word line RWL (either odd or even write bit lines) instead of two. These less than atomic write operations involve updating only a subset (e.g., half) of the JMRAM memory cells, out of the total number of JMRAM memory cells selected for a given write operation, with new digital states.

The digital states of the other selected memory cells, which are not modified by the write operation, cannot be altered. Given that these other memory cells are selected, and thus are destabilized, their current state must be written back to them. This operation is similar to a typical write operation; only the write data (to be referred to as unmodified write data) is required to be the same as the data already contained in the memory cells. Thus, the unmodified write data must first be read from their JMRAM memory cells of the read-partial-write region 900 (also write region 800) so that their digital states can then be written back to the these same JMRAM memory cells of the write region 800 (also read-partial-write region 900), via propagating write bit currents $I_{WB}$ through the write bit lines WBL(s).

In one or more embodiments, substantially overlapped write operations (actually the application of easy-axis fields) are performed (i) to write the unmodified write data back to the selected set of memory cells that are to retain the unmodified data, and (ii) to write new digital states into the selected set of memory cells that require updates (the set of memory cells to which the sub atomic write operation is directed). Thus, once the read data corresponding to the JMRAM memory cells that will not be altered (i.e., those memory cells not part of the sub atomic write operation) are retrieved, the easy-axis magnetic fields corresponding to the read data can be applied to assure that when the memory cells are destabilized by a very high hard-axis field, they do not return to a standby state in a digital state opposite to what data was previously stored in those cells. The digital states of the memory cells remain unaltered because the unmodified write data had been written back into those cells.

By way of example only and without limitation, details of the sequencing of the easy-axis fields (associated with data) and hard-axis fields (associated with write address) will be discussed with respect to illustrative timing and control signals. More specifically, if an "even" sub-atomic write to the memory cells connected to a common local write select line (or write word line for both read word lines $RWL_1$ and $RWL_2$) and to read word line $RWL_2$, is directed only to those memory cells associated with $RWL_2$, the sub-atomic write operation can commence substantially in parallel with a necessary read operation associated with read word line RWL (an address). The necessary read operation prepares the unchanging/non-modified data to be written back to the memory cells, which are destabilized during the sub-atomic write operation, but don't get updated by the new data associated with the sub-atomic write operation. The portion of the write operation directed to the unchanging data must therefore use the data retrieved by the read operation.

The timing of the write operation for sub-atomic writes can be different than for normal writes. In one or more embodiments, an exemplary sub-atomic write sequence for signals represented on the timing diagram 1000 in FIG. 10 includes the following characteristics and/or actions:

[step 1: READ] A read operation can occur before activation of the hard-axis on signal as shown in timing diagram 1000. As indicated by arrow 1002, the rising edge of the read word line $RWL_1$ pulse triggers the JMRAM memory cell to impart its digital state onto the corresponding read bit line RBL, both logical states being indicated by dashed and solid lines, respectively.

A sense amplifier (not explicitly shown, but implied) detects these states, as a function of voltage or current levels developed on the read bit lines, and propagates them forward, for example, to logic circuits, JTLs or PTLs. The arrow 1004 indicates the circuit activity occurring from the descent of the read bit line RBL to the read data being available for sensing. The Read Data Available signal is defined with respect to wherever data might need to be resident in a larger memory system to perform a write-back in this case (or a half-atomic read or an atomic (pipelined) read). The latency between the descent of the read bit line RBL to the rising edge of the Read Data Available signal depends on the stages of circuits and segments of interconnect between the sense amplifier and where the data is required in the larger memory system. Reducing this latency thus involves minimizing the number of stages of circuits and/or minimizing lengths of the segments of interconnect.

Considering the unmodified data, the data retrieved via a read data bus can traverse a significant number of circuits and PTL links before arriving in a central location where it may be passed through ECC (error correction code) logic and then supplied to a Write Data Bus Odd to traverse back to the array where it writes the same array at the same address from which the read data was retrieved.

[step 2: Hard-Axis On] The Hard-Axis On signal represents an Array Write Address signal ANDed with an Array Write On control signal that, when combined, forms at least one signal propagated by the write select control flow (not explicitly shown in FIG. 10). The Hard-Axis On signal is preferably in the form of a pulse that triggers an application of the hard-axis magnetic field generated by the write-word current $I_{WW}$ or the local write select current $I_{LWS}$, as indicated by arrow 1010. The magnitude of the ascending-stair-case (not shown) word write or local write select current/field plateaus at maximum current. It is important to note that the direction of hard-axis current flow (a supercurrent) is always constant, either positive or negative with respect to individual MJJs, in a write-selected state.

[3: Easy-Axis Even On] Once the new sub-atomic write data is available (as indicated by a transition in the write data bus at time 1024 on the timing diagram 1000 (or in a write data odd register as will be discussed later), the Easy-Axis Even On signal, preferably in the form of a pulse, triggers the application of a positive or negative easy-axis magnetic field generated by the write bit current $I_{WB\_EVEN}$, as indicated by arrow 1014. Each easy-axis magnetic field has a positive or negative value, respectively, that is dependent on the digital state of each datum. As shown in FIG. 10, the new write data, indicated by the transition of the write data bus at time 1024, is available before the Easy-Axis Even On signal is active.

[4: Easy-Axis Odd On] The Read Data Available signal should be active (indicating that the unmodified write data is ready and available within a Write Data Bus Odd register where it can be launched into the Write Data Bus Odd) before the Easy-Axis Odd On signal can be triggered, as indicated by the dashed line at time 1022. As indicated by arrow 1016, the Easy-Axis Odd On signal, preferably in the form of a pulse, triggers the application of a positive or negative easy-axis magnetic field generated by the write bit current $I_{WB\_ODD}$, which has a positive or negative value, respectively, that is dependent on the digital state of each datum. The magnitude of the ascending-stair-case current/field plateaus at maximum current.

[5: Hard-Axis Off] The Hard-Axis Off signal represents an Array Write Address signal ANDed with an Array Write Off control signal which, when combined, forms at least one signal propagated by the write select control flow. The Hard-Axis Off signal triggers the removal of the hard-axis magnetic field by driving the write-word current $I_{WW}$ or the local write select current $I_{LWS}$ to zero, as indicated by arrow 1012. The magnitude of the descending-stair-case (not explicitly shown, but implied) current/field returns to zero current.

[6: Easy-Axis Even Off] The Easy-Axis Even Off signal, which may be in the form of a pulse, triggers the removal of the easy-axis field by driving the write bit current $I_{WB}$ Even to zero, as indicated by arrow 1018. The magnitude of the descending-stair-case current/field returns to zero current. It is contemplated that turning off the easy-axis field, which is well within the switching astroid, can be optional.

[7: Easy-Axis Odd Off] The Easy-Axis Odd Off signal, which is preferably in the form of a pulse, triggers the removal of the easy-axis field by driving the write bit current $I_{WB}$ Odd to zero, as indicated by arrow 1020. The magnitude of the descending-stair-case current/field returns to zero current. It is contemplated that turning off the easy-axis field, which is well within the switching astroid, can be optional.

Concerning the write operation in general, an important aspect, according to one or more embodiments, is that the word write circuit (or write select circuit) or the bit write circuit and their respective loads will typically, when selected, form a superconducting loop in which supercurrents can flow indefinitely, if not disturbed. There is an inherent latching mechanism embedded in these circuits with respect to the write operation. Once triggered, write circuits provide the necessary magnetic fields until driven to disrupt the propagation of the supercurrents at the close of the write operation. A requirement of the write operation is that a minimum overlap (corresponding, in part, to the write time) among easy-axis and hard-axis magnetic fields is achieved to assure reliable realignment of domains in the "soft" ferromagnetic layer (i.e., where the new datum is opposite the old datum stored in a memory cell).

The shape of the applied easy-axis fields and hard-axis field are governed by the write bit currents $I_{WB}$ ($I_{WB\_ODD}$ and $I_{WB\_EVEN}$) and by the local write select currents $I_{LWS}$ or the write-word current $I_{WW}$. As has been noted earlier, the rising and/or falling edges (i.e., transitions) of the currents can be designed to form ascending and/or descending staircases, respectively, or can be more abrupt as illustratively shown in FIG. 10. Other shapes of the current waveforms are also contemplated, according to embodiments of the invention, wherein more than one flux quanta (i.e., superconducting signals) are added to a loop. The engineering of the shape of the applied magnetic field is beyond the scope of the present invention, which is primarily directed to forming dense memory arrays and busses that coordinate the movement of data into, or out of, the arrays, and to writing and reading the memory cells reliably in the selected array.

A "native" write cycle can extend over a plurality of RQL pulses, such that the hard and easy axis fields are applied for longer duration compared to a write cycle in standard RQL (or rapid single flux quantum) memory architectures. That is, a native write cycle can be defined as the duration of fields that are required to write a memory cell. For example, a native write cycle in FIG. 10 may extend from time 1016 to 1020. A "native" read cycle can be defined in a similar manner as it pertains to a read operation of the memory cell(s).

To generate the write currents (e.g., $I_{WB}$, $I_{LWS}$, or/and $I_{WW}$), a number of write circuits to control, at least in part, the magnitudes and signs of the currents have been proposed. One example of such a write circuit is described in U.S. Pat. No. 10,122,351 to Naaman et al. ("Naaman"), which is incorporated by reference herein in its entirety. Naaman is directed to a superconducting bi-directional write circuit that enables bi-directional current flow in the write bit lines, which is required for all the MJJs of the memory cells (e.g., spin-valve MJJ), except "toggle"-based MJJs. For the superconducting bi-directional current driver described in Naaman, activation signals, which manage the directional flow of the current, can be provided as single flux quantum (SFQ) pulses or reciprocal quantum logic (RQL) pulses. This superconducting bi-directional driver circuit arrangement is best suited for write bit lines that traverse from bottom to top of the memory array and then return to the bottom again (or vice versa).

A subtle but important oversight of this conventional superconducting bi-directional current driver approach is that prior art directed to memory cell/array organization and the embodiments of the present invention (discussed previously with respect to FIGS. 6A through 9) do not show a memory configuration where such a localized circuit can be used. In conventional MJJ-based memories, the write bit line conductors extend outward from, but do not return to, the bit write circuit in all these designs/structures.

Figure 11:
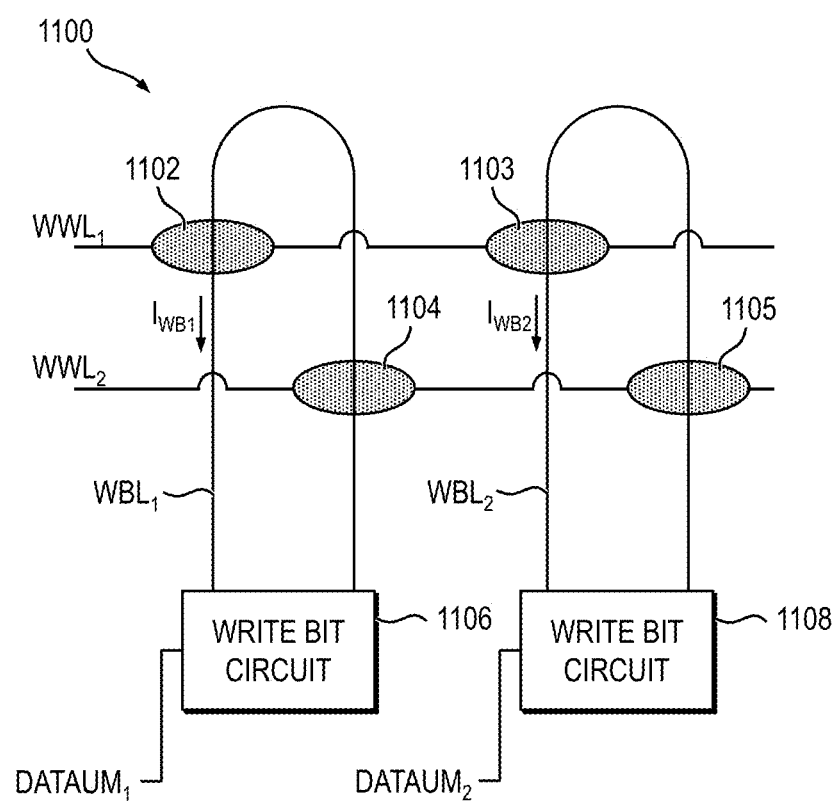
FIG. 11 is a schematic that depicts an exemplary write region having a wrap-around bit line arrangement, according to one or more embodiments of the present invention.
Figure 12:
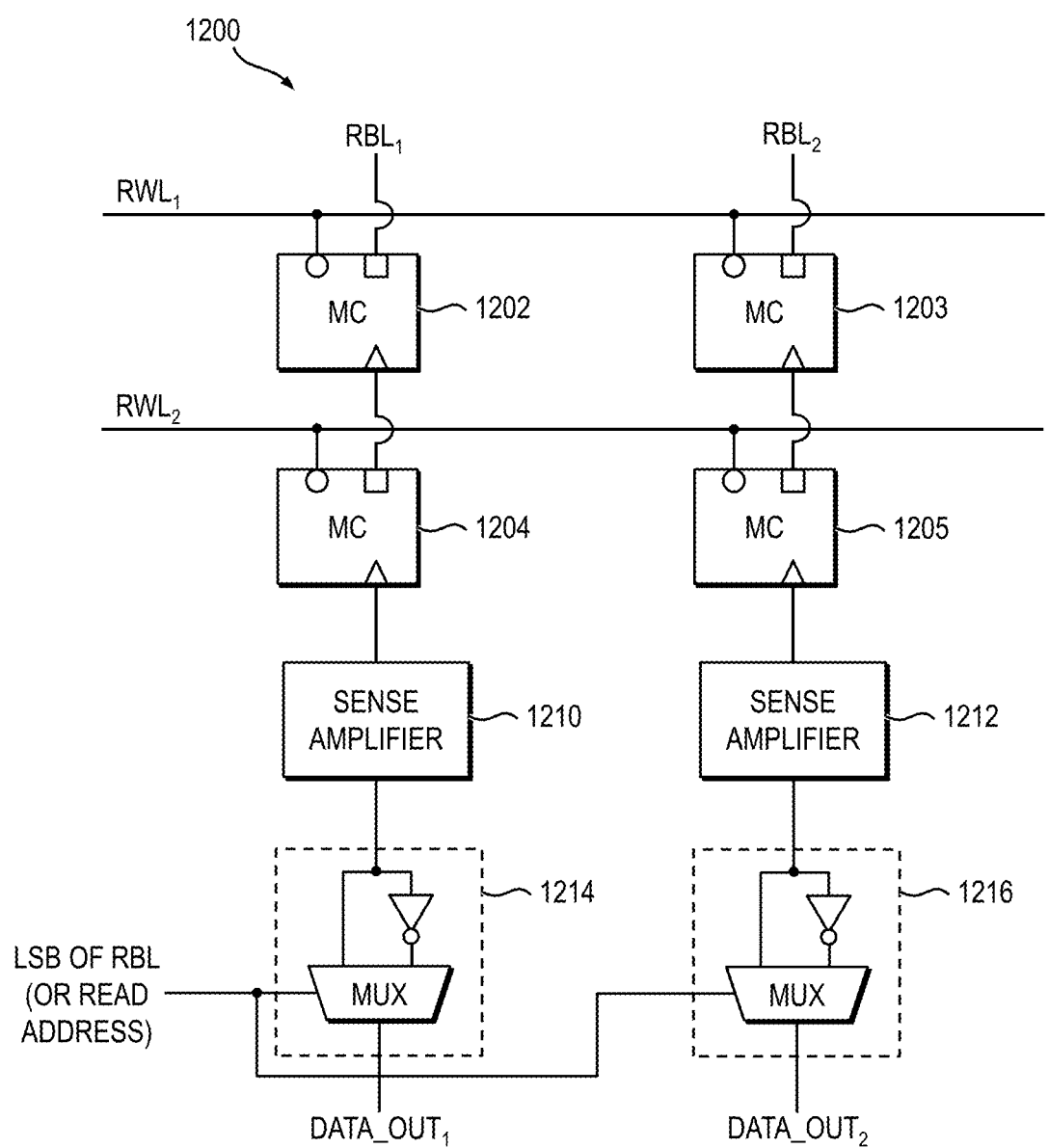
FIG. 12 is a schematic diagram that depicts at least a portion of an exemplary memory array architecture, including a plurality of memory cells, a plurality of sense amplifiers, and a plurality of logic gates for resolving data inversions within rows of memory cells, according to one or more embodiments of the present invention.

FIGS. 11 and 12 collectively depict a portion of an exemplary memory system that includes a plurality of memory cells (e.g., MJJ 1102 of FIG. 11) combined together with a memory cell read circuit (e.g., 1202 of FIG. 12), at least two write bit circuits (e.g., 1106, 1108 of FIG. 11), at least two sense amplifiers (e.g., 1210, 1212 of FIG. 12), and at least two data inversion circuits (e.g., 1214, 1216 of FIG. 12). More specifically, FIG. 11 is a schematic diagram depicting at least a portion of an exemplary write region 1100 having a wrap-around write bit line, according to one or more embodiments of the present invention. The wrap-around write bit lines cause data inversions within the memory cells. Driven during necessarily different write operations (to different write addresses, which correspond to activating $WWL_1$ or $WWL_2$), the digital state stored in MJJ 1102 (MJJ 1103) is inverted with respect to the digital state stored in MJJ 1104 (MJJ 1105) for the same input driven into the $DATUM_1$ ($DATUM_2$) input.

Likewise, FIG. 12 is a schematic diagram conceptually depicting at least a portion of an exemplary read region and output circuit path 1200 of a memory array, detailing an architecture for reading memory cells, including a plurality of memory cells, a plurality of sense amplifiers, and a plurality logic gates for resolving data inversions within rows of memory cells, according to one or more embodiments of the invention.

With reference again to FIG. 11, the write region 1100 of the memory array represents an alternative architecture for writing memory cells, according to one or more embodiments of the invention. The write region 1100 includes a first write-word line, $WWL_1$, which passes under MMJ cells 1102 and 1103 arranged in a first row, and a second write-word line, $WWL_2$, which passes under MMJ cells 1104 and 1105 arranged in a second row. The write region 1100 further includes a first write bit circuit 1106 and a second write bit circuit 1108. The first write bit circuit 1106 is coupled with a first write bit line, WBL$_1$, which passes over the MMJ cells 1104 and 1102, arranged in adjacent columns, before returning to the first write bit circuit. Similarly, the second write bit circuit 1108 is coupled with a second write bit line, WBL$_2$, which passes over the MMJ cells 1105 and 1103, arranged in adjacent columns, before returning to the second write bit circuit. Thus, each of the first and second write bit lines WBL$_1$ and WBL$_2$ forms a current loop for conveying first and second write bit currents, I$_{WB1}$ and I$_{WB2}$, respectively. In one or more other embodiments it is contemplated that a single write bit line could cross a plurality of columns, so long as each memory cell directly coupled to the write bit line has a unique write word line coupled to it. Furthermore, it is contemplated that, in one or more embodiments, both ends of a write bit line need not return to the same write bit circuit, but rather one end of the write bit lines may be connected to a terminator, a superconducting return line, ground, or no connection at all.

Each of the write bit circuits 1106 and 1108 includes a datum input, Datum$_1$ and Datum$_2$, respectively. Data to be written to the MJJ cells associated with the corresponding write bit circuits is supplied via the datum input.

As apparent from FIG. 11, the write bit current I$_{WB1}$ crosses a narrow portion of the ellipse representing MJJ 1102 from top to bottom. The opposite is true for MJJ 1104; that is, the write bit current I$_{WB1}$ crosses a narrow portion of the ellipse representing MJJ 1104 from bottom to top. The MJJ cells 1102-1105 are configured such that memory cells coupled along the same write bit line are each associated with a different write word line. For example, MJJ cells 1102 and 1104 are coupled along write bit line WBL$_1$ and are associated with write-word lines WWL$_1$ and WWL$_2$, respectively. Likewise, MJJ cells 1103 and 1105 are coupled along write-bit line WBL$_2$ and associated with write-word lines WWL and WWL$_2$, respectively. In this manner, the MJJ cells coupled along the same write bit line are individually selected by their unique corresponding write word lines. Also of significance is that the sign of the write bit line current changes for corresponding alternating odd and even read-word lines RWLs (and odd and even write-word lines WWLs) associated with the same write bit line, thereby causing the stored data in the memory cells to alternate in sign. In one or more embodiments, data inversions are handled by data inversion circuits (1214 and 1216), as will be discussed with respect to FIG. 12.

Although only four MJJ cells are shown, embodiments of the invention are not limited to any specific number of memory cells employed. Furthermore, it is to be appreciated that various other configurations of the memory cells are contemplated and are within the scope of the present invention, as will become apparent to those skilled in the art given the teachings herein.

Referring now to FIG. 12, the read region and output circuit path 1200 includes a plurality of MJJ memory cells having respective memory cell read circuits (MCs) 1202, 1203, 1204 and 1205 connected to corresponding MJJs (e.g., MJJs 1102, 1103, 1104, and 1105 shown in FIG. 11), each of which may be formed in a manner consistent with the JMRAM memory cell 200 of FIG. 2A. In this exemplary embodiment, the JMRAM memory cells are arranged such that cells associated with a common write bit line WBL are all coupled in series to a common read bit line RBL according to their physical location. For example, memory cell read circuits 1202 and 1204 associated with read bit line RBL$_1$ are coupled such that RBL$_1$ is connected to an input node of memory cell read circuit 1202, an output node of memory cell read circuit 1202 is connected to an input node of memory cell read circuit 1204, and an output node of memory cell read circuit 1204 is connected to a corresponding sense amplifier 1210. Likewise, memory cell read circuits 1203 and 1205 associated with read bit line RBL$_2$ are coupled such that RBL$_2$ is connected to an input node of memory cell read circuit 1203, an output node of memory cell read circuit 1203 is connected to an input node of memory cell read circuit 1205, and an output node of memory cell read circuit 1205 is connected to a corresponding sense amplifier 1212.

It should be noted that a slight variation in the circuitry of FIG. 11, for example, an arrangement in which the write bit lines WBLs are isolated from the MJJs, to reduce spurious coupling into the MJJs, would render the write region 1100 suitable for use with JMRAM memory cells (e.g., 250 of FIG. 2B)—the spin-based-torque memory cells—in place of a "spin-valve" type MJJ memory cell.

An output of each of the sense amplifiers 1210, 1212 is preferably connected to a corresponding data inversion circuit 1214, 1216 configured to selectively invert a data output generated by the inversion circuit, since data stored in alternating odd even word lines are inverted with respect to one another; a result of the unique architecture according to one or more embodiments of the invention. As previously discussed, the reversal of the sign of the write-bit current (e.g., I$_{WB1}$) across the MJJs occurs because of the unique arrangement in which the write-bit current flows from bottom to top, turns around, and flows from top to bottom (or vice versa) across two sets of separately selectable MJJs (e.g., MJJs 1102, 1103 or MJJs 1104, 1105 shown in FIG. 11).

More particularly, with continued reference to FIG. 12, the output of sense amplifier 1210 is operably supplied to an input of a first data inversion circuit 1214. The first data inversion circuit 1214 is adapted to receive the data output from the sense amplifier 1210 and to generate a data output signal, DATA_OUT$_1$, that is either of the same logical state as the sense amplifier output data or a logical inversion of the sense amplifier 1210 output data as a function of a control signal, which may be a least significant bit (LSB) of the read bit line or read address, in one or more embodiments. Similarly, the output of sense amplifier 1212 is supplied to an input of a second data inversion circuit 1216. The second data inversion circuit 1216 is adapted to receive the data output from the sense amplifier 1212 and to generate a data output signal, DATA_OUT$_2$, that is either of the same logical state as the sense amplifier 1212 output data or a logical inversion of the sense amplifier output data as a function of a control signal, which in this illustrative embodiment is the LSB of the read bit line or read address.

In one or more embodiments, each of the data inversion circuits 1214, 1216 comprises a 2-1 multiplexer (MUX) having a first input operably coupled with an output of a corresponding sense amplifier and a second input that is operably coupled to an inverted output of the sense amplifier, the inverted output of the sense amplifier being generated by passing the sense amplifier output signal through an inverter. Thus, across different read operations, the multiplexer in the data inversion circuit receives both a non-inverted and an inverted version of the data output from the corresponding sense amplifier. An output of the multiplexer forms the data output line (e.g., DATA_OUT$_1$ or DATA_OUT$_2$) of the corresponding read bit line (e.g., WBL$_1$ or WBL$_2$). The LSB of the read bit line (or read address) is supplied to a control input of the multiplexer for selectively inverting the output of the sense amplifiers 1210 and 1212 so that all data output lines (e.g., DATA_OUT$_1$ or DATA_OUT$_2$) consistently deliver data in their "true" (i.e., not "complement") format. The data inversion circuits 1214, 1216 can be integrated anywhere on the chip or multichip structure, such as, for example, proximate to the corresponding sense amplifier or integrated into receivers proximate to where a data read request signal originates.

FIG. 13 is a schematic diagram depict at least a portion of an exemplary write select system 1300 for memory cell write groups 1302, according to one or more embodiments of the invention. The write select system 1300 preferably initiates at least the flow of the local write select current $I_{LWS}$ across an entire row of memory cell write groups, the exception being a first memory cell write group (F-MCWG) 1304, which is adapted to receive a write row line stimulus signal, WRL.

The write select system 1300 includes a plurality of memory cell write groups 1302, wherein a local write select line LWSL of a "driver" memory cell write group enters into a first port of a "receiver" memory cell write group, which can be an adjacent next stage in the chain (i.e., sequence or series) of memory cell write groups 1302. Each of the memory cell write groups 1302 preferably includes a transformer (not labeled) for detecting the activation/flow of local write select current $I_{LWS}$. The transformer is formed in conjunction with at least one other superconductor (i.e., local write select line LWSL of the memory cell write group of the prior "driver" stage) that is connected to a first port of the "receiver," which passes through at least one transformer of the "receiver" and preferably (as shown) is connected from a second port of the "receiver" memory cell write group returning to the "driver" memory cell write group, arranged so, for the purpose of detecting the local write select current flow $I_{LWS}$ of each "driver" within the next stage "receiver" and then initiating $I_{LWS}$ flow in that "receiver" memory cell write group.

As shown in FIG. 13, the first memory cell write group 1304 can have a different input interface than the rest in the chain (sequence or series) of memory cell write groups since it is driven by what would be called address decoders or word line driver circuits. Moreover, the write select system 1300 can also end (and preferably does end) with a terminating stage 1306, labeled "T," that includes at least one transformer(s) (or other means) that mimics the additional inductive load of each input transformer(s) embedded in the corresponding local write select lines LWSLs of the memory cell write groups for all superconducting loops in the write select system 1300 that include the LWSLs. It should be noted that, in one or more embodiments, the local write select line LWSL of the "driver" memory cell write group can be connected to a superconducting ground within the "receiver" memory cell write group so it does not need to return to the "driver" memory cell write group as previously discussed.

As the local write select current $I_{LWS}$ starts flowing in the local write select line LWSL of the "driver" memory cell write group, magnetic induction triggers current flow within the detection transformer in the "receiver" memory cell write group. Such injected AC current can be summed with AC current sourced by a resonant clock in concert with a DC bias current to a Josephson junction. If the collective current exceeds a prescribed critical current, the Josephson junction transforms into a voltage state and emits a flux quantum, which can serve as a write select signal for the next adjacent memory cell write group 1302 in the sequence of memory cell write groups spanning a given row. The write select system 1300 is thus one embodiment of a circuit adapted for detecting an initiation of the hard-axis magnetic field in the "driver" memory cell write group.

Figure 14:
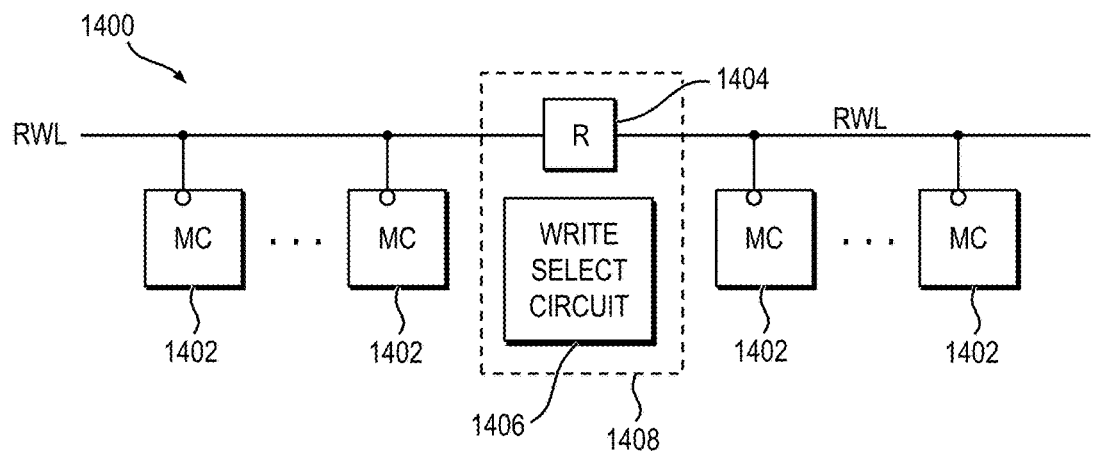
FIG. 14 is a schematic diagram that depicts at least a portion of an exemplary signal regenerating read word line system configured to regenerate flux quanta lost in the transmission of signals through its read word line physical segments (i.e., conductors or transmission lines) and to reduce a total inductive load on each read word/row circuit that drives each read word line physical segment forming a "functional" read word line, according to one or more embodiments of the present invention.

FIG. 14 is a schematic diagram that depicts at least a portion of an exemplary signal regenerating read word line system 1400 configured to regenerate flux quanta lost in transmission of signals through read word line physical segments (conductors or transmission lines), according to one or more embodiments of the invention. The read word line system 1400 can beneficially reduce a total inductive load on each read word/row circuit that drives each read word line physical segment forming a "functional" read word line, permitting it to be available for subsequent use more rapidly, according to one or more embodiments of the invention.

Specifically, in one or more embodiments the signal regenerating word line system 1400 is configured to regenerate flux quanta lost in the transmission of signals through transmission lines—read word line RWL physical segments—and can reduce the total inductive load on each read word/row circuit (first read word/row circuit not shown and at least one that is referred to as a read word line RWL repeater (abbreviated R) 1404) that drives the read word line physical segments forming a functional read word line.

Signals can potentially degrade as they travel down a conductor, primarily because AC movement of electrons can involve both resistive and superconducting carriers (i.e., cooper pairs). The resistive conduction paths consume energy and thus reduce the flux quanta. The illustrative signal regenerating word line (row) system 1400 includes JMRAM memory cells (MC) 1402 arranged in a row along with read word line repeaters (R) 1404 interspersed between read word line segments (just labeled "RWL," not "RWL segments," in FIG. 14). Where memory cell write groups are used, read repeaters 1404 dedicated to each read word line can preferably be inserted at proximate locations 1408 to write select circuits 1406. Such placement is advantageous for delivering AC power to active circuits such as the read word line repeater 1404. For each functional read word line RWL, the periodicity of repeater placement can occur at more frequent, equal, or at fewer intervals than the write select circuit in each row. It is to be appreciated that embodiments of the invention are not limited to the number and/or placement of read word line repeaters 1404 in the word line (row) system 1400.

It should be understood that JMRAM memory cells have been designed to be passive memory elements requiring no power to retain data and consuming no power except in the read operation (to a degree). Such memory cells have no transformers to receive AC power delivery from resonant clock fingers/conductors (which thus do not need to run through their layout).

Figure 15:
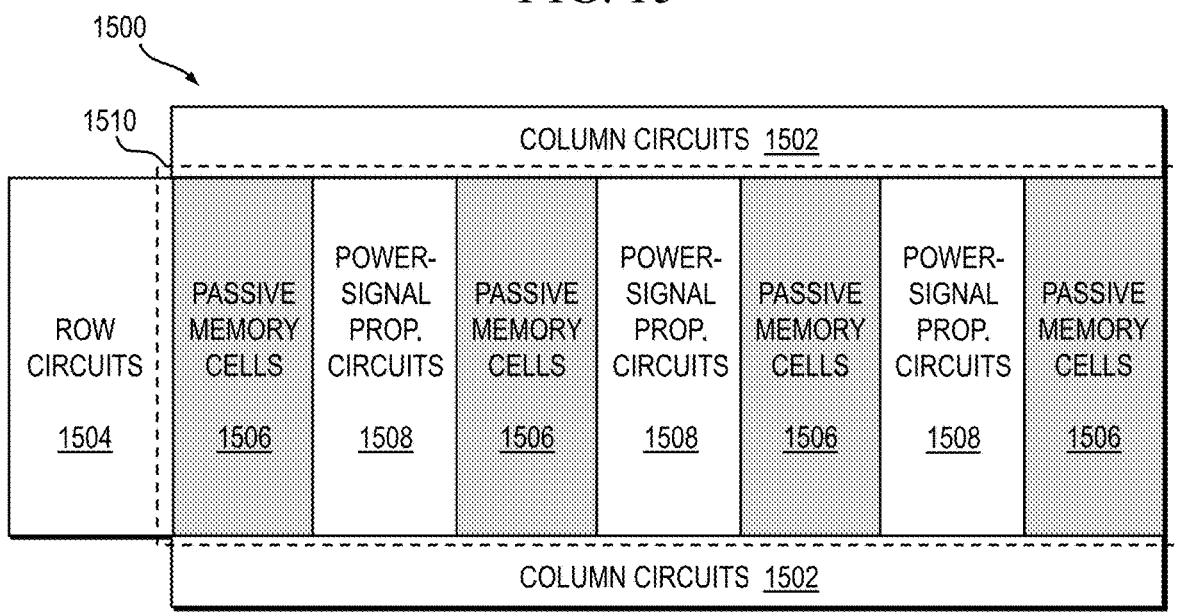
FIG. 15 conceptually depicts a layout diagram for an exemplary memory circuit comprising an active memory cell region including rectangular regions of "passive" memory cells interspersed with columns and/or rows of power-signal propagation circuits, according to one or more embodiments of the present invention.

FIG. 15 conceptually depicts a layout diagram for an exemplary memory circuit 1500 comprising an active memory cell region 1510 including rectangular regions of "passive" memory cells 1506 interspersed with columns and/or rows of power-signal propagation circuits 1508, according to one or more embodiments of the invention. The power-signal propagation circuits 1508, which in this illustrative embodiment are implemented as AC-energy circuits, receive energy directly from an AC or other time-varying energy source supplied thereto, such as, for example, a resonant clock (at least a portion of which may be implemented in a manner consistent with that disclosed in U.S. Pat. No. 10,520,974, J. Strong et al., the disclosure of which is incorporated by reference herein in its entirety). The passive memory cells 1506 have at least one port (e.g. a read port or a write port) that does not receive energy directly from an AC or other time-varying energy source added for the exclusive purpose of energy transfer. As is known in the art, energy only arrives through read and/or write terminals of the passive memory cells (e.g., WBL, RBL, RWL, and WWL). It is further known that a JMRAM memory cell has both a passive read port and passive write port, while the PTL memory cell described in the paper by R. Posey, et al., "Demonstration of Superconducting Memory with Passive-Transmission-Line-Based Reads," *Proceedings of the International Symposium on Memory Systems*, A C M, 2019, the disclosure of which is incorporated by reference herein in its entirety, has a passive read port.

More particularly, with reference to FIG. 15, the exemplary memory circuit 1500, in one or more embodiments, is configured to apply and propagate superconducting signals through corresponding superconducting wires in the memory circuit. The memory circuit 1500 includes a plurality of passive cells (e.g., passive memory cells 1506) arranged in a plurality of sets, each set of passive cells having associated therewith at least one common superconducting wire of the plurality of superconducting wires (not explicitly shown, but implied); the common superconducting wire interconnects a subset of the passive cells in the set of passive cells. The memory circuit 1500 further includes at least one power-signal propagation circuit 1508, an input of the power-signal propagation circuit being coupled with a preceding set of passive cells 1506 via a first superconducting wire, and an output of the power-signal propagation circuit being coupled with a subsequent set of passive cells via a second superconducting wire. Upon application of a first superconducting signal to the first superconducting wire, the power-signal propagation circuit 1508 applies a second superconducting signal to the second superconducting wire. In some embodiments, the first and second superconducting signals can involve different levels of flux.

Each of at least a subset of the power-signal propagation circuits 1508, in one or more embodiments, may include at least one flux pump. As is known by those skilled in the art, flux pumps can generate one flux quantum per RQL cycle, or only a very limited number per cycle. Parallel generation of flux quanta, which preferably occurs substantially concurrently, beneficially increases the recovery (i.e., restoration) time of the entire system used to power the passive memory cells 1506. In one or more embodiments, each of at least a subset of flux pumps with the power-signal propagation circuits 1508 is configured to transform an applied superconducting signal of a first energy form (e.g., AC or other time-varying signal) into a superconducting signal of a second energy form (e.g., DC) stored as flux quanta for subsequent application to one of the plurality of superconducting wires in the memory circuit 1500.

It is to be appreciated that the active memory cell region 1510 is distinguishable from a standard memory array because it contains little or no decode circuitry. The principal address decoding for a write operation in the memory circuit 1500 is performed in row circuits 1504 operatively coupled with the passive memory cells 1506.

Write select circuits can be incorporated within the row circuits 1504, the term "row circuits" being defined herein in a more generic manner, and can be disposed proximate to the first block of passive memory cells 1506 on the left hand side of the active memory cell region 1510 in FIG. 15. While such circuits require a source of energy, they do not conform to the restricted definition of the embodiment of power-signal propagation circuits 1508 because they are not interspersed among passive memory cells 1506; instead, they are at the boundary of the active memory cell region 1510. In one or more embodiments, column circuits 1502 are operatively coupled to the passive memory cells 1506 and may include, for the read path data flow, sense amplifiers, which have as inputs read bit lines RBLs, and, for the write data path flow, write bit circuits, which have as outputs write bit lines WBLs. They, too, do not conform to the restricted definition of the embodiment of power-signal propagation circuits 1508 because they are not interspersed among passive memory cells 1506.

At a fundamental level, considering some embodiments of the present invention already described herein in conjunction with earlier figures, the power-signal propagation circuits 1508 are preferably introduced in rows (rows not explicitly shown in the layout 1500, but implied) and/or columns (i) to restore signals that are dissipated in a resistive path associated with (running in parallel with) a superconducting conductor of the row lines of passive memory cells, (ii) to reduce the inductive load on write select circuits and/or read word line repeaters permitting them to generate necessary currents more rapidly (i.e., more flux per inductive load that is generated in parallel) and possibly permitting them to generate higher DC and/or AC currents, (iii) to propagate fully-decoded signals (or almost fully decoded signals involving no more than two bits of row or column decoding) with respect to the selection of memory cells for write operations directed to a specific row address (wherein each row could contain stacked memory cells, (e.g., MJJ 812 of FIG. 8A) combined with (memory cell read circuit 906 of FIG. 9)) or for write operations to a set of proximate columns, write bit lines WBLs, associated with at least one memory cell write group.

In FIG. 15, the power-signal propagation circuits 1508 are shown bounded as column stripes but they may also be represented as row stripes, as illustrated in earlier figures (e.g., write select control flow 606 of FIG. 6A). As defined, power-signal propagation circuits may not only be used to restore signals or recover lost flux rapidly, but they can also be used in both row and column dimensions to perform a $2^N$ decode of encoded signals, where N=0, 1, or 2, for circuits proximate to one another. For example, a sub-atomic (sub-"functional" write word line) write capability can be enabled by "ANDing" signals propagating in orthogonal write control flows (i.e., JTL propagated signals) selecting at least one, but not all, memory cell write groups.

Passive memory cells (e.g., 1506 in FIG. 15) are, by definition, not energized from an internal energy/power source, but rather are energized via their interconnection lines, through AC energy injection, for example like that provided by a transformer found in an RQL circuit or the like. Furthermore, power-signal propagation circuits (e.g., 1508) are not only drivers, but are circuits that can include "flux pumps" or flux pump-like circuits having internal transformers, for conversion of AC currents into DC currents. Flux quanta can be generated, stored (e.g., in two superconducting loops), and thus made ready to be a first and second multi-flux quanta signal for propagation in at least one common superconducting wire associated with each group or set of passive memory cells. JMRAM is one example of a passive memory cell suitable for use with one or more embodiments of the invention. Another example of a passive memory cell (for a read operation) is described in the paper R. Posy, et al., "Demonstration of Superconducting Memory with Passive Transmission Line-Based Reads," MEMSYS '19: *Proceedings of the International Symposium on Memory Systems*, Sept. 2019, pp. 531-533, the disclosure of which is incorporated by reference herein in its entirety for all purposes.

Figure 16:
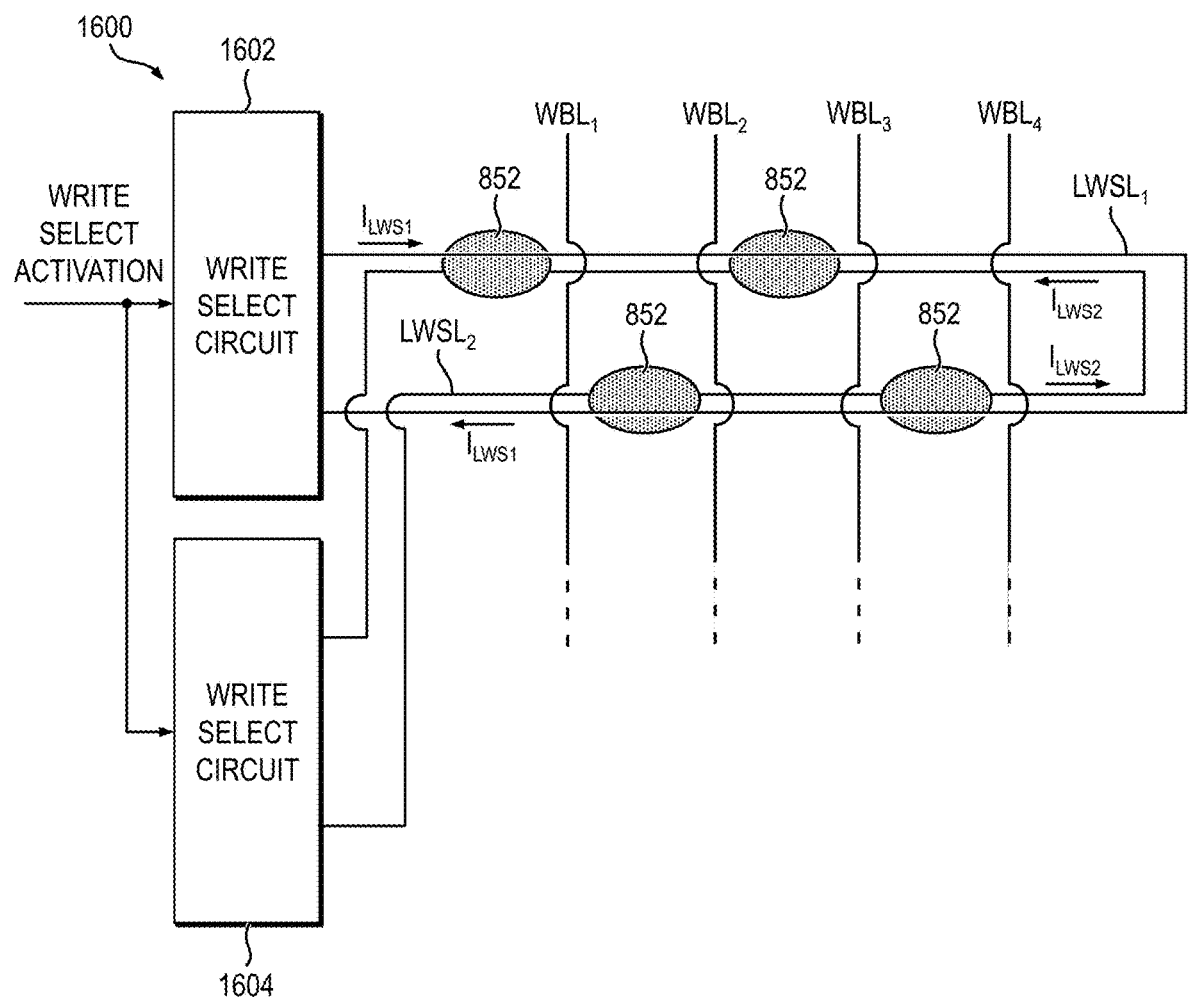
FIG. 16 is a schematic diagram depicting at least a portion of an exemplary write region, wherein a hard-axis field for write-selected cells is advantageously doubled by hard-axis current flowing under and over the magnetic Josephson junctions, according to one or more embodiments of the present invention.

Considering the embodiments described in FIGS. 6A, 6B, 7, 8A, 8B, 9, 13, 14, and 15, aspects of the invention can be extended to various other embodiments that are also within the scope of the present invention. By way of example only and without limitation, FIG. 16 is a schematic diagram depicting at least a portion of an exemplary write region 1600, wherein a hard-axis field for write-selected cells is advantageously doubled by hard-axis current flowing under and over the magnetic Josephson junctions, according to one or more embodiments of the invention. With reference to FIG. 16, the generalized write region 1600 includes at least two write select circuits, 1602 and 1604, that activate/enable a write-selected set of memory cells during a write operation, wherein the MJJs 852 of all the memory cells receive the necessary hard-axis fields to select (i.e., destabilize) the MJJs during the write operation (the hard-axis field of which is required to persist over many RQL cycles). Concerning the enablement of write-select circuits during a write operation as discussed with respect to FIG. 10, it should be understood that different hard-axis-oriented fields, which collectively can "write-select" the write-select set, can be enabled initially at different times (e.g., on different RQL cycles) but must persist for a prescribed write time, defined by an overlap of all required easy-axis and hard-axis fields, to fully select the write-selected set defined for each memory write operation. In a new dependent embodiment directed to FIG. 16, but specifically derived from the broader embodiment of the invention described in the preceding sentences of this paragraph, an externally-derived write select activation signal (i.e., WRITE SELECT ACTIVATION input of FIG. 8B driven by a decoder or write driver) can operably select/enable all of the at least two write select circuits 1602, 1604 (instead of write select circuits 854, 856 shown in FIG. 8B) of the write region 1600, and thus trigger the generation of all the different hard-axis fields for selecting/enabling (writing) the write-selected set of memory cells. The write select circuits 1602, 1604 can preferably be located proximate to one another and at the perimeter of an array of JMRAM memory cells, in one or more embodiments. The hard-axis magnetic field doubling is accomplished for the write region 1600 of FIG. 16 just as it was for the write region 850 of FIG. 8B. In yet another embodiment (not explicitly shown in the figures, but contemplated given the teachings herein) to the generalized embodiment previously described, interactions between/among the write select drivers can be further constrained, wherein at least one mechanism exists for propagating a write selection signal between/among at least two of the write select circuits.

Concerning the write operation, embodiments of the present invention can provide a greater ratio of flux quanta (i.e., superconducting signals) to superconducting loop inductance in the superconducting loop responsible for generating the hard-axis field, which translates into higher hard-axis fields (generated by higher local write select currents $I_{LWS}$). The memory cell write group appropriately targets the fundamental problem of JMRAM, for many of its disclosed/proposed memory cell topologies, by generating high hard-axis fields (for a given flux quanta) that are required to be approximately three times greater than the easy-axis field.

Furthermore, because of overall memory system area efficiencies realized (i) by the memory cell write group (i.e., its write select circuit, which is not driven by a write address decode system as in other memory designs—except for the write select circuit of the first memory cell write group), (ii) by the compact memory cell organization depicted in FIG. 9 (requiring a pipelined, back-to-back read to obtain "atomic" data), which has shorter write bit lines WBLs, and (iii) by the signal regenerating word line system, the working memory system with the necessary write margins, as discussed with respect to the Stoner-Wohlfarth switching astroid, can realize much larger arrays of memory cells with higher bit densities (memory capacity per memory area) due to the larger rows, more memory cells in a row (stack row and more compact column—y-axis—dimension) and thereby improve memory system efficiencies system wide.

For the phase-based-torque memory cell, in other embodiments, not only can the hard-axis field be doubled directly, but a unique combination of two memory cell write groups can be realized in which the two write select circuits provide the flux quanta that generate the hard-axis field for one memory cell write group. Moreover, such a topology can propagate a signal, which would be carried by a write select control flow, from one memory cell write group to the next, like those for memory cells described with respect to FIGS. 8B and 13.

In addition to these improvements, one or more embodiments of the invention address physical limitations of a conventional bidirectional current driver in its application to driving write bit lines: tracing the superconductor line, the write bit line leaves the bidirectional current driver in a given one of the write select circuits (e.g., 1602 or 1604), passes up through the memory cells, turns around, and returns through the memory cells to a location proximate to where it had left the conventional bidirectional current driver. The ports of the conventional bidirectional current driver for the load inductor (e.g., write bit line WBL) can be proximate to one another, which is a preferred physical implementation for the bidirectional current driver.

While embodiments of the present invention have been described with respect to having only one layer of MJJs in a given process technology, it will become apparent to those skilled in the art, given the teachings herein, that aspects and techniques of the present invention can be beneficially extended to enable multiple layers of MJJs to be assembled on a superconducting chip. Thus, the circuit topologies described herein apply more generally to N stacked layers of MJJs on such superconducting chips, where N is an integer.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary structures or devices illustrated in the accompanying figures, or portions thereof, may be part of an integrated circuit. Integrated circuits so manufactured are considered part of this invention.

Those skilled in the art will appreciate that the exemplary devices, structures and circuits discussed above can be distributed in raw form (i.e., a single wafer having multiple unpackaged chips), as bare dies, in packaged form, or incorporated as parts of intermediate products or end products that benefit from a memory formed in accordance with one or more embodiments of the invention, such as, for example, JMRAM, etc.

An integrated circuit in accordance with aspects of the present disclosure can be employed in essentially any memory application and/or electronic system. Suitable systems for implementing embodiments of the invention may include, but are not limited to, computing systems, etc.

Systems incorporating such integrated circuits are considered part of this invention. Given the teachings of the present disclosure provided herein, one of ordinary skill in the art will be able to contemplate other implementations and applications of embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising." when used in this specification, specify the presence of stated features, steps, operations, elements, and/or components, but do not preclude the presence or addition of one or more other features, steps, operations, elements, components, and/or groups thereof. The term "and/or" is intended to include either of associated items, taken alone, or any combination of one or more of the associated items. Thus, for example, the phrase "A, B and/or C" as used herein is intended to mean only A, or only B, or only C, or any combination of A, B and C. Terms such as "above" and "below" are used to indicate relative positioning of elements or structures to each other as opposed to relative elevation.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus, the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. A superconducting memory circuit for applying and propagating a plurality of superconducting signals through a plurality of superconducting wires in the memory circuit, the memory circuit comprising:
    a plurality of passive cells arranged in a plurality of sets, each set of passive cells having associated therewith at least one common superconducting wire of the plurality of superconducting wires, the at least one common superconducting wire interconnecting a subset of the plurality of passive cells in the set of passive cells; and
    at least one power-signal propagation circuit, an input of the power-signal propagation circuit being coupled with a preceding set of passive cells of the plurality of sets via a first superconducting wire, and an output of the power-signal propagation circuit being coupled with a subsequent set of passive cells of the plurality of sets via a second superconducting wire,
    wherein upon application of a first superconducting signal to the first superconducting wire, the power-signal propagation circuit is configured to apply a second superconducting signal to the second superconducting wire.

2. The memory circuit according to claim 1, wherein the at least one power-signal propagation circuit comprises conversion circuitry configured to transform an applied superconducting signal of a first energy form into a superconducting signal of a second energy form stored as flux quanta for subsequent application to one of the plurality of superconducting wires.

3. The memory circuit according to claim 1, wherein each of at least a subset of the plurality of passive cells comprises at least one passive memory cell and/or at least one passive read-only memory (ROM) cell.

4. The memory circuit according to claim 1, wherein at least a subset of the plurality of superconducting wires comprises at least one read word line segment and at least one local write select line.

5. The memory circuit according to claim 4, further comprising at least one read word line repeater connected between at least two read word line segments, the read word line repeater being configured to regenerate flux lost in a transmission of signals through at least one preceding read word line segment to thereby drive at least one subsequent read word line segment in forming a functional read word line from the at least one preceding and subsequent word line segments of the memory circuit.

6. The memory circuit according to claim 1, wherein the at least one power-signal propagation circuit comprises at least one write select circuit coupled to a unique subset of the plurality of passive cells via a corresponding local write select line.

7. The memory circuit according to claim 1, wherein the plurality of passive cells have substantially identical circuit topologies.

8. The memory circuit according to claim 1, wherein the at least one power-signal propagation circuit includes a plurality of power-signal propagation circuits, each of the plurality of power-signal propagation circuits comprising at least one flux pump, wherein multiple flux quanta generation for the at least one flux pump in each of the plurality of power-signal propagation circuits occurs substantially concurrently to thereby reduce recovery time in the memory circuit.

9. The memory circuit according to claim 1, further comprising:
at least one row circuit operatively coupled with each of at least a first subset of the plurality of passive cells, the row circuit including decode circuitry for performing address decoding for a write operation in the memory circuit; and
at least one column circuit operatively coupled with each of at least a second subset of the plurality of passive cells, the at least one column circuit including (i) for a read path data flow, at least one sense amplifier which has, as an input thereto, at least one corresponding read bit line, and (ii) for a write data path flow, at least one write bit circuit which has, as an output thereof, at least one corresponding write bit line.

10. A write and multiple-read memory circuit, comprising:
a plurality of read bit lines and a plurality of read word lines;
a plurality of write bit lines and a plurality of write word lines; and
a plurality of dual-ported superconducting memory cells arranged into columns, each of the dual-ported superconducting memory cells having a read port operably connected to a corresponding one of the plurality of read word lines and a corresponding one of the plurality of read bit lines, and having a write port operably connected to a corresponding one of the plurality of write word lines and a corresponding one of the plurality of write bit lines,
wherein each of the plurality of dual-ported superconducting memory cells in a given column is operably connected to a corresponding one of the plurality of read bit lines,
wherein each of the plurality of read word lines is connected to one of the plurality of dual-ported superconducting memory cells in a column;
wherein each of the plurality of write word lines is connected to a unique subset of the plurality of dual-ported superconducting memory cells of a given column,
wherein a subset of the plurality of write bit lines are associated with each column, and wherein each of the subset of the plurality of write bit lines of an associated column is operably connected to one dual-ported superconducting memory cell of each of a subset of the plurality of dual-ported superconducting memory cells that are operably connected to a common write word line of the plurality of write word lines, and
wherein the plurality of write bit lines are greater in number than the plurality of read bit lines and their associated columns by at least a factor of two, and wherein the write and multiple-read memory circuit is configured to be written in one native write cycle and read in a plurality of native read cycles, the native read and write cycles being configured to correspond to prescribed parameters associated with a given type of the plurality of dual-ported superconducting memory cells.

11. The memory circuit according to claim 10, wherein each of at least a subset of the plurality of dual-ported superconducting memory cells comprises:
one read port having a corresponding input and output node connected to a read word line and input and output node connected to a read bit line; and
one write port having a corresponding input and output node connected to a write word line and input and output node connected to a write bit line;
wherein the plurality of dual-ported superconducting memory cells are organized into a plurality of column segments, the superconducting memory cells of each of the plurality of column segments being operably connected through a common write word line and through a common read bit line, wherein each of the superconducting memory cells within each column segment has a unique respective write bit line.

12. The memory circuit according to claim 11, wherein a plurality of dual-ported superconducting memory cells within each of at least a subset of the plurality of column segments are operably coupled together by connecting read bit lines to form a column of operably interconnected superconducting memory cells.

13. The memory circuit according to claim 10, wherein each of a subset of the plurality of dual-ported superconducting memory cells organized in a same column are operably coupled with more than one of the plurality of write bit lines.

14. The memory circuit according to claim 10, further comprising a write select circuit in each of a plurality of memory cell write groups, wherein the write select circuit in each of the plurality of memory cell write groups is configured to generate a local write select current and one or more write select control signals.

15. The memory circuit according to claim 14, further comprising write select control circuitry operably connected to the plurality of memory cell write groups, the write select control circuitry being configured to receive one or more control signals for triggering the write select circuit in each of at least a subset of the plurality of memory cell write groups to add or to subtract, respectively, at least one flux quantum each reciprocal quantum logic (RQL) cycle to a superconducting loop, the superconducting loop including the local write select line and a portion of the write select circuit.

16. The memory circuit according to claim 14, wherein each of at least a subset of the plurality of memory cell write groups comprises first and second write select circuits and first and second local write select lines connected to the first and second write select circuits, respectively, and wherein the first and second local write select lines are each disposed on independent superconducting layers proximate to the plurality of dual-ported superconducting memory cells in the plurality of memory cell write groups.

17. The memory circuit according to claim 10, further comprising at least one read word line repeater connected in series with at least two read word line segments, the at least one read word line repeater being configured to regenerate flux quanta lost in a transmission of signals through the read word line segments to thereby drive the read word line segments in forming a functional read word line of the memory circuit.

18. The memory circuit according to claim 10, wherein the plurality of dual-ported memory cells is organized into a plurality of memory cell write groups in a segmented architecture, wherein the plurality of write word lines are segmented into a plurality of local write select word lines, and each of the plurality of local write select word lines is operably coupled with a subset of the plurality of dual-ported memory cells associated with a corresponding memory cell write group.

19. A superconducting memory circuit, comprising:
a plurality of write word lines arranged in a first dimension in the memory circuit;
a plurality of write bit lines arranged in a second dimension in the memory circuit, the first and second dimensions being different relative to one another;
a plurality of superconducting memory cells arranged into a plurality of rows and columns, a first subset of the superconducting memory cells arranged in a same row being coupled with a common one of the plurality of write word lines, and at least two of the plurality of superconducting memory cells being coupled with different write word lines, and being coupled to a common one of the plurality of write bit lines,
wherein a subset of the plurality of write bit lines that are proximate to one another are electrically connected together by at least one operable wrap-around connection, the superconducting memory circuit is configured such that a bit signal of a first one of the write bit lines of the subset operably writes a state in a selected memory cell of a plurality of superconducting memory cells connected to all proximate write bit lines electrically connected together by the at least one wrap-around connection, and a write signal, representing a state, moves through at least a first proximate write bit line of the subset in one direction, and then when electrically connected to a second write bit line by the at least one wrap-around connection, reverses its direction of propagation relative to the first proximate write bit line of the subset.

20. The superconducting memory circuit according to claim 19, wherein a second subset of the plurality of superconducting memory cells is operably connected by a wrap-around connection of proximate write bit lines, and wherein the second subset of the plurality of superconducting memory cells have different read bit lines associated therewith.

21. The superconducting memory circuit according to claim 19, further comprising:
a plurality of read bit lines, each of the plurality of read bit lines being associated with a unique column of the plurality of superconducting memory cells in the memory circuit;
a plurality of memory cells, each including an associated memory cell read circuit, the memory cell read circuits of all the plurality of memory cells in a same column being connected together in a cascaded manner, with an output of one memory cell read circuit connected to an input of a subsequent memory cell read circuit;
a plurality of sense amplifiers, an output of a last one of the memory cell read circuits in each column being connected with an input of a corresponding one of the plurality of sense amplifiers; and
a plurality of data inversion circuits, an output of each of the plurality of sense amplifiers being connected with an input of a corresponding one of the plurality of data inversion circuits, an output of each of the plurality of data inversion circuits forming a datum of a corresponding column of superconducting memory cells.

22. The memory circuit according to claim 21, wherein each of the plurality of data inversion circuits is configured to selectively invert a data output generated by the data inversion circuit as a function of a least significant bit of a corresponding read bit line or corresponding read address.

23. The memory circuit according to claim 22, wherein each of at least a subset of the data inversion circuits comprises a multiplexer and an inverter, the multiplexer having at least first and second data inputs, a control input, and a data output, an input of the inverter being connected to the first data input and to the output of a corresponding sense amplifier in a same column, an output of the inverter being connected to the second data input, the control input being configured to receive a least significant bit of a corresponding read bit line or a corresponding read address, and wherein an output of the multiplexer forms the data output generated by the data inversion circuit.

* * * * *

UNITED STATES PATENT AND TRADEMARK OFFICE
CERTIFICATE OF CORRECTION

Page 1 of 1

PATENT NO. : 12,080,343 B2
APPLICATION NO. : 17/976179
DATED : September 3, 2024
INVENTOR(S) : William Robert Reohr It is certified that error appears in the above-identified patent and that said Letters Patent is hereby corrected as shown below:

On the Title Page

(56) References Cited, U.S. PATENT DOCUMENTS, Page 2, Column 1, 3$^{rd}$ reference cited: Please correct "Savchenko" to read --Savtchenko--

In the Specification

Column 17, Line 19: Please correct "In)" to read --I$\pi$)--

Column 30, Line 25: Please correct "(e.g., RBL" to read --(e.g., RBL$_1$--

Column 39, Line 49: Please correct "RWL" to read --RWL$_1$--

Column 41, Line 17: Please correct "I$_{WB}$ Even" to read --I$_{WB\_Even}$--

Column 41, Line 25: Please correct "I$_{WB}$ Odd" to read --I$_{WB\_Odd}$--

Column 43, Line 35: Please correct "WWL" to read --WWL$_1$--

Column 47, Line 10: Please correct "A C M," to read --ACM,--

Signed and Sealed this
Seventeenth Day of December, 2024

Derrick Brent
*Acting Director of the United States Patent and Trademark Office*